(12) United States Patent
Jeon et al.

(10) Patent No.: US 11,038,086 B2
(45) Date of Patent: Jun. 15, 2021

(54) SEMICONDUCTOR LIGHT-EMITTING ELEMENT AND MANUFACTURING METHOD THEREFOR

(71) Applicant: SEMICON LIGHT CO., LTD., Gyeonggi-do (KR)

(72) Inventors: Soo Kun Jeon, Gyeonggi-do (KR); Kyoung Min Kim, Gyeonggi-do (KR); Eun Hyun Park, Gyeonggi-do (KR); Young Kwan Cho, Gyeonggi-do (KR); Gye Oul Jeong, Gyeonggi-do (KR); Dong So Jung, Gyeonggi-do (KR); Seung Ho Baek, Gyeonggi-do (KR); Eung Suk Park, Gyeonggi-do (KR); Hye Ji Rhee, Gyeonggi-do (KR)

(73) Assignee: SEMICON LIGHT CO., LTD., Gyeonggi-do (KR)

( * ) Notice: Subject to any disclaimer, the term of this patent is extended or adjusted under 35 U.S.C. 154(b) by 0 days.

(21) Appl. No.: 16/083,024

(22) PCT Filed: Mar. 7, 2017

(86) PCT No.: PCT/KR2017/002455
§ 371 (c)(1),
(2) Date: Sep. 7, 2018

(87) PCT Pub. No.: WO2017/155282
PCT Pub. Date: Sep. 14, 2017

(65) Prior Publication Data
US 2019/0081221 A1    Mar. 14, 2019

Related U.S. Application Data

(63) Continuation of application No. PCT/KR2017/002455, filed on Mar. 7, 2017.

(30) Foreign Application Priority Data

Mar. 7, 2016 (KR) .................. 10-2016-0027072
Mar. 9, 2016 (KR) .................. 10-2016-0028320
(Continued)

(51) Int. Cl.
*H01L 33/48* (2010.01)
*H01L 33/62* (2010.01)
(Continued)

(52) U.S. Cl.
CPC ........ *H01L 33/483* (2013.01); *H01L 23/3675* (2013.01); *H01L 33/10* (2013.01);
(Continued)

(58) Field of Classification Search
CPC ..... H01L 33/52; H01L 33/483; H01L 33/486; H01L 33/58; H01L 33/60; H01L 33/48;
(Continued)

(56) References Cited

U.S. PATENT DOCUMENTS

2004/0079957 A1* 4/2004 Andrews ............... H01L 33/486
257/100
2006/0261364 A1* 11/2006 Suehiro ..................... C03C 8/24
257/100
(Continued)

FOREIGN PATENT DOCUMENTS

JP    2009-71186 A    4/2009
JP    2013-127994 A    6/2013
(Continued)

OTHER PUBLICATIONS

International Search Report from corresponding PCT Application No. PCT/KR2017/001455, dated Jun. 9, 2017, and it's English translation.

*Primary Examiner* — Feifei Yeung Lopez
(74) *Attorney, Agent, or Firm* — Harness, Dickey & Pierce, P.L.C.

(57) ABSTRACT

Disclosed is a semiconductor light emitting device including: a body with a bottom part having at least one hole formed therein; a semiconductor light emitting device chip to be placed in each of the at least one hole, with the semiconductor light emitting device chip being comprised of a plurality of semiconductor layers including an active layer for generating light by electron-hole recombination, and an electrode electrically connected to the plurality of semiconductor layers; and an encapsulating member for covering the semiconductor light emitting device chip, wherein a hole-defining inner face of the bottom part has a plurality of angles of inclination.

5 Claims, 38 Drawing Sheets

(30) Foreign Application Priority Data

| | | | |
|---|---|---|---|
| Mar. 24, 2016 | (KR) | ..................... | 10-2016-0035200 |
| Apr. 14, 2016 | (KR) | ..................... | 10-2016-0045595 |
| Apr. 19, 2016 | (KR) | ..................... | 10-2016-0047567 |
| May 24, 2016 | (KR) | ..................... | 10-2016-0063362 |
| May 26, 2016 | (KR) | ..................... | 10-2016-0064830 |
| May 31, 2016 | (KR) | ..................... | 10-2016-0067159 |

(51) Int. Cl.

| | |
|---|---|
| *H01L 33/60* | (2010.01) |
| *H01L 33/58* | (2010.01) |
| *H01L 23/367* | (2006.01) |
| *H01L 33/52* | (2010.01) |
| *H01L 33/10* | (2010.01) |
| *H01L 33/36* | (2010.01) |
| *H01L 33/54* | (2010.01) |
| H01L 21/56 | (2006.01) |
| H01L 25/075 | (2006.01) |
| H01L 33/38 | (2010.01) |
| H01L 33/50 | (2010.01) |

(52) U.S. Cl.

CPC ............ *H01L 33/36* (2013.01); *H01L 33/486* (2013.01); *H01L 33/52* (2013.01); *H01L 33/54* (2013.01); *H01L 33/58* (2013.01); *H01L 33/60* (2013.01); *H01L 33/62* (2013.01); *H01L 21/568* (2013.01); *H01L 25/0753* (2013.01); *H01L 33/38* (2013.01); *H01L 33/502* (2013.01); *H01L 2224/04105* (2013.01); *H01L 2224/19* (2013.01); *H01L 2224/48091* (2013.01); *H01L 2224/48247* (2013.01); *H01L 2224/73265* (2013.01); *H01L 2933/005* (2013.01); *H01L 2933/0033* (2013.01)

(58) Field of Classification Search

CPC ..... H01L 2933/0033; H01L 2933/0058; H01L 23/3675

See application file for complete search history.

(56) References Cited

U.S. PATENT DOCUMENTS

| | | | | |
|---|---|---|---|---|
| 2009/0065793 | A1* | 3/2009 | Hon | .................. H01L 33/60 257/98 |
| 2009/0201440 | A1* | 8/2009 | Hamada | ............... G02B 6/0031 349/61 |
| 2010/0078670 | A1* | 4/2010 | Kim | .................. H01L 33/46 257/98 |
| 2014/0054621 | A1* | 2/2014 | Seko | .................. F21S 41/143 257/88 |
| 2015/0001573 | A1* | 1/2015 | Park | .................. H01L 33/486 257/99 |
| 2015/0179901 | A1* | 6/2015 | Ok | .................. H01L 33/504 257/98 |
| 2015/0311405 | A1 | 10/2015 | Oyamada et al. | |
| 2016/0351765 | A1* | 12/2016 | Suzuki | .................. H01L 33/60 |

FOREIGN PATENT DOCUMENTS

| | | |
|---|---|---|
| JP | 5644352 B2 | 12/2014 |
| KR | 10-0610650 B1 | 8/2006 |
| KR | 10-2010-0093992 A | 8/2010 |
| KR | 10-2012-0045539 A | 5/2012 |
| KR | 10-2012-0052107 A | 5/2012 |
| KR | 10-2014-0026120 A | 3/2014 |
| KR | 10-2014-0026163 A | 3/2014 |
| KR | 10-2014-0035215 A | 3/2014 |
| KR | 10-2014-0048178 A | 4/2014 |
| KR | 10-2014-0127457 A | 11/2014 |
| KR | 10-1469237 B1 | 12/2014 |
| KR | 10-2015-0024518 A | 3/2015 |
| KR | 10-2015-0037217 A | 4/2015 |
| KR | 10-2015-0107086 A | 9/2015 |
| KR | 10-2015-0121364 A | 10/2015 |
| KR | 10-2016-0008199 A | 1/2016 |
| KR | 10-2016-0036743 A | 4/2016 |
| KR | 10-2016-0048259 A | 5/2016 |

* cited by examiner (a)

(b)

(a)

(b)

SEMICONDUCTOR LIGHT-EMITTING ELEMENT AND MANUFACTURING METHOD THEREFOR

CROSS-REFERENCE TO RELATED APPLICATIONS

This application is a national phase application of PCT Application No. PCT/KR2017/002455, filed on Mar. 7, 2017, which claims the benefit and priority to Korean Patent Application Nos. 10-2016-0027072, filed on Mar. 7, 2016, 10-2016-0028320, filed on Mar. 9, 2016, 10-2016-0035200, filed on Mar. 24, 2016, 10-2016-0045595, filed on Apr. 14, 2016, 10-2016-0047567, filed on Apr. 19, 2016, 10-2016-0063362, filed on May 24, 2016, 10-2016-0064830, filed on May 26, 2016, and 10-2016-0067159, filed on May 31, 2016. The entire disclosures of the applications identified in this paragraph are incorporated herein by references.

TECHNICAL FIELD

The present disclosure relates generally to semiconductor light emitting devices and, more particularly, to a semiconductor light emitting device with increased light extraction efficiency.

BACKGROUND

This section provides background information related to the present disclosure which is not necessarily prior art. It should be noted that the directional terms including upper/lower faces, above/below, and longitudinal/transverse directions are intended to be interpreted with respect to a given drawing.

FIG. 1 illustrates one example of semiconductor light emitting device chips in the prior art.

In the semiconductor light emitting device chip, there is provided a growth substrate 10 (e.g. a sapphire substrate), and layers including a buffer layer 20, a first semiconductor layer 30 having a first conductivity (e.g., an n-type GaN layer), an active layer 40 adapted to generate light by electron-hole recombination (e.g., INGaN/(In)GaN MQWs) and a second semiconductor layer 50 having a second conductivity different from the first conductivity (e.g., a p-type GaN layer) are deposited over the substrate in the order mentioned. A light-transmitting conductive film 60 for current spreading is then formed on the second semiconductor layer, followed by an electrode 70 serving as a bonding pad formed on the light-transmitting conductive film, and an electrode 80 (e.g., a Cr/Ni/Au stacked metallic pad) serving as a bonding pad is formed on an etch-exposed portion of the first semiconductor layer 30. This particular type of the semiconductor light emitting device chip as in FIG. 1 is called a lateral chip. Here, one side of the growth substrate 10 serves as a mounting face during electrical connections to outside.

FIG. 2 shows another exemplary embodiment of a semiconductor light emitting device chip disclosed in U.S. Pat. No. 7,262,436. For convenience of description, different reference numerals are used for some components.

In this semiconductor light emitting device chip, there is provided a growth substrate 10, and layers including a first semiconductor layer 30 having a first conductivity, an active layer 40 adapted to generate light by electron-hole recombination and a second semiconductor layer 50 having a second conductivity different from the first conductivity are deposited over the substrate in the order mentioned. Three-layered electrode films 90, 91 and 92 adapted to reflect light towards the growth substrate 10 are then formed on the second semiconductor layer, in which a first electrode film 90 can be a reflective Ag film, a second electrode film 91 can be a Ni diffusion barrier, and a third electrode film 92 can be an Au bonding layer. Further, an electrode 80 serving as a bonding pad is formed on an etch-exposed portion of the first semiconductor layer 30. Here, one side of the electrode film 92 serves as a mounting face during electrical connections to outside. This particular type of the semiconductor light emitting device chip as in FIG. 2 is called a flip chip. In this flip chip, the electrode 80 formed on the first semiconductor layer 30 is placed at a lower height level than the electrode films 90, 91 and 92 formed on the second semiconductor layer in the case of the flip chip shown in FIG. 2, but alternatively it may be formed at the same height level as the electrode films. Here, height levels are given with respect to the growth substrate 10.

FIG. 3 shows one exemplary embodiment of a semiconductor light emitting device 100 in the prior art.

The semiconductor light emitting device 100 is provided with lead frames 110 and 120, a mold 130, and a vertical type light-emitting device chip 150 in a cavity 140 filled with an encapsulating member 170 that contains a wavelength converting material 160. The lower face of the vertical type light-emitting device chip 150 is directly electrically connected to the lead frame 110, and the upper face thereof is electrically connected to the lead frame 120 by a wire 180. A portion of the light coming out of the vertical type light-emitting device chip 150 excites the wavelength converting material 160 such that lights of different colors are generated, and white light is produced by mixing two different lights. For instance, the semiconductor light emitting device chip 150 generates blue light, and the wavelength converting material 160 is excited to generate yellow light. Then these blue and yellow lights can be mixed to produce white light. While the semiconductor light emitting device shown in FIG. 3 is produced using the vertical type light emitting device chip 150, other types of semiconductor light emitting devices similar to the one in FIG. 3 may also be produced using the semiconductor light emitting device chips illustrated in FIG. 1 and FIG. 2. However, for the semiconductor light emitting device 100 described in FIG. 3, a bonded state should be established between the semiconductor light emitting device chip 150 and the lead frames 110 and 120. Particularly, in case of using the flip chip shown in FIG. 2, it is very likely that light intensity from the flip chip may be reduced due to a bonding material (e.g., solder paste) used for bonding the flip chip to the lead frames 110 and 120. Moreover, a properly bonded state may not be established between the semiconductor light emitting device chip 150 and the lead frames 110 and 120 because of heat generated during the SMT process for bonding the semiconductor light emitting device 100 to an external substrate (e.g., a PCB substrate, a sub-mount, etc.). Further, the semiconductor light emitting device 100 described in FIG. 3 uses a mold 130 to control the angle of light leaving the semiconductor light emitting device chip 150. The angle of light leaving the semiconductor light emitting device 100 is ultimately controlled by varying the angle of the mold 130 from which light is reflected or by the height of the mold 130. Unfortunately though, there is a limit imposed upon the height of the mold 130 in the semiconductor light emitting device 100 for use in a microscale product.

In this regard, the present disclosure is directed to provide a semiconductor light emitting device, in which electrodes of a semiconductor light emitting device chip used in the semiconductor light emitting device are bonded directly to an external substrate. In particular, the present disclosure is directed to provide a semiconductor light emitting device using a flip chip, in which no bonding between lead frames and the flip chip is required for avoiding any loss in the light intensity from the flip chip caused by bonding between the lead frames and the flip chip used, or to provide a semiconductor light emitting device that can be used for side emission. In addition, the present disclosure is directed to provide a semiconductor light emitting device 100 featuring an effective control of the angle of light leaving the semiconductor light emitting device 100, given a height limit on the mold 130 of the semiconductor light emitting device 100. Further, the present disclosure is directed to provide a semiconductor light emitting device, in which electrodes of a semiconductor light emitting device chip are directly bonded to the substrate; and a light emitting device structure using such a light emitting device. In particular, the present disclosure is directed to provide a semiconductor light emitting device using a flip chip, in which no bonding between lead frames and the flip chip is required for avoiding any loss in the light intensity from the flip chip caused by bonding between the lead frames and the flip chip used; and a semiconductor light emitting device structure using such a semiconductor light emitting device.

SUMMARY

Technical Problem

The problems to be solved by the present disclosure will be described in the latter part of the best mode for carrying out the invention.

Technical Solution

This section provides a general summary of the present disclosure and is not a comprehensive disclosure of its full scope or all of its features.

According to one aspect of the present disclosure, there is provided a semiconductor light emitting device including: a body with a bottom part having at least one hole formed therein; a semiconductor light emitting device chip to be placed in each of the at least one hole, with the semiconductor light emitting device chip being comprised of a plurality of semiconductor layers including an active layer for generating light by electron-hole recombination, and an electrode electrically connected to the plurality of semiconductor layers; and an encapsulating member for covering the semiconductor light emitting device chip, wherein a hole-defining inner face of the bottom part has a plurality of angles of inclination.

According to another aspect of the present disclosure, there is provided a semiconductor light emitting device including: a body with a bottom part having at least one hole formed therein; a semiconductor light emitting device chip to be placed in each of the at least one hole, with the semiconductor light emitting device chip being comprised of a plurality of semiconductor layers including an active layer for generating light by electron-hole recombination, and a first and a second electrodes electrically connected to the plurality of semiconductor layers; an encapsulating member for covering the semiconductor light emitting device chip; a first insertion electrode inserted into the body, with the first insertion electrode having a plurality of exposed surfaces exposed to outside the body; and a first connection part arranged at the lower face of the bottom part of the body, with the first connection part electrically connecting the first electrode of the semiconductor light emitting device chip to one of the plurality of exposed surfaces of the first insertion electrode.

According to another aspect of the present disclosure, there is provided a semiconductor light emitting device including: a body with a bottom part having at least one hole formed therein; a semiconductor light emitting device chip to be placed in each of the at least one hole, with the semiconductor light emitting device chip being comprised of a plurality of semiconductor layers including an active layer for generating light by electron-hole recombination, and a first and a second electrodes electrically connected to the plurality of semiconductor layers; an encapsulating member for covering the semiconductor light emitting device chip; and a first conductive part arranged at a lower face of the bottom part of the body, with the first conductive part being electrically connected to the first electrode of the semiconductor light emitting device chip and being at a distance of 10 μm or less from at least one edge of the lower face of the bottom part of the body.

According to another aspect of the present disclosure, there is provided a semiconductor light emitting device including: a bottom part having a hole; a semiconductor light emitting device chip to be placed in the hole, with the semiconductor light emitting device chip being comprised of a plurality of semiconductor layers including an active layer for generating light by electron-hole recombination, and an electrode electrically connected to the plurality of semiconductor layers; and an encapsulating member for covering the bottom part and the semiconductor light emitting device chip, wherein the electrode of the semiconductor light emitting device chip is exposed towards the lower face of the bottom part.

According to another aspect of the present disclosure, there is provided a method for manufacturing a semiconductor light emitting device, the method including the steps of: (S1) preparing a body including a bottom part with a hole formed therein; (S2) placing the semiconductor light emitting device chip into the hole of the bottom part in such a way that an electrode of the semiconductor light emitting device chip is exposed towards a lower face of the bottom part; (S3) covering the bottom part and the semiconductor light emitting device chip with an encapsulating member; and (S4) cutting the body to obtain a semiconductor light emitting device comprised of the bottom part, the semiconductor light emitting device chip and the encapsulating member.

According to another aspect of the present disclosure, there is provided a semiconductor light emitting device including: a body including a bottom part, a side wall, and a cavity defined by the bottom part and the side wall, wherein at least one groove is formed in the side wall, and at least one hole is formed in the bottom part; a semiconductor light emitting device chip to be placed in each of the at least one hole, with the semiconductor light emitting device chip being comprised of a plurality of semiconductor layers including an active layer for generating light by electron-hole recombination, and an electrode electrically connected to the plurality of semiconductor layers; and an encapsulating member arranged at least in the cavity, with the encapsulating member being filled up to the groove of the side wall to cover the semiconductor light emitting device chip, wherein the electrode of the semiconductor light emitting device chip is exposed towards the lower face of the bottom part of the body.

According to another aspect of the present disclosure, there is provided a semiconductor light emitting device including: a body with a bottom part having at least one hole formed therein; a semiconductor light emitting device chip to be placed in each of the at least one hole, with the semiconductor light emitting device chip being comprised of a plurality of semiconductor layers including an active layer for generating light by electron-hole recombination, and an electrode electrically connected to the plurality of semiconductor layers; and an encapsulating member for covering the semiconductor light emitting device chip, wherein a hole—defining inner face of the bottom part forms a first angle of inclination with a lower face of the bottom part, with the first angle of inclination being an obtuse angle.

According to another aspect of the present disclosure, there is provided a semiconductor light emitting device structure including: a substrate including a substrate electrode; and a semiconductor light emitting device mounted on the substrate, with the semiconductor light emitting device including: a body with a bottom part having at least one hole formed therein; a semiconductor light emitting device chip to be placed in each of the at least one hole, with the semiconductor light emitting device chip being comprised of a plurality of semiconductor layers including an active layer for generating light by electron-hole recombination, and an electrode electrically connected to the plurality of semiconductor layers; and an encapsulating member for covering the semiconductor light emitting device chip, wherein the electrode of the semiconductor light emitting device chip is directly mounted on the substrate electrode.

According to another aspect of the present disclosure, there is provided a semiconductor light emitting device including: a body with a bottom part having at least one hole formed therein; a semiconductor light emitting device chip to be placed in each of the at least one hole, with the semiconductor light emitting device chip being comprised of a plurality of semiconductor layers including an active layer for generating light by electron-hole recombination, and an electrode electrically connected to the plurality of semiconductor layers; and an encapsulating member for covering the semiconductor light emitting device chip, wherein the bottom part has a height greater than a height of the semiconductor light emitting device chip.

Advantageous Effects

The advantageous effects of the present disclosure will be described in the latter part of the best mode for carrying out the invention.

DETAILED DESCRIPTION

The present disclosure will now be described in detail with reference to the accompanying drawing(s). The detailed description herein is presented for purposes of illustration only and not of limitation. The scope of the invention is defined by the appended claims. For example, the steps recited in any of the method or process descriptions may be executed in any order and are not necessarily limited to the order presented. Furthermore, any reference to singular includes plural embodiments, and any reference to more than one component or step may include a singular embodiment or step. Also, the steps recited in any of the method or process descriptions may be executed in any order and are not necessarily limited to the order presented.

Figure 4:
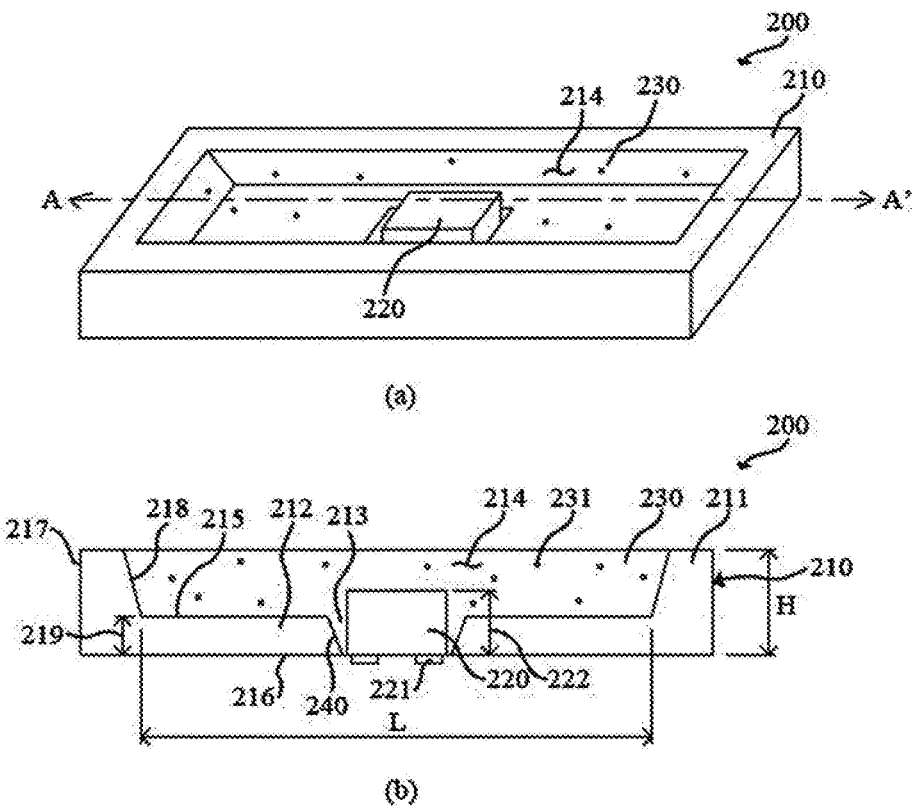
FIG. 4 shows one exemplary embodiment of a semiconductor light emitting device according to the present disclosure.

FIG. 4 shows one exemplary embodiment of a semiconductor light emitting device 200 according to the present disclosure.

FIG. 4a is a perspective view, and FIG. 4b is a sectional view taken along line AA'.

The semiconductor light emitting device 200 includes a body 210, a semiconductor light emitting device chip 220 and an encapsulating member 230.

The body 210 includes a side wall 211 and a bottom part 212. The bottom part 212 has a hole 213 therein. The body 210 also includes a cavity 214 defined by the side wall 211 and the bottom part 212. The bottom part 212 has an upper face 215 and a lower face 216. The side wall 211 has an outer face 217 and an inner face 218. The side wall 211 may have a height H smaller than a length L of the bottom part 212. For instance, the height H of the side wall 211 may range from 0.1 mm to 0.6 mm, endpoints inclusive, and the length L of the bottom part 212 may be 0.5 mm or more. If appropriate, the side wall 211 may be omitted (not shown). It is desirable that the hole 213 is as large as the semiconductor light emitting device chip 220 or 1.5 times larger than the semiconductor light emitting device chip 220. Moreover, it is desirable that an inner face 240 of the bottom part that forms the hole 213 is slanted in order to improve the efficiency of light extraction.

The semiconductor light emitting device chip 220 is placed in the hole 213. Examples of the semiconductor light emitting device chip 220 may include a lateral chip, a vertical chip and a flip chip. The flip chip is preferably used here, considering that the electrodes 221 of the semiconductor light emitting device chip in the present disclosure are exposed towards the lower face 216 of the bottom part 212 of the body 210. It is desirable that the bottom part 212 has a height 219 less than a height 222 of the semiconductor light emitting device chip 220. This is so because the efficiency of light extraction of the semiconductor light emitting device 200 may be impaired if the height 219 of the bottom part 212 is greater than the height 222 of the semiconductor light emitting device chip 220. Despite a possible decrease in the efficiency of light extraction, the bottom part 212 may be configured to have the height 219 greater than the height of the semiconductor light emitting device chip 220, taking other factors such as an optical path into consideration. The height 219 of the bottom part 212 and the height 222 of the semiconductor light emitting device chip 220 can be measured with respect to the lower face 216 of the bottom part 212. The height 222 of the semiconductor light emitting device chip 220 may range from 0.05 mm to 0.5 mm, endpoints inclusive. The height 219 of the bottom part 212 may range from 0.08 mm to 0.4 mm, endpoints inclusive.

The encapsulating member 230 is at least provided in the cavity 214 and serves to cover the semiconductor light emitting device chip 220 such that the semiconductor light emitting device chip 220 placed in the hole 213 can be fixed to the body 210. The encapsulating member 230 is light transmissive and may be made of either epoxy resins or silicone resins. If necessary, the encapsulating member 230 can contain a wavelength converting material 231. Any material (e.g., pigments, dyes or the like) can be used for the wavelength converting material 231 as long as it converts light generated from the active layer of the semiconductor light emitting device chip 220 into light with a different wavelength, but phosphors (e.g., YAG, $(Sr,Ba,Ca)_2SiO_4$:Eu or the like) are preferentially used due to their high efficiency of light conversion). In addition, the wavelength converting material 231 can be selected depending on the color of light from a semiconductor light emitting device, which again is well known to those skilled in the art.

Figure 5:
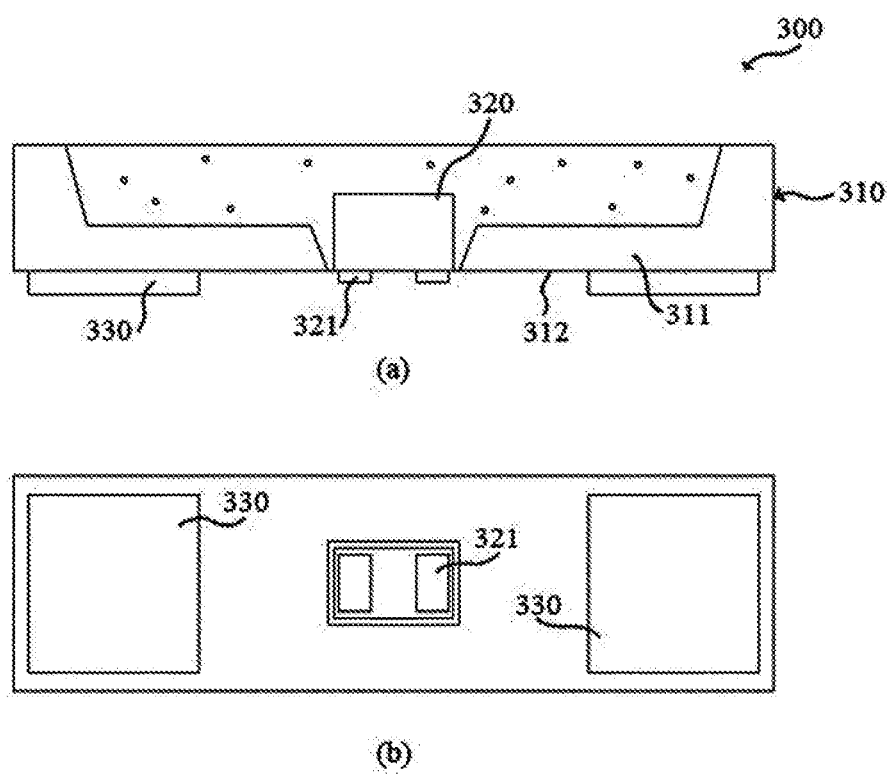
FIG. 5 shows a further exemplary embodiment of a semiconductor light emitting device according to the present disclosure.

FIG. 5 shows another exemplary embodiment of a semiconductor light emitting device 300 according to the present disclosure.

The semiconductor light emitting device 300 includes a bonding part 330. With the exception of the bonding part 330, the semiconductor light emitting device 300 has the same configurational features as the semiconductor light emitting device 200 of FIG. 4. The bonding part 330 is located on the lower face 312 of the bottom part 311 of the body 310, while keeping a distance from the electrode 321 of the semiconductor light emitting device chip 320 that is exposed towards the lower face 312 of the bottom part 311 of the body 310. The presence of the bonding part 330 in addition to the electrode 321 contributes to an improved bonding force between the semiconductor light emitting device 300 and an external substrate. The bonding part 330 may be made of a metal. For instance, the bonding part 330 may be made of one of Ag, Cu or Au. As an alternative, the bonding part 330 may also be made of a combination of at least two metals. For instance, it can be made of a combination of Ni and Co, a combination of Cr and Co, or a combination of Ti and Co. The bonding part 330 may be obtained in various combinations of metals and such modification should be easily realized by those skilled in the art. FIG. 5b, which is a bottom view of FIG. 5a, clearly shows the layout of the electrodes 321 and the bonding part 330. Although not shown, if necessary, it is also possible that the bonding part 330 may abut against the electrode 321 of the semiconductor light emitting device chip 320 and serve as an electrode.

Figure 6:
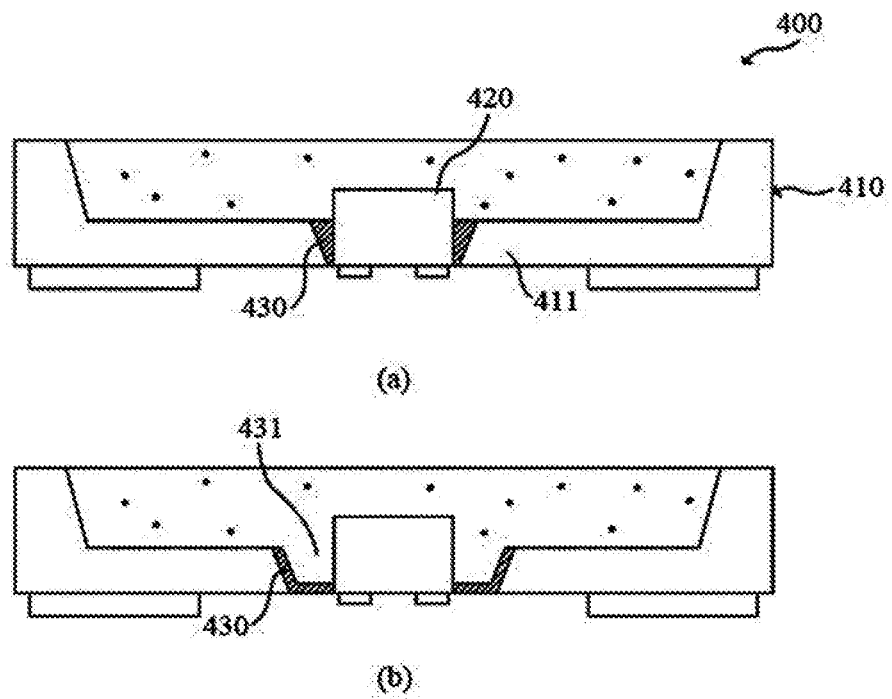
FIG. 6 shows a further exemplary embodiment of a semiconductor light emitting device according to the present disclosure.

FIG. 6 shows a further exemplary embodiment of a semiconductor light emitting device 400 according to the present disclosure.

The semiconductor light emitting device 400 includes a reflective substance 430 between the bottom part 11 of the body 410 and the semiconductor light emitting device chip 420. With the exception of the reflective substance 430, the semiconductor light emitting device 400 has the same configurational features as the semiconductor light emitting device 300 of FIG. 5. As the reflective substance 430 is provided on each of the lateral faces of the semiconductor light emitting device chip 420 and reflects lights coming out of the lateral faces of the semiconductor light emitting device chip 420, the efficiency of light extraction of the semiconductor light emitting device 400 may be increased. White reflective substance is suitable for the reflective substance 430. For instance, the reflective substance 420 may be a white silicone resin. Also, the reflective substance 430 may be provided in such a way that a space 431 is created between the reflective substance 430 and the semiconductor light emitting device chip 420, as shown in FIG. 6b.

Figure 7:
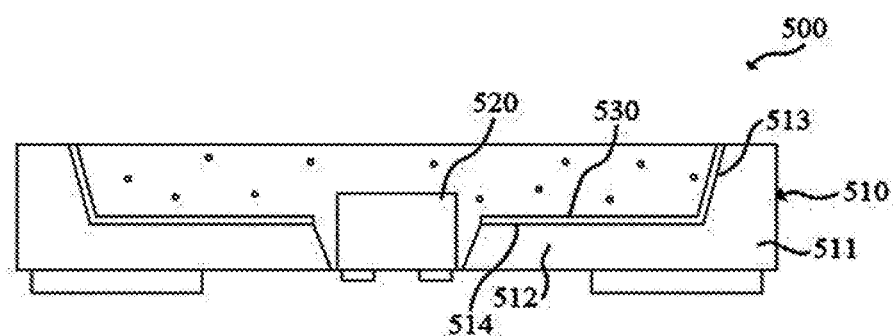
FIG. 7 shows a further exemplary embodiment of a semiconductor light emitting device according to the present disclosure.

FIG. 7 shows a further exemplary embodiment of a semiconductor light emitting device 500 according to the present disclosure.

Figure 1:
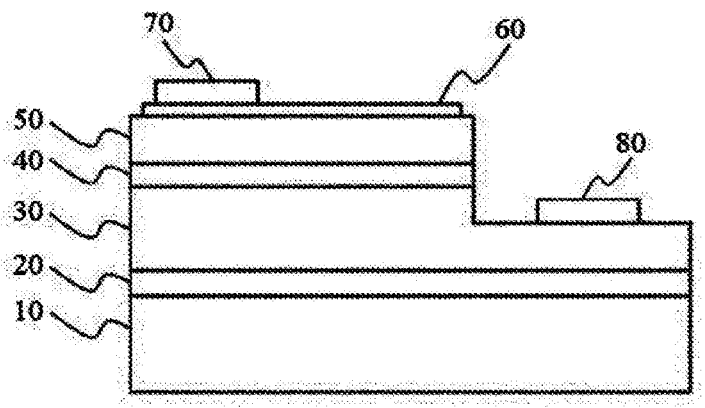
FIG. 1 shows an exemplary embodiment of a semiconductor light emitting device chip in the prior art.
Figure 2:
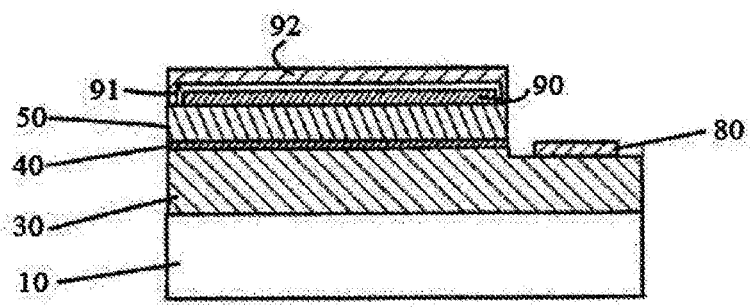
FIG. 2 shows another exemplary embodiment of a semiconductor light emitting device chip disclosed in U.S. Pat. No. 7,262,436.
Figure 3:
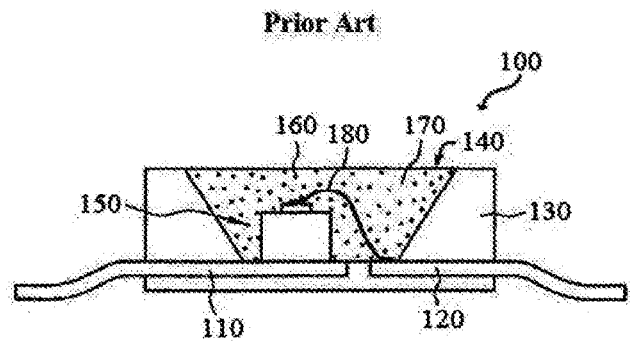
FIG. 3 shows one exemplary embodiment of a semiconductor light emitting device in the prior art.

The semiconductor light emitting device 500 includes a reflective layer 530 formed on at least one of the inner face 513 of the side wall 511 of the body 510 or the upper face 514 of the bottom part 512 of the body 510, or both. With the exception of the reflective substance 530, the semiconductor light emitting device 500 has the same configurational features as the semiconductor light emitting device 300 of FIG. 5. The reflective layer 530 can be formed all over the upper face 514 of the bottom part 512. The reflective layer 530 may be made of Al, Ag, a DBR (Distributed Bragg Reflector), a high-reflection white substance or the like, for example. Particularly, in the conventional semiconductor light emitting device 100 as shown in FIG. 3, since the semiconductor light emitting device chip 150 should be bonded to the lead frames 110 and 120, a reflective layer made of a metal with high reflectivity could not be formed all over the upper faces of the lead frames 110 and 120, to which the semiconductor light emitting device chip 150 is bonded, due to an electrical short. On the contrary, in the present disclosure, there is no lead frame that is bonded to the semiconductor light emitting device chip 520, and the semiconductor light emitting device chip 520 is not present on the upper face 514 of the bottom part 512. As a result, the reflective layer 530 made of a metal with high reflectivity can be formed all over the upper face 514 of the bottom part 512. With the reflective layer 530 made of a metal with high reflectivity formed all over the upper face 514 of the bottom part 512, the efficiency of light extraction of the semiconductor light emitting device 500 can be increased. Although not shown, the reflective layer 530 may be provided on the lateral faces of a hole.

Figure 8:
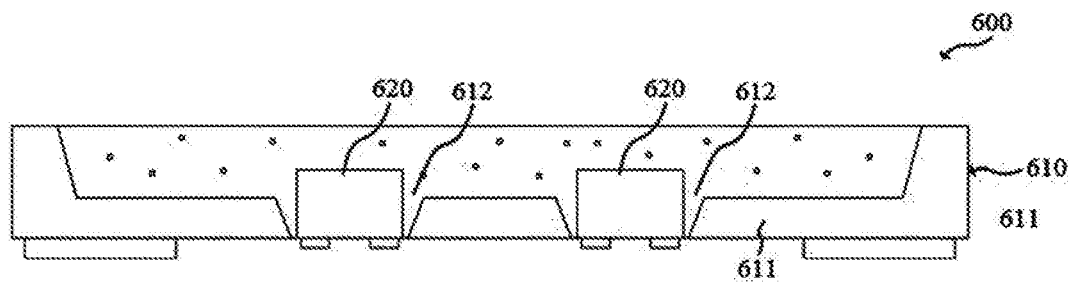
FIG. 8 shows a further exemplary embodiment of a semiconductor light emitting device according to the present disclosure.

FIG. 8 shows a further exemplary embodiment of a semiconductor light emitting device 600 according to the present disclosure.

The semiconductor light emitting device 600 has plural holes 612 formed in the bottom part 611 of the body 610, and each of the holes 612 receives a semiconductor light emitting device chip 620. With the exception of these plural holes 612, each of the holes 612 receiving an individual semiconductor light emitting device chip 620, the semiconductor light emitting device 600 has the same configurational features as the semiconductor light emitting device 300 of FIG. 5. While FIG. 8 illustrates two holes, it is possible to have more than two holes. In addition, the semiconductor light emitting device chips 620 placed in the holes 612, respectively, may emit lights of different colors.

Figure 9:
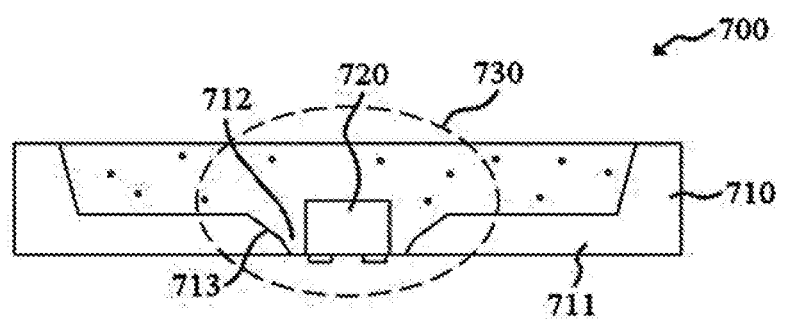
FIG. 9 shows a further exemplary embodiment of a semiconductor light emitting device according to the present disclosure.
Figure 9:
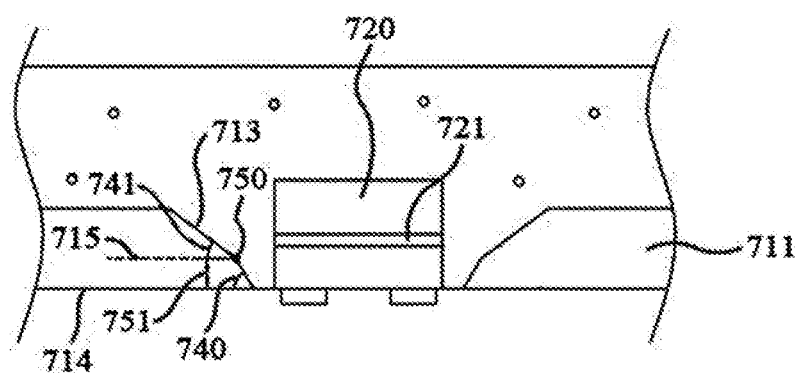

FIG. 9 shows a further exemplary embodiment of a semiconductor light emitting device 700 according to the present disclosure.

In the semiconductor light emitting device 700, an inner face 713 of a bottom part 711 forming a hole 712 creates angles of inclination 740, 741. For convenience of description, the portion within dotted lines 730 magnified as in FIG. 9b will primarily be explained. The angles of inclination 740, 741 includes a first angle of inclination 740 and a second angle of inclination 741. The first angle of inclination 740 is an angle between the inner face 713 of the bottom part 711 and the lower face 714 of the bottom part 711, and the second angle of inclination 741 is an angle between the inner face 713 of the bottom part 711 and an imaginary plane 715 in parallel to the lower face 714 of the bottom part 711. It is preferable that the inner face 713 of the bottom part 711 is angled in order to increase the extraction efficiency of light coming out of a semiconductor light emitting device chip 720, and in particular, a smaller angle of inclination between the inner face 713 and the lower face 714 of the bottom part 711 is more preferred. When the body 710 with the hole 713 in the bottom part 711 is molded, however, it is not easy to create a smaller angle of inclination (e.g., 60° or smaller, in general) between the inner face 713 of the bottom part 711 and the lower face 714 of the bottom part 711. In this disclosure, therefore, the inner face 713 of the bottom part 711 is formed to have the second angle of inclination that is smaller than the first angle of inclination 740 between the inner face 713 of the bottom part 711 and the lower face 714 of the bottom part 711. A desired range for the first angle of inclination 740 is between 60° and 90°. Preferably, the second angle of inclination 741 is then 60° or smaller. Moreover, it is desirable that a turning point 750 where the first angle of inclination 740 changes to the second angle of inclination 741 is found at a lower height 751. For instance, the height 751 is preferably 50 μm or less. This height 751 is measured with respect to the lower face 714 of the bottom part 711.

Figure 10:
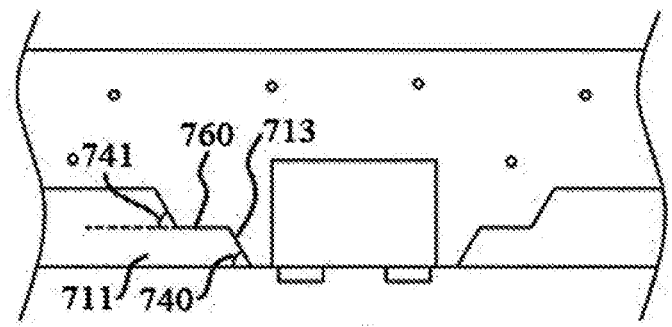
FIG. 10 shows different shapes of an angle of inclination on the inner face of the bottom part.
Figure 10:
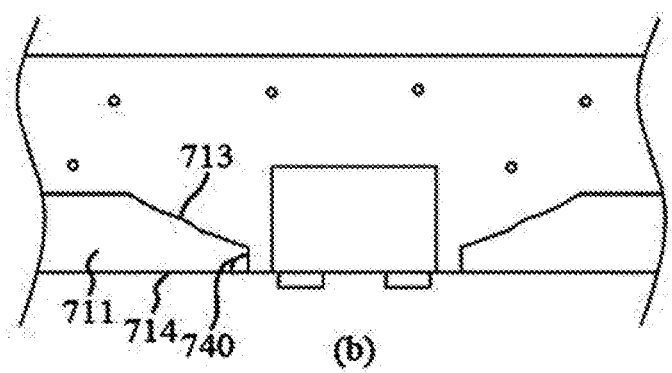
Figure 10:
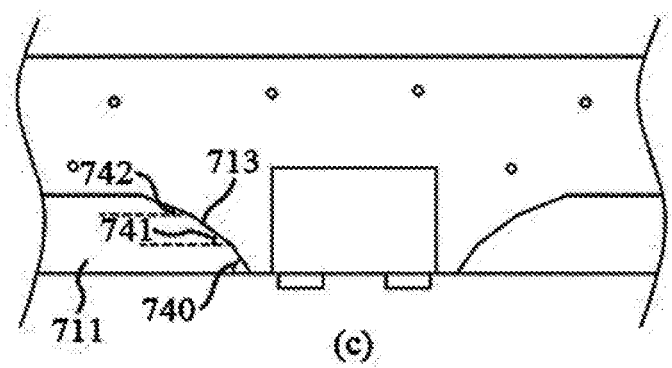

FIG. 10 shows different shapes of an angle of inclination on the inner face of the bottom part. For convenience of description, it only shows magnified inner faces of the bottom part.

As shown in FIG. 10a, the inner face 713 of the bottom part 711 may have a flat plane between the first angle of inclination 740 and the second angle of inclination 741. Alternately, the first angle of inclination 740 of the inner face 713 of the bottom part 711 may be 90° as shown in FIG. 10b, such that a portion where the inner face 713 of the bottom part 711 and the lower face 714 of the bottom part 711 join would not break easily. Alternately, there may be more than two angles of inclination 740, 741, 742 along the inner face 713 of the bottom part 711 as shown in FIG. 10c.

Figure 11:
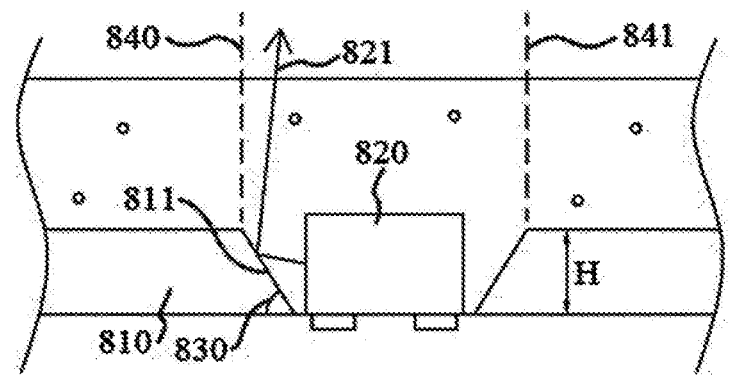
FIG. 11 shows exemplary representations for describing advantages of smaller angles of inclination on the inner face of the bottom part.
Figure 11:
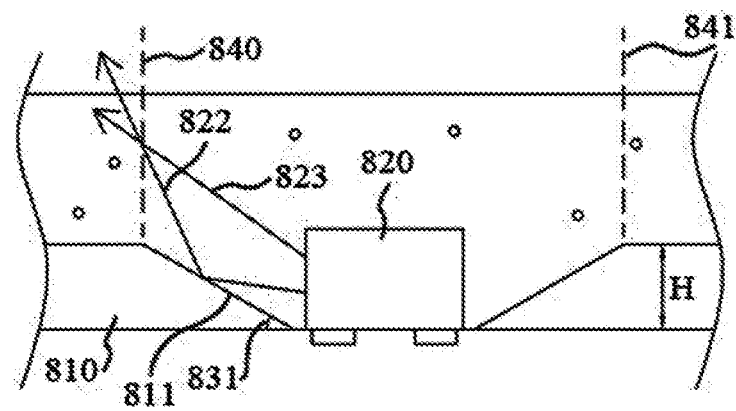

FIG. 11 shows exemplary representations for describing advantages of smaller angles of inclination on the inner face of the bottom part. For convenience of description, it only shows magnified inner faces of the bottom part.

The bottom part of the body in the semiconductor light emitting device according to the present disclosure should have a constant thickness H. However, when the bottom part has a constant thickness H and a large angel of inclination 830 on its inner face as in FIG. 11a, lights 821 coming out of the lateral faces of a semiconductor light emitting device chip 820 are reflected from the inner face 811 of the bottom part 810 and tend to be gathered inside between the dotted lines 840, 841, leading to an uneven extraction of the lights 821. Meanwhile, when an angle of inclination 831 is small as in FIG. 11b, lights 822, 823 coming out of the lateral faces of the semiconductor light emitting device chip 820 are reflected from the inner face 811 of the bottom part 810 but travel outside the dotted lines 840, 841, or the light 823 escapes directly without being reflected from the inner face 811 of the bottom part 810, allowing a uniform extraction of the lights 822, 823 in all directions.

Figure 12:
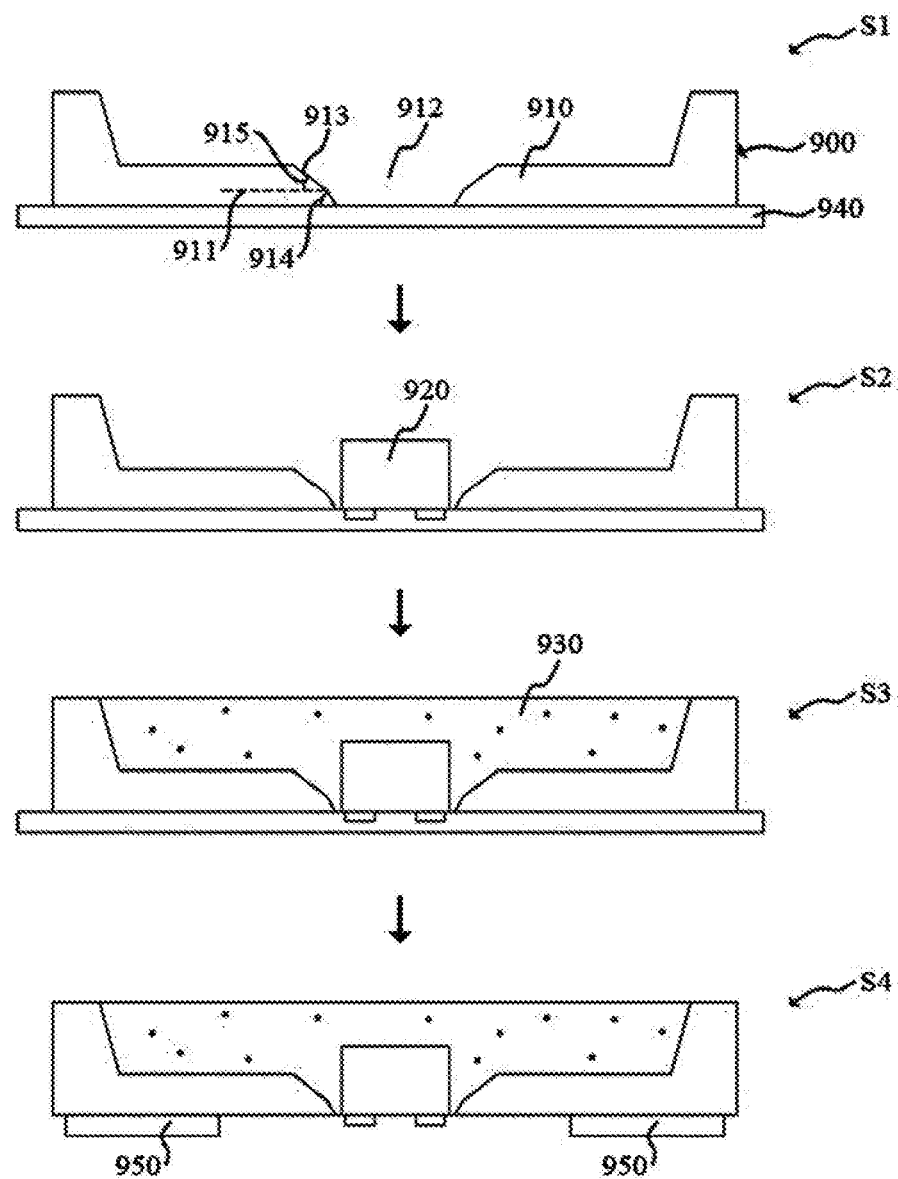
FIG. 12 shows an exemplary embodiment of a method of manufacturing a semiconductor light emitting device according to the present disclosure.

FIG. 12 shows an exemplary embodiment of a method of manufacturing a semiconductor light emitting device according to the present disclosure. First, a body 900 having a hole 912 at the bottom part 910 is prepared (S1). The body 900 can be obtained by injection molding. In the body 900 thus prepared, the hole 912 is formed of an inner face 913 of the bottom part 910 with different angles of inclination 914, 915. A semiconductor light emitting device chip 920 is placed (S2). Next, the semiconductor light emitting device chip 920 is covered with an encapsulating member 930 to fix the chip 920 to the body 900 (S3). Before the semiconductor light emitting device chip 920 is fixed with the encapsulating member 930, it may be immobilized by a temporary fixing plate 940. Any normal adhesive tape may be used for the temporary fixing plate 940. For example, blue tapes may be used. This temporary fixing plate 940 (if present) is then removed, and an adhesive part 950 is created (S4). Instead of the adhesive part 950, a reinforcement member (not shown) may optionally be formed. As the reinforcement member is arranged between the upper face and the lower face of the bottom part of the body, it can be inserted during the preparation of the body. The order of the steps of manufacturing the semiconductor light emitting device according to the present disclosure is within the scope of the present disclosure, given that it can be easily modified by those skilled in the art.

Figure 13:
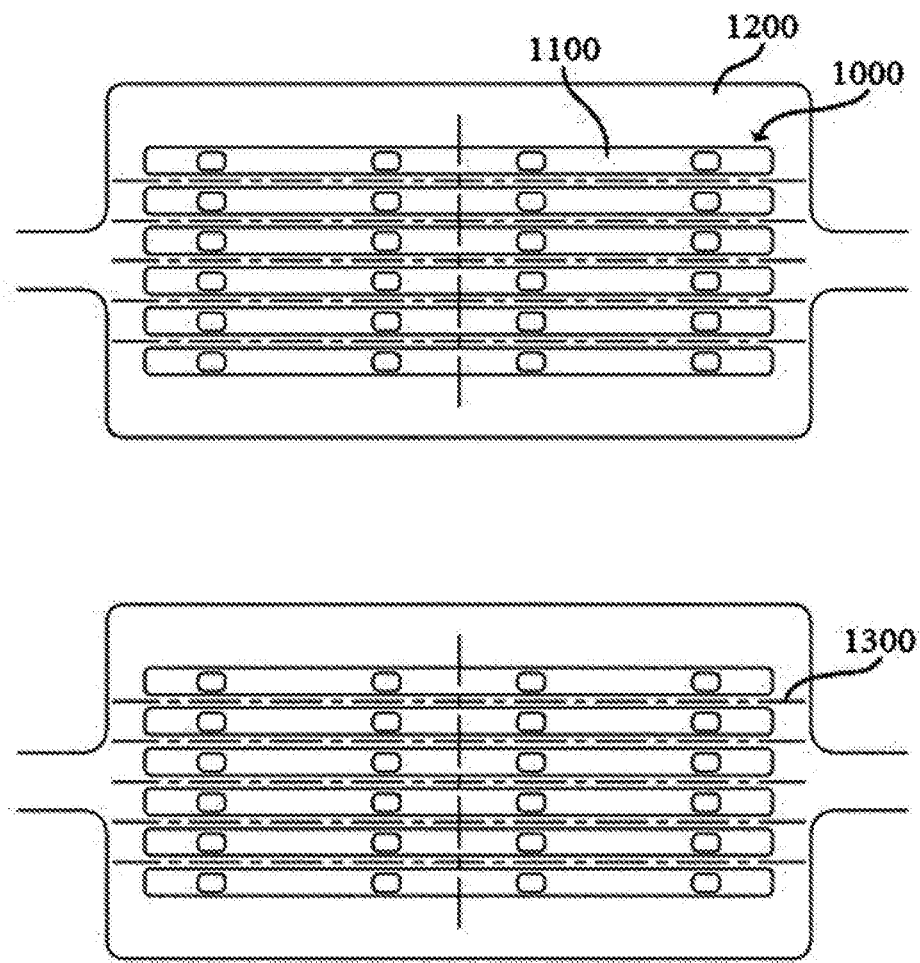
FIG. 13 shows a further exemplary embodiment of a method of manufacturing a semiconductor light emitting device according to the present disclosure.

FIG. 13 shows a further exemplary embodiment of a method of manufacturing a semiconductor light emitting device according to the present disclosure.

A plurality of semiconductor light emitting devices 1000 in FIG. 13 can be manufactured all together according to the manufacturing method described in FIG. 12. For example, a substrate 1200 having a plurality of bodies 1100 is first obtained by injection molding, and the plurality of semiconductor light emitting devices 1000 can be manufactured all at once. After that, a cutting process is performed along cutting lines 1300 to produce individual semiconductor light emitting devices 1000.

Figure 14:
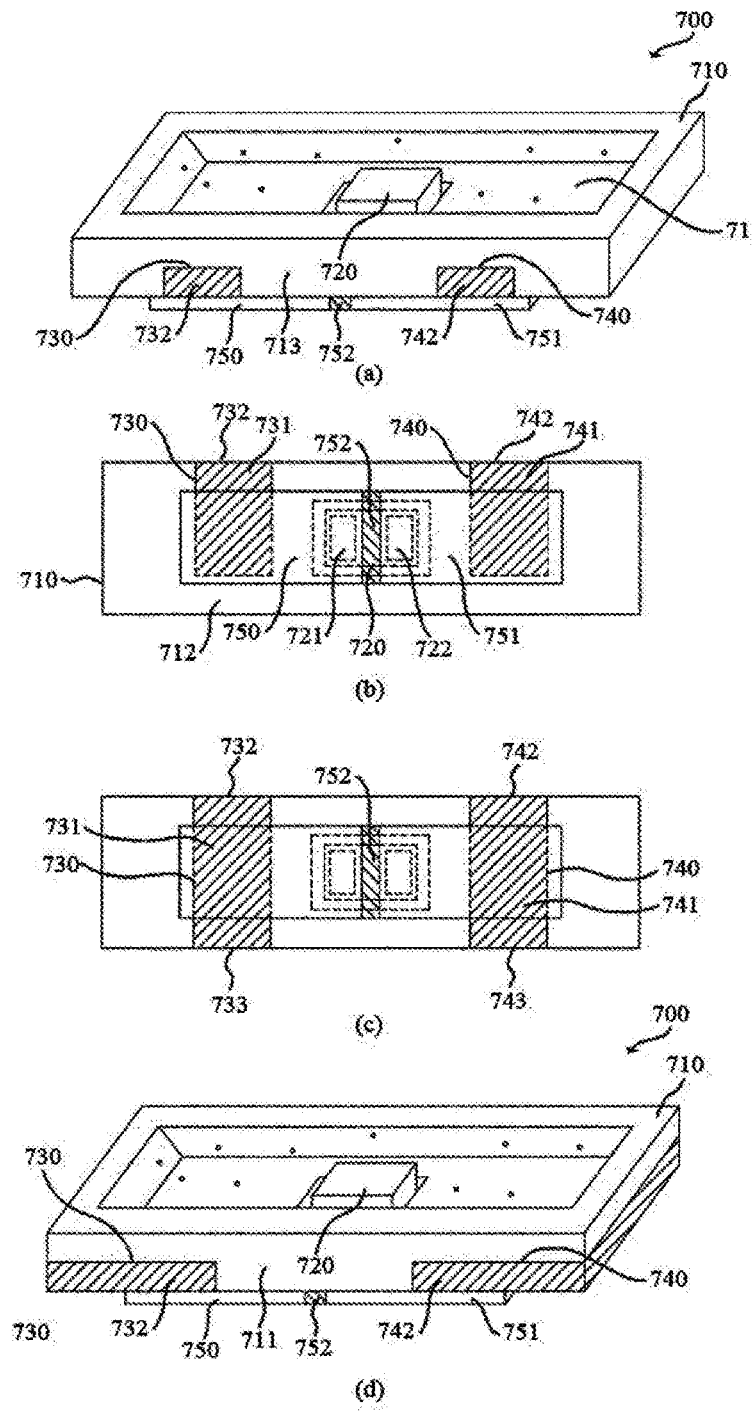
FIG. 14 shows a further exemplary embodiment of a semiconductor light emitting device according to the present disclosure.

FIG. 14 shows a further exemplary embodiment of a semiconductor light emitting device 700 according to the present disclosure. FIG. 14a and FIG. 14d are perspective view, and FIG. 14b and FIG. 14c are rear views.

The semiconductor light emitting device 700 includes a first insertion electrode 730 and a second insertion electrode 740 which are inserted into the body 710, and a first connection part 750 and a second connection part 751 which are arranged at the lower face 712 of the bottom part 711 of the body 710. The first insertion electrode 730 and the second insertion electrode 740 include exposed surfaces 731, 732, 741, 742 exposed to outside the body 710. These exposed surfaces 731, 732, 741, 742 of the first and second insertion electrodes 730, 740 are comprised of first exposed surfaces 731, 741 which are exposed towards the lower face 712 of the bottom part 711 of the body 710, and second exposed surfaces 732, 742 exposed towards the inner face 713 of the body 710. Although FIG. 14b illustrates that the first insertion electrode 730 and the second insertion electrode 740 each have two exposed surfaces, they may have more than two exposed surfaces, respectively. For instance, as shown in FIG. 14c, the first insertion electrode 730 and the second insertion electrode 740 may each have three exposed surfaces 731, 732, 733, 741, 742, 743. That is, the first insertion electrode 730 and the second insertion electrode 740 can have exposed surfaces 732, 733, 742, 743 that are exposed towards both sides. Alternatively, the insertion electrodes 730, 740 may be formed as shown in FIG. 14d. The second exposed surface 732 of the first insertion electrode 730 and the second exposed surface 742 of the second insertion electrode 740 are exposed towards the same sides and electrically connected to outside. Here, the outside may be a PCB substrate or a sub-mount. The second exposed surface 732 of the first insertion electrode 730 and the second exposed surface 742 of the second insertion electrode 740 being electrically connected to outside will be described further with reference to FIG. 15 below. The first connection part 750 and the second connection part 751 are arranged at the lower face 712 of the bottom part 711 of the body 710, and electrically connect the semiconductor light emitting device chip 720 to one of the exposed surfaces of each of the first insertion electrode 730 and the second insertion electrode 712. That is, the first connection part 750 electrically connects a first electrode 721 of the semiconductor light emitting device chip 720 and the first exposed surface 731 of the first insertion electrode 730, and the second connection part 750 electrically connects a second electrode 722 of the semiconductor light emitting device chip 720 and the first exposed surface 741 of the second insertion electrode 740. Moreover, an insulating layer 752 for preventing an electrical short may be additionally included between the first connection part 750 and the second connection part 751. While FIG. 14 illustrates that two insertion electrodes and two connection parts, one of each can be present, and this is also within the scope of the present disclosure. With the exception of the configurational features described above in relation to FIG. 14, the semiconductor light emitting device 700 is substantially the same as the semiconductor light emitting device 200 of FIG. 4.

Figure 15:
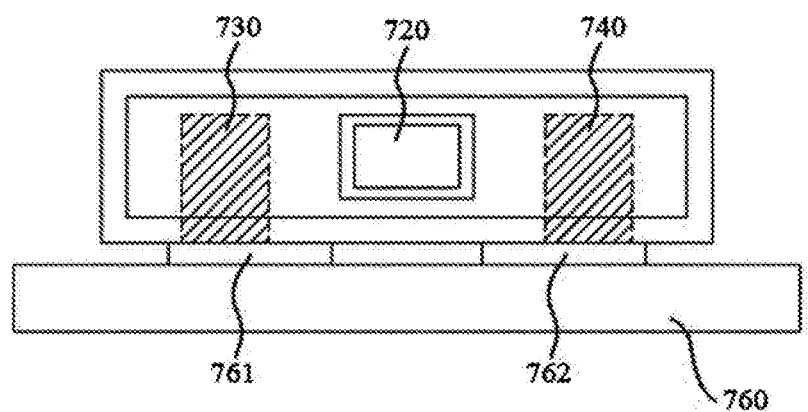
FIG. 15 shows an exemplary representation of the use of the semiconductor light emitting device of FIG. 14.

FIG. 15 shows an exemplary representation of the use of the semiconductor light emitting device of FIG. 14.

The semiconductor light emitting device 700 can be used for side emission. Such a device in the prior art is described in Korean Patent Laid-Open Publication No. 10-2007-0098180. In the semiconductor light emitting device 700, the second exposed surface 732 of the first insertion electrode 730 is electrically connected to the first electrode 761 of an external substrate 760 such as a PCB substrate or a sub-mount, and the second exposed surface 742 of the second insertion electrode 740 is electrically connected to the second electrode 762 of the external substrate 760. That is, the first and second insertion electrodes 730, 740 enable the semiconductor light emitting device 700 to be used for side emission. For better understanding, the first and second insertion electrodes 730, 740 are indicated by dotted lines. Referring to FIG. 14 and FIG. 15, electricity rungs through the first electrode 760 of the external substrate 760, followed by the second exposed surface 732 of the first insertion electrode 730, the first exposed surface 731 of the first insertion electrode 730, and the first connection part 750, and finally arrives at the first electrode 721 of the semiconductor light emitting device chip 720. Likewise, the route for electricity to be transferred to the second electrode 722 of the semiconductor light emitting device chip 720 is similar. The semiconductor light emitting device chip 720 may be used to emit light to the sides in particular (i.e., side emission), using electricity transferred from outside.

Figure 16:
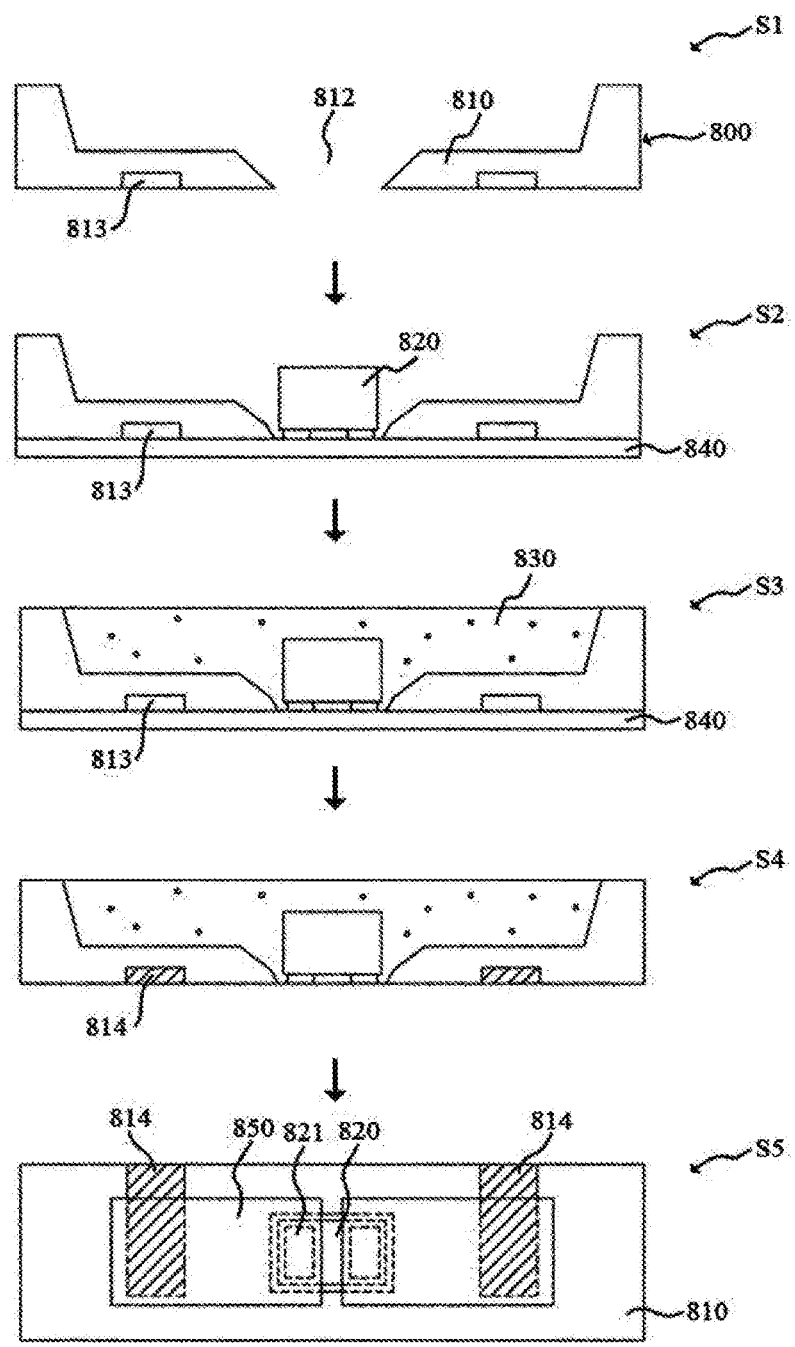
FIG. 16 shows a further exemplary embodiment of a method of manufacturing the semiconductor light emitting device of FIG. 14.

FIG. 16 shows a further exemplary embodiment of a method of manufacturing the semiconductor light emitting device FIG. 14.

First, a body 800, which includes a hole 812 in the bottom part 810 and insertion electrode space 813 to receive insertion electrodes 814, is prepared (S1). The body 800 can be obtained by injection molding. Alternatively, although not shown, an electrically conductive bar (e.g. Cu) may be pre-arranged into the insertion electrode space 813 prior to the injection molding such that the body thus molded would have the insertion electrode 814 already being inserted therein. A semiconductor light emitting device chip 820 is then placed (S2). Next, the semiconductor light emitting device chip 820 is covered with an encapsulating member 830 to fix the chip 820 to the body 800 (S3). Before the semiconductor light emitting device chip 820 is fixed with the encapsulating member 830, it may be immobilized by a temporary fixing plate 840. Any normal adhesive tape may be used for the temporary fixing plate 840. For example, blue tapes may be used. This temporary fixing plate 840 (if present) is then removed, and a conductive material is filled in the insertion electrode space 813 (S4). Filling the insertion electrode space 813 with the conductive material can be carried out in step S1. Needless to say, if the body was injection molded after a conductive bar such as copper had been inserted into the insertion electrode space 813, there is no need to fill the space with the conductive material separately. Next, a connection part 850 is formed to electrically connect the exposed surfaces of the insertion electrode 814 to the electrode 821 of the chip 820. For a clearer view, step S5 has been provided as a rear view of the body 800. The order of the steps of manufacturing the semiconductor light emitting device according to the present disclosure is within the scope of the present disclosure, given that it can be easily modified by those skilled in the art.

Figure 17:
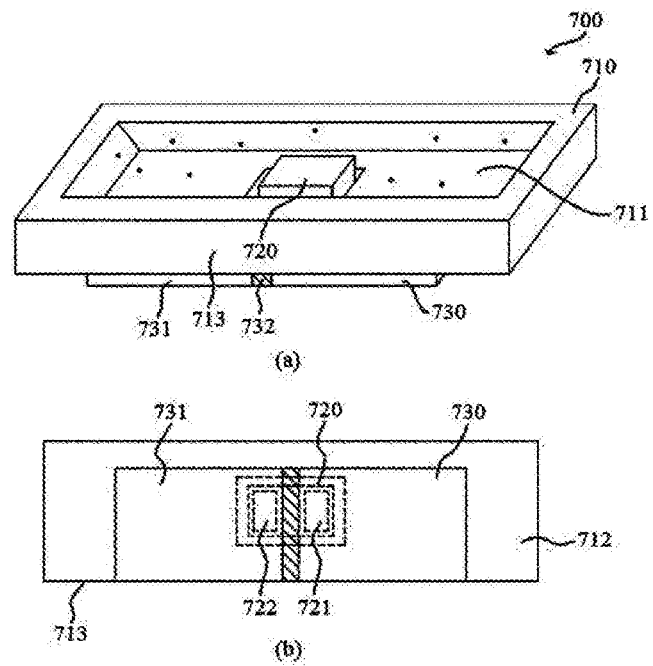
FIG. 17 shows a further exemplary embodiment of a semiconductor light emitting device according to the present disclosure.

FIG. 17 shows a further exemplary embodiment of a semiconductor light emitting device 700 according to the present disclosure. FIG. 17*a* is a perspective view, and FIG. 17*b* is a rear view.

The semiconductor light emitting device 700 includes a body 710, and first and second conductive parts 730, 731 located at the lower face 712 of the bottom part 711 of the body 710. The first conductive part 730 is electrically connected to the first electrode 721 of the semiconductor light emitting device chip 720, and abuts against an edge 713 of the lower face 712 of the bottom part 711 of the body 710. In addition, the first conductive part 731 is electrically connected to the second electrode 721 of the semiconductor light emitting device chip 720, and abuts against an edge 713 of the lower face 712 of the bottom part 711 of the body 710. Here, the edges 713 of the lower face 712 of the bottom part 711 of the body 710, onto which the first and second conductive parts 730, 731 abut are the same. The first conductive part 730 and the second conductive part 731 are made of conductive materials. Among other conductive materials, they are preferably made of metallic materials, for example, Al, Cu and Ag, which are then deposited or plated. The first conductive part 730 and the second conductive part 731 are arranged at a distance away from each other to prevent an electrical short. Alternatively, an insulating layer 732 may be positioned between the first conductive part 730 and the second conductive part 731 to do the same. The insulating layer 732 is preferably a white insulating layer with a non-light transmissive reflecting function, and can be coated with a synthetic resin-based material, such as silicon or epoxy. When this white insulating layer with a non-light transmissive reflecting function is present, light from the active layer may not pass through because of the insulating layer 732, which leads to an improved brightness. With the exception of the configurational features described above in relation to FIG. 17, the semiconductor light emitting device 700 is substantially the same as the semiconductor light emitting device 200 of FIG. 4.

Figure 18:
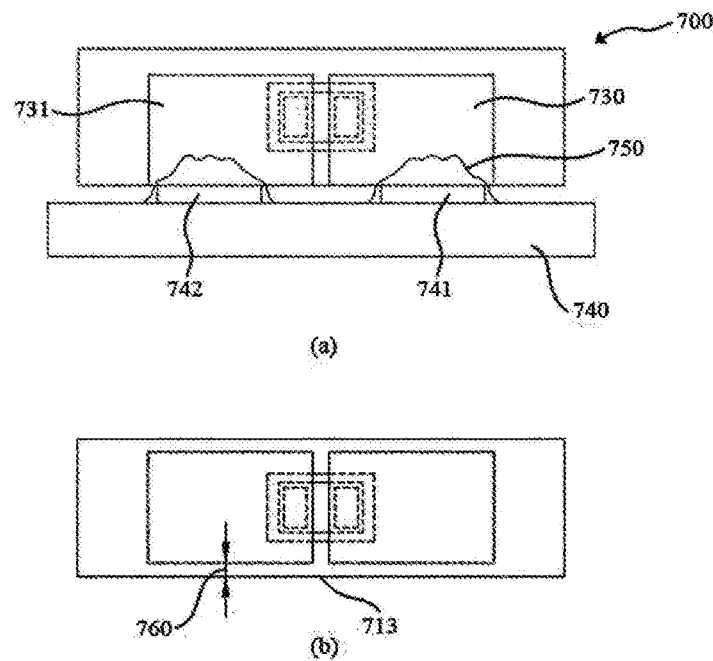
FIG. 18 shows an exemplary representation of the use of the semiconductor light emitting device of FIG. 17.

FIG. 18 shows an exemplary representation of the use of the semiconductor light emitting device of FIG. 17.

The semiconductor light emitting device 700 may be used for side emission. Such a device in the prior art is described in Korean Patent Laid-Open Publication No. 10-2007-0098180. In the semiconductor light emitting device 700, the first conductive part 730 is electrically connected to the first electrode 741 of an external substrate 740 such as a PCB substrate or a sub-mount, and the second conductive part 731 is electrically connected to the second electrode 742 of the external substrate 740. That is, during the soldering process of bonding the semiconductor light emitting device 700 to the external substrate 740, a soldering material 750 (e.g. Pb) ascends along the direction of the first and second conductive parts 730, 731 and electrically connects the first conductive part 730 to the first electrode 741, and the second conductive part 731 to the second electrode 742. Particularly, in order for the soldering material 750 to ascend along the direction of the first and second conductive parts 730, 731, the edge 713 of the lower face 712 of the bottom part 711 of the body 710 preferably abuts against the first and second conductive parts 730, 731 as shown in FIG. 17, and at least, a distance 760 therebetween should be 10 μm or less as shown in FIG. 18b. Moreover, the soldering process should preferably be carried out after the semiconductor light emitting device 700 is fixed to the external substrate 740 by means of an epoxy resin, for example, to help the soldering material in ascending along the direction of the first and second conductive parts. Therefore, as shown in FIG. 18a, it gets easier to obtain a semiconductor light emitting device for side emission by electrically connecting the first and second conductive parts 730, 731 to the first and second electrodes 741, 742 of the external substrate 740 with the soldering material 750 during the soldering process.

Figure 19:
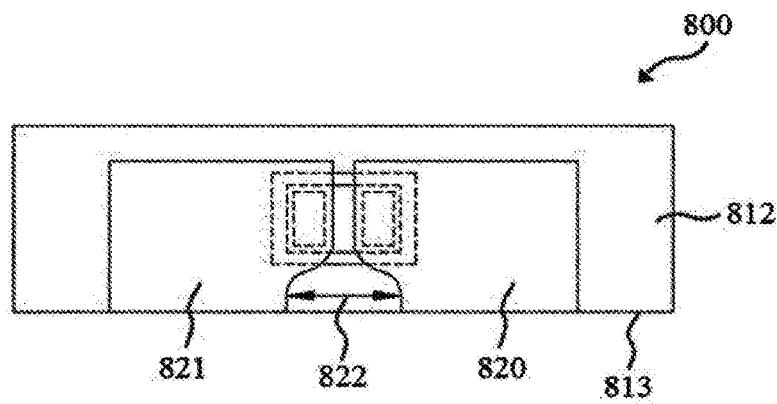
FIG. 19 shows a further exemplary embodiment of a semiconductor light emitting device according to the present disclosure.

FIG. 19 shows a further exemplary embodiment of a semiconductor light emitting device 800 according to the present disclosure.

In the semiconductor light emitting device 800, a distance between a first conductive part 820 and a second conductive part 821 varies. The distance between the first conductive part 820 and the second conductive part 821 may be largest at an edge 813 of a lower face 812 of the bottom part of the body, where the first and second conductive parts 820, 821 abut against the edge, such that an electrical short, which occurs as the soldering material ascends along the direction of the first and second conductive parts 820, 821 may be prevented during bonding the semiconductor light emitting device 800 to an external substrate, as shown in FIG. 18a. With the exception of the configurational features described above in relation to FIG. 19, the semiconductor light emitting device 800 is substantially the same as the semiconductor light emitting device 700 of FIG. 17.

Figure 20:
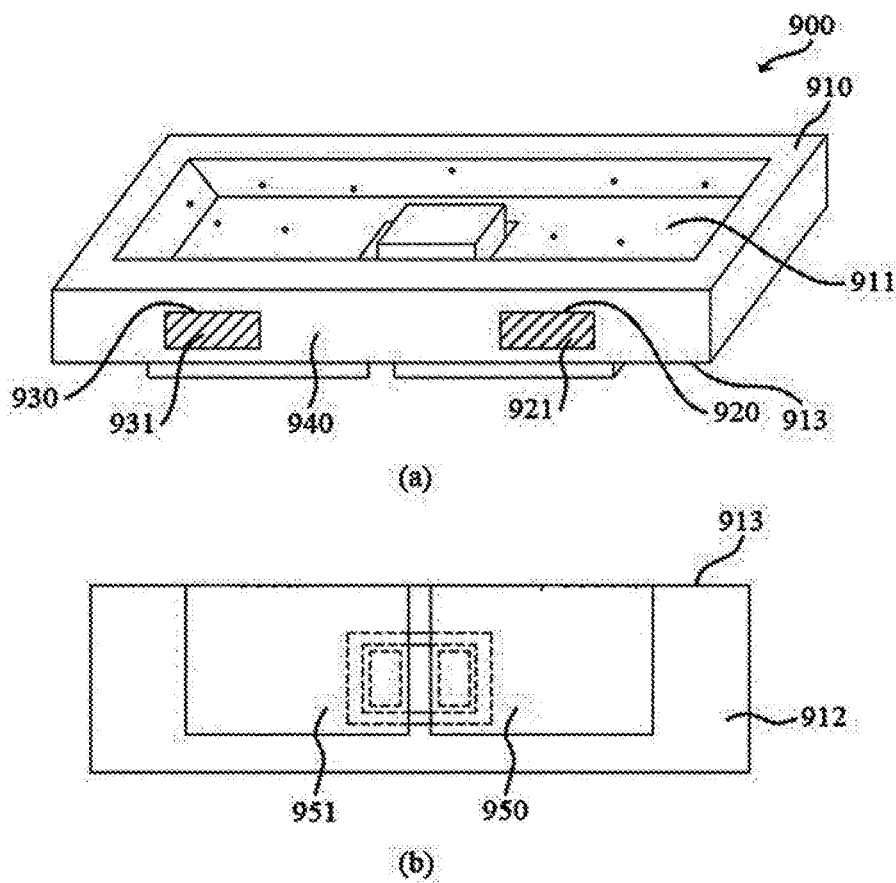
FIG. 20 shows a further exemplary embodiment of a semiconductor light emitting device according to the present disclosure.

FIG. 20 shows a further exemplary embodiment of a semiconductor light emitting device 900 according to the present disclosure.

The semiconductor light emitting device 900 includes a first insertion part 920 and a second insertion part 921, which are placed in a body 910. The first and second insertion parts 920, 930 include exposed surfaces 921, 931 exposed to outside the body, respectively. These exposed surfaces 921, 931 are formed on a same lateral face 940 of the body 910. In addition, the lateral face 940 is either bonded with a first conductive part 950 as shown in FIG. 20b, or shares an edge 913 of a lower face 912 of a bottom part 911 of the body at a distance 10 μm or less from a first conductive part 950. Because the first and second insertion parts 920, 930 are formed of metallic materials and have the exposed surfaces 921, 931 on the lateral face 940 that comes in contact with an external substrate as the semiconductor light emitting device 900 is connected to the external substrate for side emission, the semiconductor light emitting device 900 and the external substrate can join together with an improved bonding strength. With the exception of the configurational features described above in relation to FIG. 20, the semiconductor light emitting device 900 is substantially the same as the semiconductor light emitting device 700 of FIG. 17.

Figure 21:
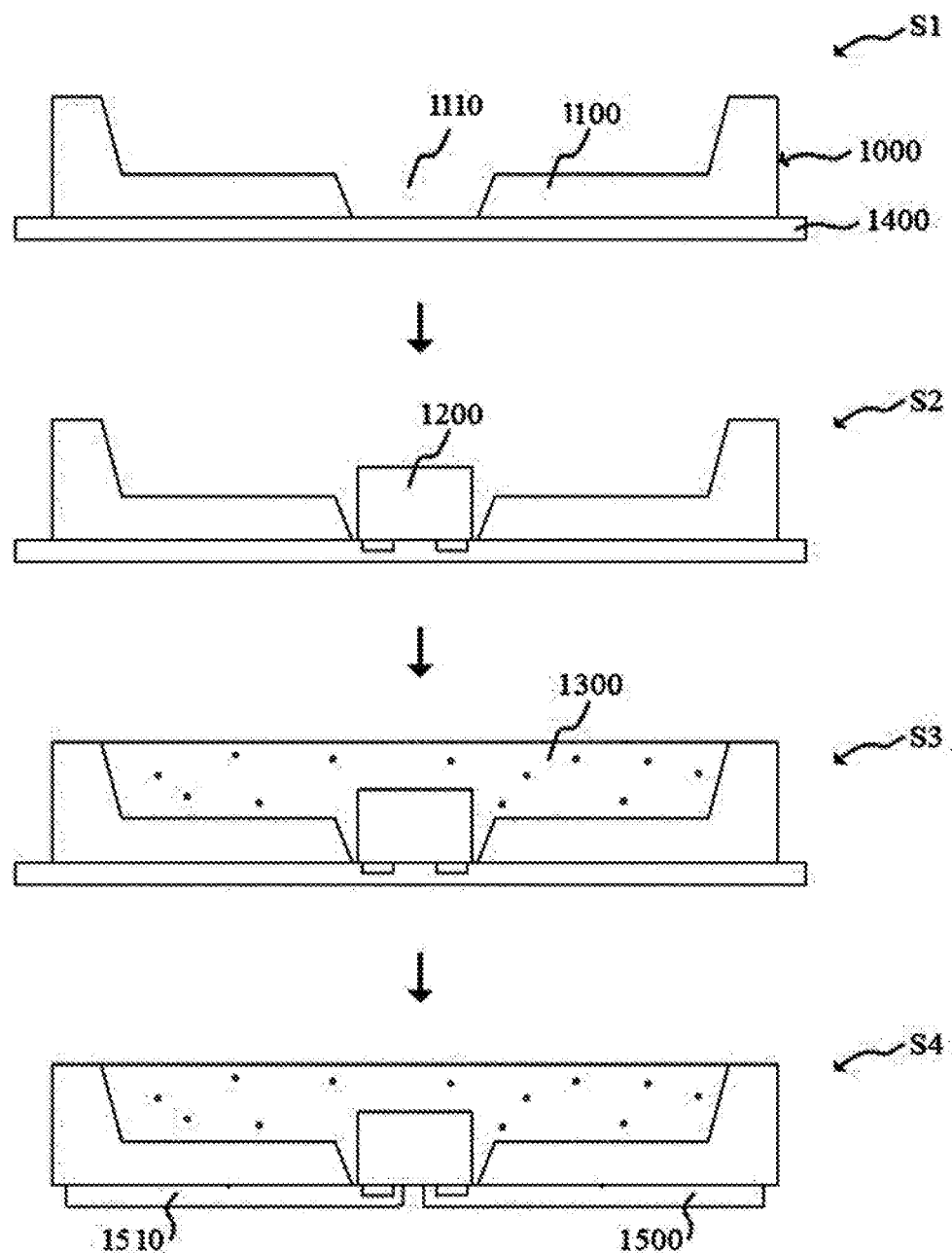
FIG. 21 shows an exemplary embodiment of a method of manufacturing the semiconductor light emitting device of FIG. 17.

FIG. 21 shows an exemplary embodiment of a method of manufacturing the semiconductor light emitting device of FIG. 17.

A body 1000 including a hole 1110 in a bottom part 1100 is first prepared (S1). The body 1000 can be obtained by injection molding. Although not shown, an electrically conductive bar (e.g. Cu) may be pre-arranged into a place where an insertion part (not shown) prior to the injection molding such that the body thus obtained would have the insertion part of FIG. 20 already being inserted therein. A semiconductor light emitting device chip 1200 is then placed in the hole 1110 (S2). Next, the semiconductor light emitting device chip 1200 is covered with an encapsulating member 1300 to fix the chip 1200 to the body 1000 (S3). Before the semiconductor light emitting device chip 1200 is fixed with the encapsulating member 1300, it may be immobilized by a temporary fixing plate 1400. Any normal adhesive tape may be used for the temporary fixing plate 1400. For example, blue tapes may be used. This temporary fixing plate 1400 (if present) is then removed, and a first conductive part 1500 and a second conductive part 1510 are formed in a way that they cover semiconductor light emitting device chips 1210, 1211 exposed from a bottom part 1100 of the body 1000 (S4). Particularly, in step S4, the first conductive part 1500 and the second conductive part 1510 are formed in a way that they either abut against at least one edge of the lower face of the bottom part 1100 of the body 1000, or they are at a distance of 10 μm or less from the corresponding edge. The order of the steps of manufacturing the semiconductor light emitting device according to the present disclosure is within the scope of the present disclosure, given that it can be easily modified by those skilled in the art.

Figure 22:
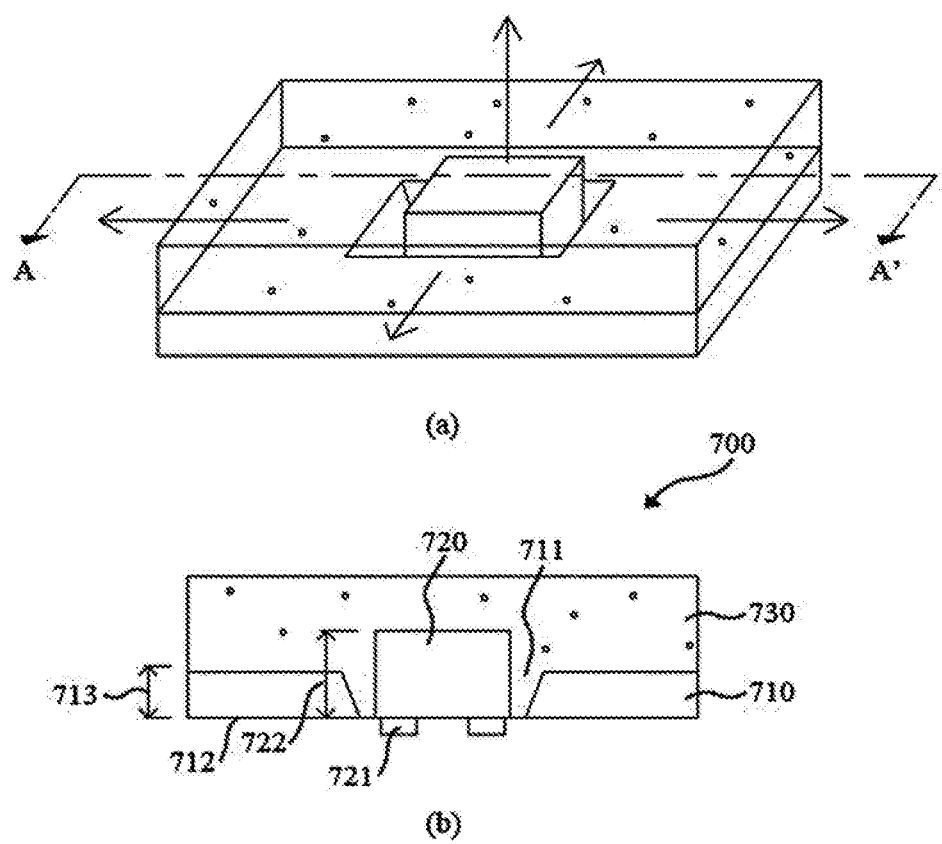
FIG. 22 shows a further exemplary embodiment of a semiconductor light emitting device according to the present disclosure.

FIG. 22 shows a further exemplary embodiment of a semiconductor light emitting device 700 according to the present disclosure. FIG. 22a is a perspective view, and FIG. 22b is a cross-sectional view.

The semiconductor light emitting device 700 includes a bottom part 710 having a hole 711, a semiconductor light emitting device chip 720 received in the hole 711 of the bottom part 710, and an encapsulating member 730 for covering the bottom part 710 and the semiconductor light emitting device chip 720. An electrode 721 of the semiconductor light emitting device chip 720 is exposed towards the lower face 712 of the bottom part 710. Preferably, the electrode 721 is projected from the bottom part 710. The bottom part 710 has a height 713 that is less than the height of the semiconductor light emitting device chip 720. Because the height 713 of the bottom part 710 is less than the height 722 of the semiconductor light emitting device chip 720, the semiconductor light emitting device 700 is capable of emitting light to five sides, as indicated by arrows in FIG. 22a. In general, a semiconductor light emitting device with the size of a chip, similar to the semiconductor light emitting device 700 in FIG. 22, is referred to as a CSP (Chip Scale Package) type device, and such a device is distinguished from those semiconductor light emitting devices shown in FIG. 3 to FIG. 8. Description relevant to CSP type semiconductor light emitting devices can be found in Korean Patent Laid-Open Publication No. 10-2014-0127457. With the exception of the configurational features described above in relation to FIG. 22, the semiconductor light emitting device 700 is substantially the same as the semiconductor light emitting device 200 of FIG. 4.

Figure 23:
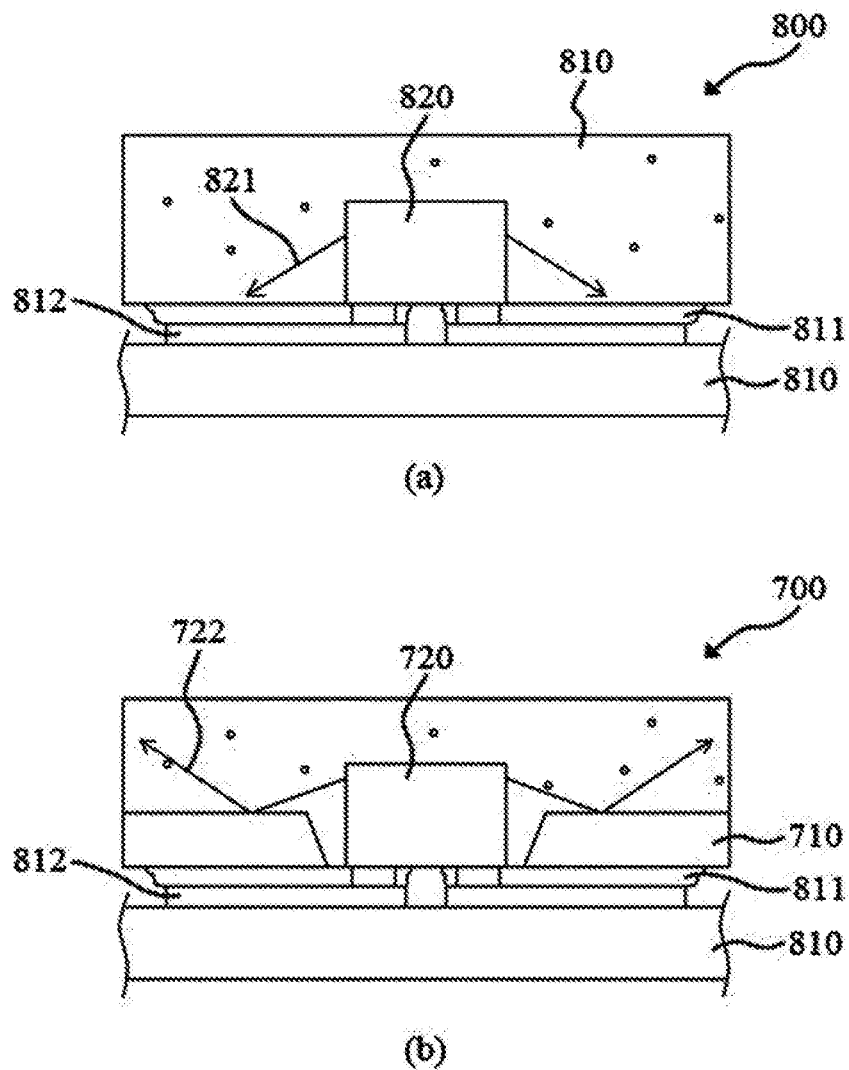
FIG. 23 shows an exemplary representation for describing advantages of the semiconductor light emitting device of FIG. 22.

FIG. 23 shows an exemplary representation for describing advantages of the semiconductor light emitting device of FIG. 22.

FIG. 23a illustrates a problem found in a conventional CSP type semiconductor light emitting device 800. Referring to FIG. 23a, the conventional CSP type semiconductor light emitting device 800 includes a semiconductor light emitting device chip 820 and an encapsulating member 810. When this conventional CSP type semiconductor light emitting device 800 is mounted onto an external substrate 810 (e.g. a sub-mount, a PCT, etc.) by soldering, a portion of light 821 coming out of the semiconductor light emitting device chip 820 is absorbed by the external substrate 810 and a solder 811, resulting in a light loss. As an attempt to solve this problem with the conventional CSP type semiconductor light emitting device, the semiconductor light emitting device 700 in FIG. 23b according to the present disclosure is designed such that even if it is mounted onto the external substrate 810 by soldering, light 722 coming out of the semiconductor light emitting device chip 720 is reflected from the bottom part 710, and not absorbed by the solder 811 and the external substrate 810, which in turn results in an increased efficiency of light extraction of the semiconductor light emitting device 700. Reference numeral 812 in FIG. 23 denotes an electrode formed on the external substrate 811.

Figure 24:
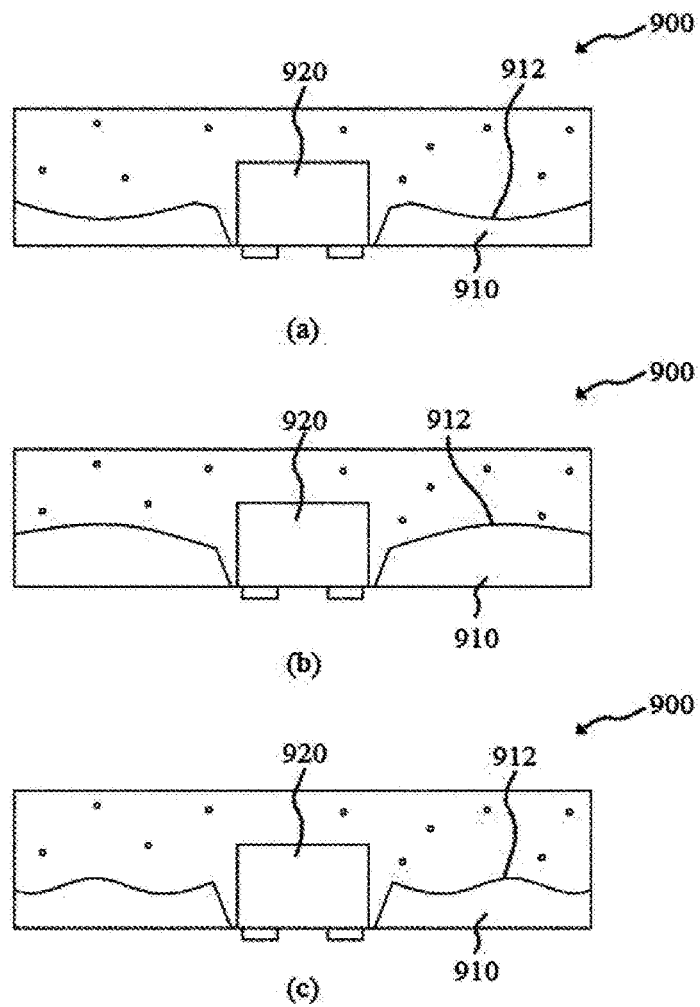
FIG. 24 shows a further exemplary embodiment of a semiconductor light emitting device according to the present disclosure.

FIG. 24 shows a further exemplary embodiment of a semiconductor light emitting device 900 according to the present disclosure.

The semiconductor light emitting device 900 includes a bottom part 910 of which upper face 912 has at least one of concave or convex portions. That is, the upper face 912 of the bottom part 910 is characterized by having concave portions as shown in FIG. 24a, convex portions as shown in FIG. 24b, or a combination of alternating concave and convex portions as shown in FIG. 24c. When the upper face 912 of the bottom part 910 has at least one of concave or convex portions, a portion of the light traveling towards the bottom part 910 in particular after it has been emitted by the semiconductor light emitting device chip 920 is reflected at a higher reflectance, and therefore, the efficiency of light extraction can be increased. With the exception of the configurational features described above in relation to FIG. 24, the semiconductor light emitting device 900 is substantially the same as the semiconductor light emitting device 700 of FIG. 22.

Figure 25:
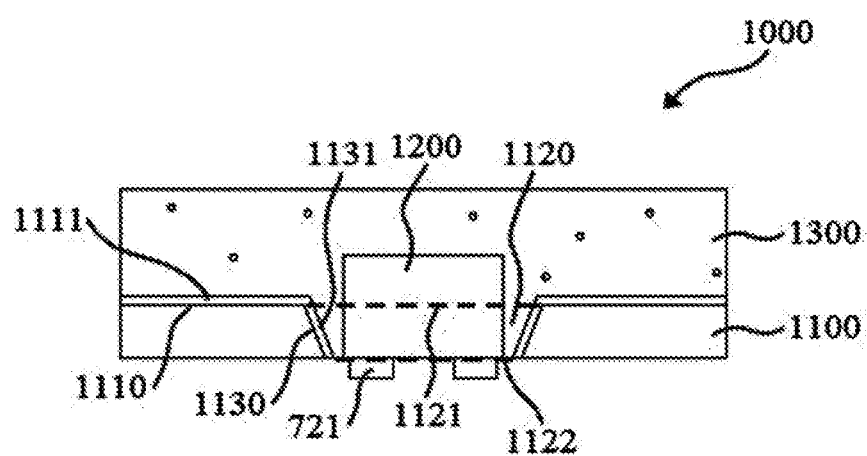
FIG. 25 shows a further exemplary embodiment of a semiconductor light emitting device according to the present disclosure.

FIG. 25 shows a further exemplary embodiment of a semiconductor light emitting device 1000 according to the present disclosure.

The semiconductor light emitting device 1000 can include a reflective layer 1111 on the upper face 1110 of the bottom part 1100, or a reflective layer 1131 on the lateral face 1130 of the hole 1120—defining bottom part 1100 as shown in FIG. 6 and FIG. 7, so as to increase the reflectance of a portion of the light traveling towards the bottom part 1100 after it has been emitted by the semiconductor light emitting device chip 1200. The reflective layer 1111, 1131 can be a highly reflective metal layer. Further, when an encapsulant member 1300 filled between the bottom part 1100 and the semiconductor light emitting device chip 1200 is electrically insulating, the reflective layer 1111, 1131 and the semiconductor light emitting device chip 1200 are electrically insulated from each other, and therefore, an electric short would not occur even if the upper face 1110 and lateral faces 1130 of the bottom part 1100 are entirely metal reflective layers. In addition, for a higher efficiency of light extraction of the semiconductor light emitting device 1000, it is desirable that the lateral face 1130 of the hole 1120—defining bottom part 1100 is slanted to make a lower portion 1122 of the hole 1120 smaller than an upper portion of the hole 1120. With the exception of the configurational features described above in relation to FIG. 25, the semiconductor light emitting device 1000 is substantially the same as the semiconductor light emitting device 700 of FIG. 22.

Figure 26:
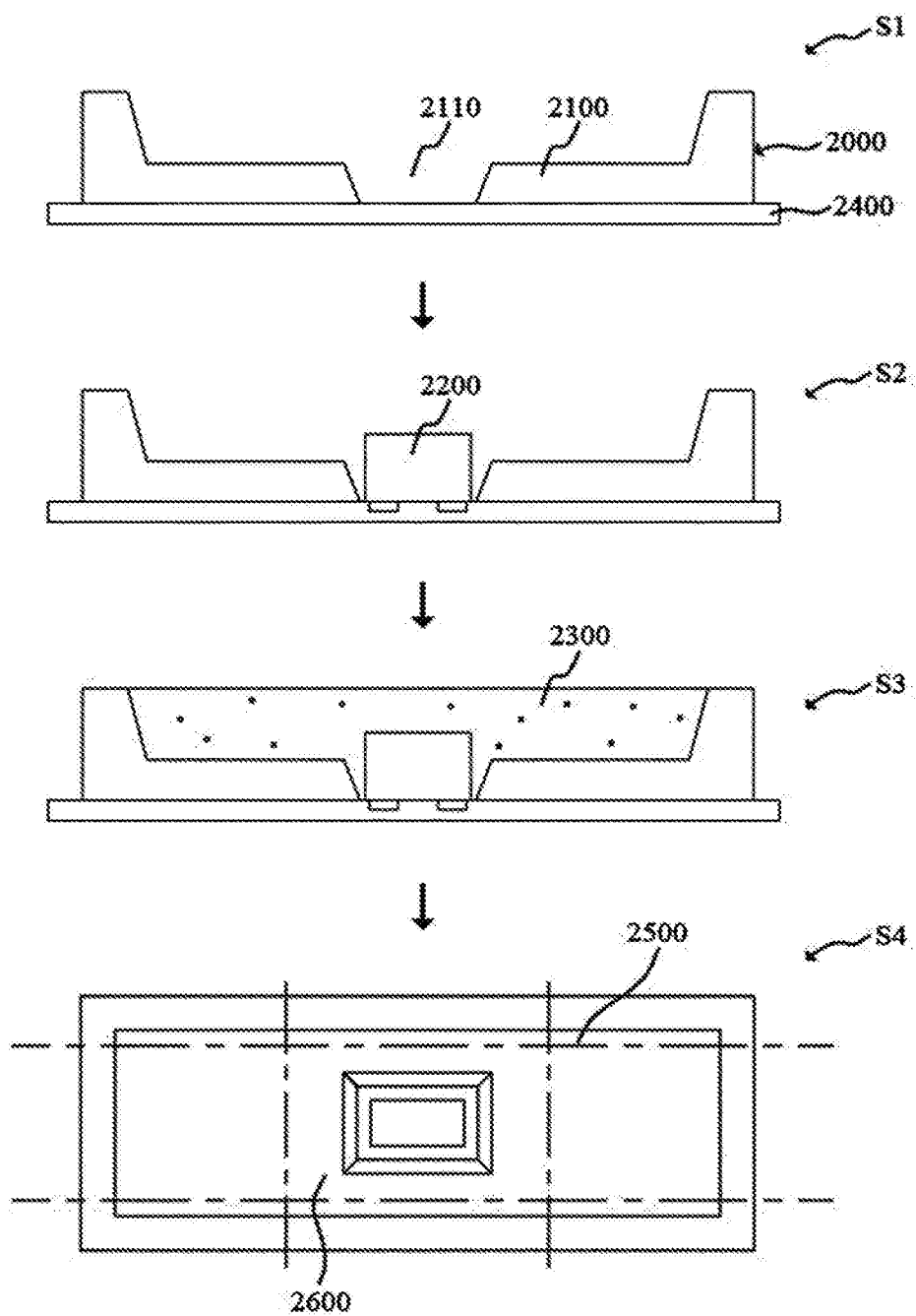
FIG. 26 shows an exemplary embodiment of a method of manufacturing the semiconductor light emitting device of FIG. 22.

FIG. 26 shows an exemplary embodiment of a method of manufacturing the semiconductor light emitting device of FIG. 22.

First, a body 2000 having a hole 2110 in a bottom part 2100 is prepared (S1). The body 2000 can be obtained by injection molding. A semiconductor light emitting device chip 2200 is then placed in the hole 2110 (S2). Next, the semiconductor light emitting device chip 2200 and the bottom parts 2100 are covered with an encapsulating member 2300 (S3). Before covering the semiconductor light emitting device chip 2200 with the encapsulating member 2300, a temporary fixing plate 2400 may be used to immobilize the semiconductor light emitting device chip 2200. A cutting process is then carried out along cutting lines 2500 to obtain a semiconductor light emitting device 2600 comprised of the bottom part 2100, the semiconductor light emitting device chip 2200 and the encapsulating member 2300 (S4). For a clearer view of the cutting process in step S4, it is illustrated with the top view. Once steps from S1 to S4 are completed, a CSP type semiconductor light emitting device 2600 as shown in FIG. 22 can easily be obtained. Meanwhile, for one's information, the semiconductor light emitting device 200 as shown in FIG. 4 can be obtained simply by steps from S1 to S3. The order of the steps of manufacturing the semiconductor light emitting device according to the present disclosure is within the scope of the present disclosure, given that it can be easily modified by those skilled in the art.

Figure 27:
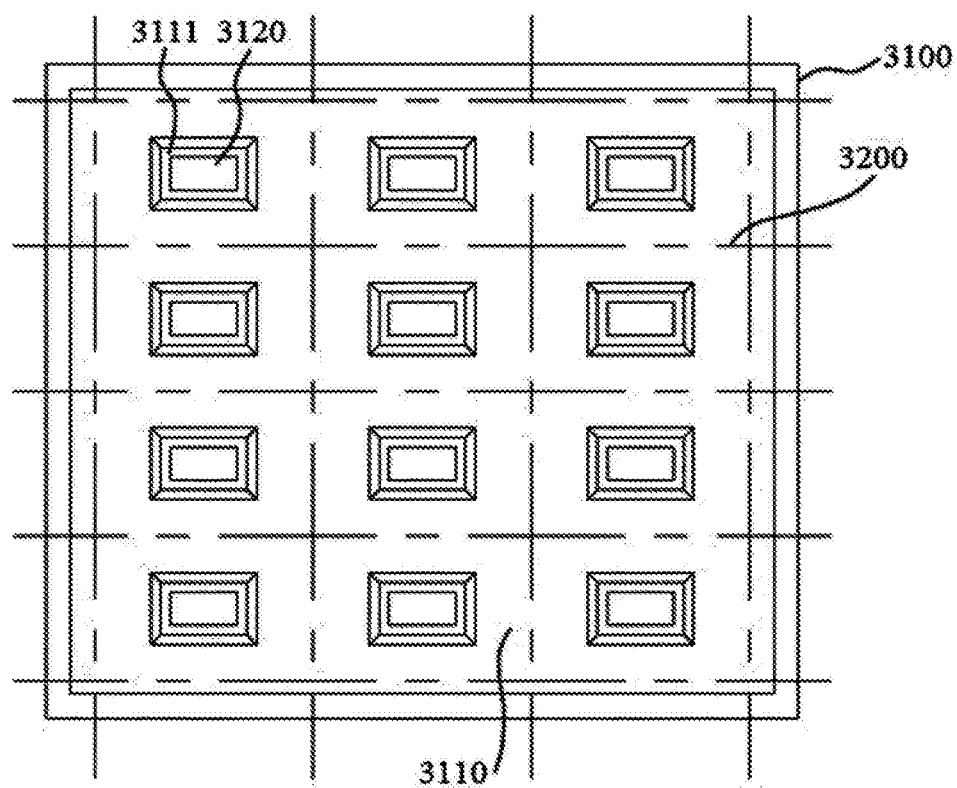
FIG. 27 shows a further exemplary embodiment of a method of manufacturing the semiconductor light emitting device of FIG. 22.

FIG. 27 shows a further exemplary embodiment of a method of manufacturing the semiconductor light emitting device of FIG. 22.

A plurality of semiconductor light emitting devices in FIG. 27 can be manufactured all together according to the manufacturing method described in FIG. 26. For example, a body 3100 including a bottom part 3110 with a plurality of holes 3111 formed therein is first obtained by injection molding, and then, according to the manufacturing method described in FIG. 26, semiconductor light emitting device chips 3120 are placed in the holes 3111, respectively, covered with an encapsulating member, and cut along cutting lines 3200 to produce a plurality of semiconductor light emitting devices all at once.

Figure 28:
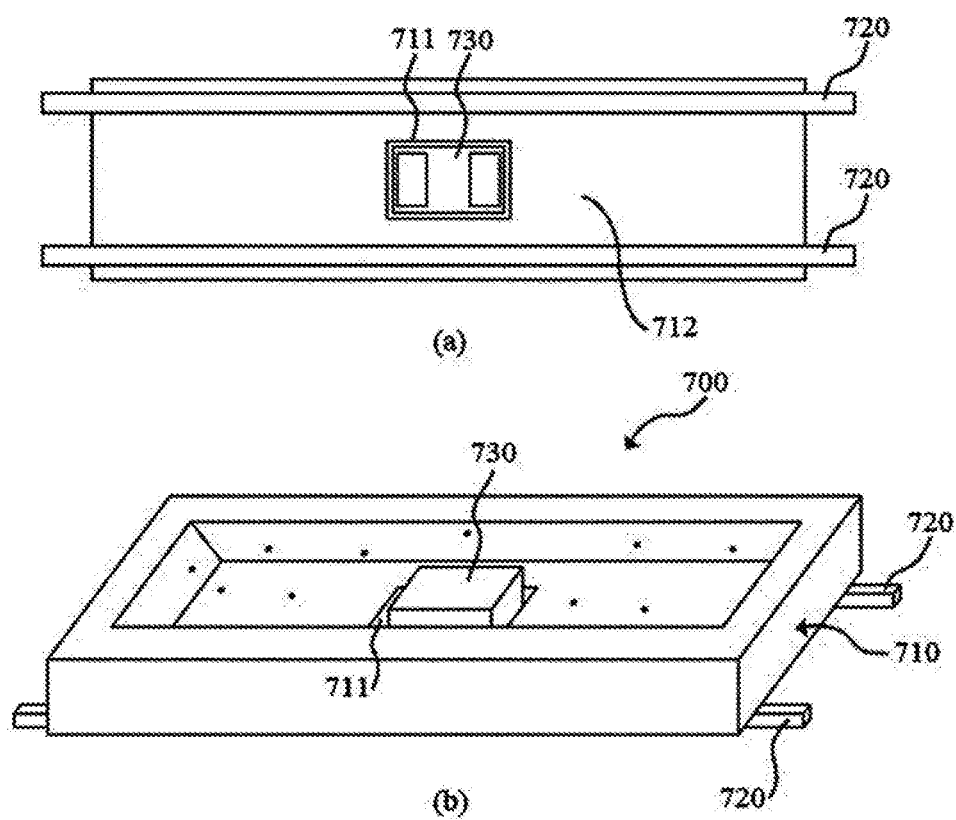
FIG. 28 shows a further exemplary embodiment of a semiconductor light emitting device according to the present disclosure.

FIG. 28 shows a further exemplary embodiment of a semiconductor light emitting device 700 according to the present disclosure. FIG. 28a is a bottom view, and FIG. 28b is a perspective view.

The semiconductor light emitting device 700 includes a reinforcement member 720. With the exception of the reinforcement member 720, the semiconductor light emitting device 700 has the same configurational features as the semiconductor light emitting device 200 of FIG. 4. More than one reinforcement member 720 may be provided. Referring to FIG. 28, when two reinforcement members 720 are present, a hole 711 and a semiconductor light emitting device chip 720 placed in the hole 711 can be located between the reinforcement members 720. It is desirable that the reinforcement members 720 and the hole 711 are arranged in a non-overlapping manner. The reinforcement member 720 is advantageous for correcting a warpage of the body 710 or a crack of the body 710 due to the warpage. Preferably, the reinforcement member 720 is a metal. The reinforcement member 720 can be a lead frame described in FIG. 3. In particular, the reinforcement members 720 arranged as shown in FIG. 28a and the reinforcement members 720 arranged as shown in FIG. 29b and FIG. 29c can serve as the bonding part previously described in FIG. 5.

Figure 29:
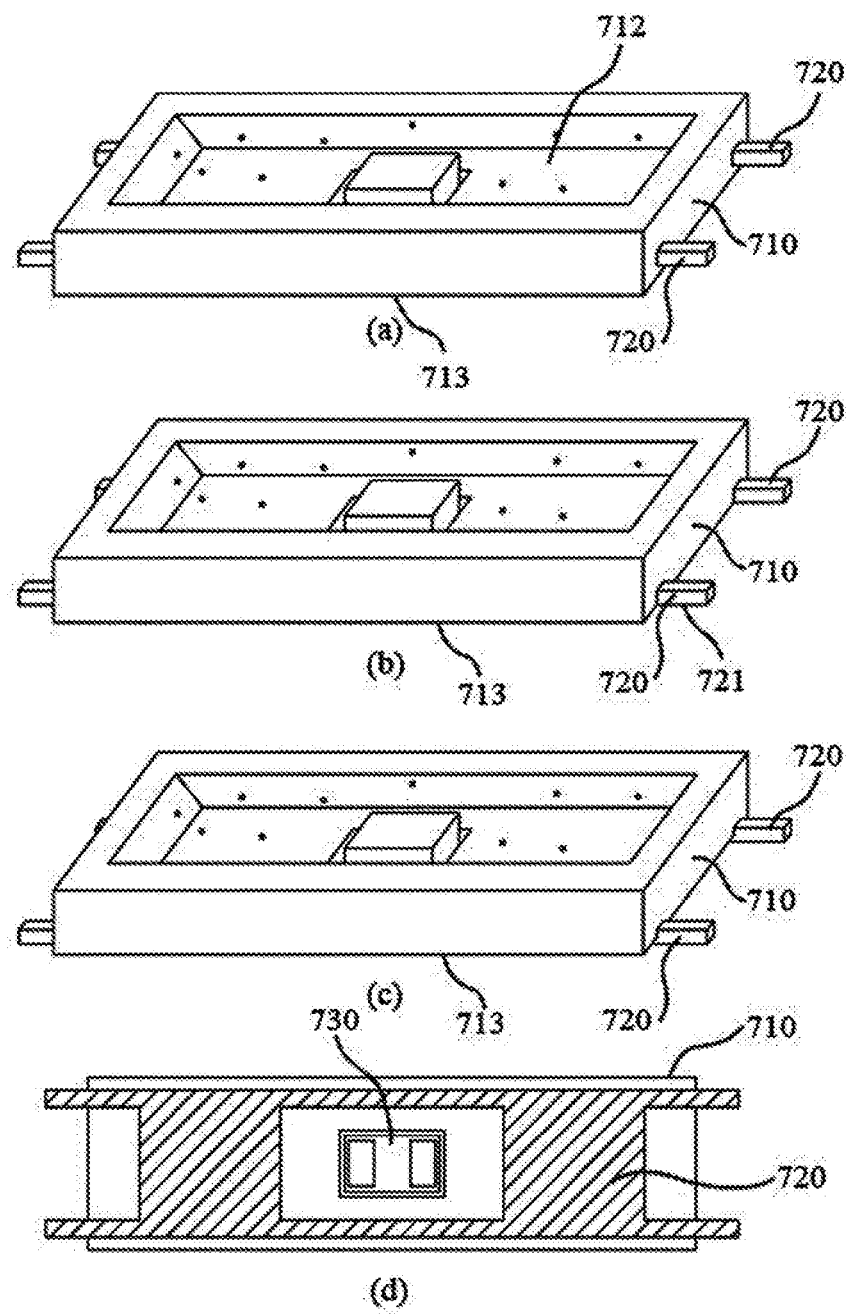
FIG. 29 shows various exemplary representations of reinforcement members in a semiconductor light emitting device according to the present disclosure.

FIG. 29 shows various exemplary representations of reinforcement members 720 in a semiconductor light emitting device according to the present disclosure. FIG. 29a to FIG. 29c are perspective views, and FIG. 29d is a bottom view.

In particular, FIG. 29a to FIG. 29c illustrate various exemplary representations of the reinforcement members 720 which are arranged differently between the upper face 712 and the lower face 713 of the bottom part 712 of the body 710. That is, the reinforcement members 720 in FIG. 29a are completely inserted into the body 710. The reinforcement members 720 in FIG. 29b are arranged such that lower faces 721 thereof are at the same level with the lower face 713 of the bottom part of the body 710. The reinforcement members 720 in FIG. 29c are partly projected from the lower face 713 of the bottom part of the body 710. Further, the reinforcement members 720 in FIG. 29d are formed in both the longitudinal and vertical directions of the body 710, which are different from the reinforcement members 720 formed in only the longitudinal direction of the body 710 as shown in FIG. 28a. It turned out that a warpage of the body 710 or a crack of the body 710 due to the warpage can be resolved by arranging the reinforcement members 720 as wide as possible without overlapping with the hole of the body 710.

Figure 30:
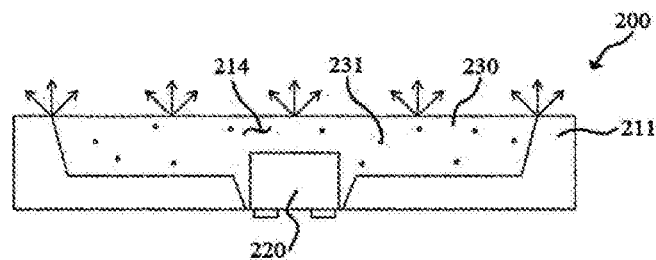
FIG. 30 shows lights leaving a semiconductor light emitting device according to the present disclosure.

FIG. 30 shows lights leaving a semiconductor light emitting device 200 according to the present disclosure.

The semiconductor light emitting device 200 includes an encapsulating member 230 in a cavity 214. In this embodiment, light coming out of a semiconductor light emitting device chip 220 travels through the encapsulating member 230 and escapes from the semiconductor light emitting device 200. A portion of the light from the semiconductor light emitting device chip 220 is either reflected by a side wall 211 in the cavity 214, or takes a different path by a wavelength converting material 231 (if present) in the encapsulating member 230. Accordingly, the light escaping from the semiconductor light emitting device 200 will not be reflected due to the absence of the side wall 211, but spread to the front and sides of the semiconductor light emitting device 200 as in FIG. 30.

Figure 31:
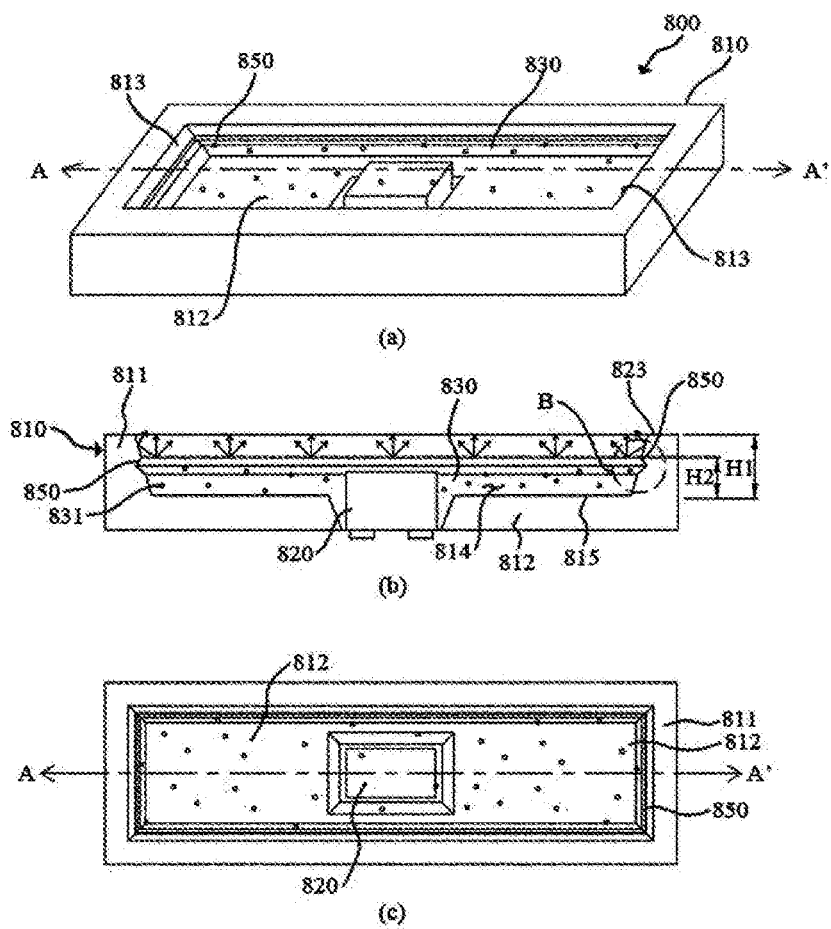
FIG. 31 shows a further exemplary embodiment of a semiconductor light emitting device according to the present disclosure.

FIG. 31 shows a further exemplary embodiment of a semiconductor light emitting device 800 according to the present disclosure.

FIG. 31a is a perspective view, FIG. 31b is a cross-sectional view taken along line AA', and FIG. 31c is a top view.

The semiconductor light emitting device 800 has at least one groove 850 in a side wall 811 of a body 810. An encapsulating member 830 is filled up to the grooves 850. With the exception of the grooves 850, the semiconductor light emitting device 800 has the same configurational features as the semiconductor light emitting device 200 in FIG. 4. At least one of the grooves 850 is formed above a semiconductor light emitting device chip 820 on the side wall 811. The grooves 850 can be formed along the side wall 811 to be in parallel with a bottom part 812. The side wall 811 has an upper face 823.

The encapsulating member 830 is filled up to the groove 850, which serve as a retention to ensure that the encapsulating member 830 does not overflow. Light coming out of the semiconductor light emitting device chip 820 travels through the encapsulating member 830 and escapes from the semiconductor light emitting device 800. After traveling through the encapsulating member 830, a portion of the light inside a cavity 814 collides against the side wall and is reflected from it. As a result, the light coming out of the semiconductor light emitting device 800 will be narrower than the light escaping from the semiconductor light emitting device 800 through reflection from the side wall 811.

Preferably, the grooves 850 in the side wall 811 are arrange above the semiconductor light emitting device chip 820 and below the upper face 823 of the side wall 811. If a distance between the upper face 823 of the side wall 811 and the groove 850 are small, it is less likely to have a narrow emission angle of light. Therefore, a height H2 from the upper face 815 of the bottom part 812 to the groove 850 preferably equals to half of a height H1 from the upper face 815 of the bottom part 812 to the upper face 823 of the side wall 811. For example, if the height H1 from the upper face 815 of the bottom part 812 to the upper face 823 of the side wall 811 is 0.55 mm, the height H2 from the upper face 815 of the bottom part 812 to the groove 850 may be 0.25 mm. With a given height and width for the semiconductor light emitting device, a smaller ratio of the height H2 reaching the grooves 850 to the height H1 of the side wall 811 preferably results in a narrower emission angle of light out of the device; a larger ratio of the height H2 reaching the groove 850 to the height H1 of the side wall 811 results in a wider emission angle of light out of the device.

Figure 32:
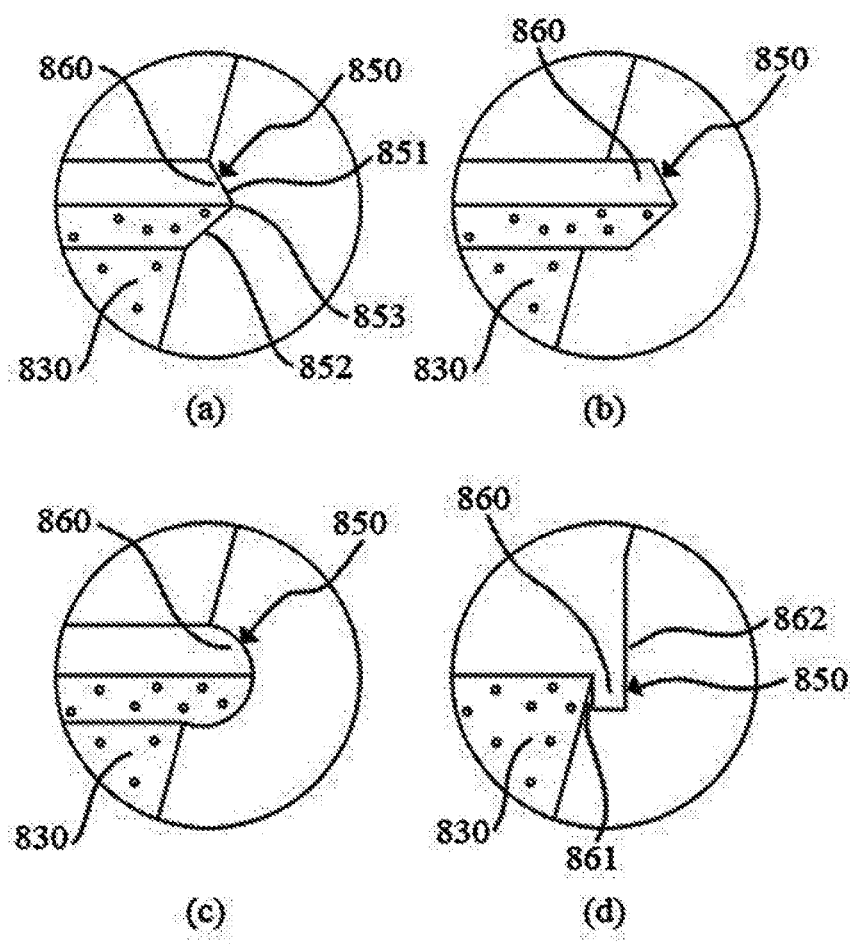
FIG. 32 shows exemplary representations of the internal space of a groove in the semiconductor light emitting device of FIG. 31.

FIG. 32 shows exemplary representations of the internal space of the groove in the semiconductor light emitting device of FIG. 31. FIG. 32 is an enlarged view of B in FIG. 31b, illustrating various examples.

FIG. 32a, FIG. 32b, FIG. 32c, and FIG. 32d are cross-sectional views of the groove 850. The groove 850 has an internal space 860, which is partly filled with an encapsulating member 830. In FIG. 32a, the groove 850 has the internal space 860 defined by a top face 851 and a bottom face 852, and the top face 851 and the bottom face 852 meet and form a vertex 853. The internal space 860 is defined as it is surrounded by the top face 851 and the bottom face 852. The encapsulating member 830 is then filled in this internal space 860, preferably until it reaches the vertex 853. In FIG. 32b, the internal space 860 has a different shape. Further, in FIG. 32c, the vertex 853 is omitted from the groove 850. Alternatively, the groove 850 may be formed as illustrated in FIG. 32d, where the groove 850 has the internal space 860 surrounded by a first wall 861 and a second wall 862, and the encapsulating member 830 is filled until it reaches the top of the first wall 861. In this example, though, it is recommended not to fill the internal space 860 with the encapsulating member 830 because surface tension of the encapsulating member 830 filled up to the top of the first wall 861 will prevent the inflow of the encapsulating member 830 to the internal space 860.

Figure 33:
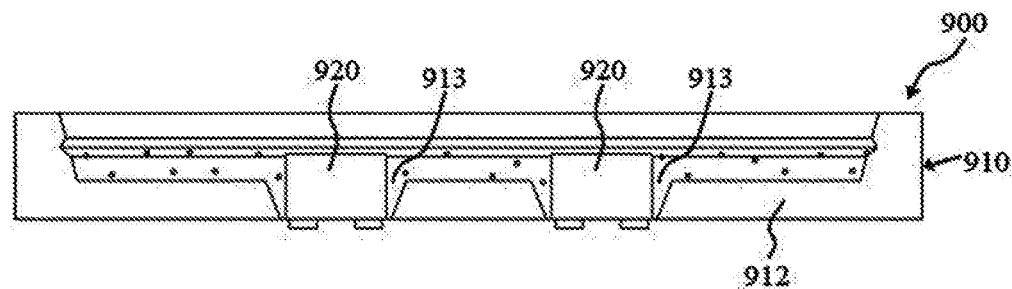
FIG. 33 shows a further exemplary embodiment of a semiconductor light emitting device according to the present disclosure.

FIG. 33 shows a further exemplary embodiment of a semiconductor light emitting device 900 according to the present disclosure.

The semiconductor light emitting device 900 has a plurality of holes 913 in a bottom part 912 of a body 910, and semiconductor light emitting device chips 920 are placed in the holes 913, respectively. With the exception of the plurality of holes 913 and the semiconductor light emitting device chips 920 being placed in the holes 913, respectively, the semiconductor light emitting device 900 has the same configurational features as the semiconductor light emitting device 800 of FIG. 31. While two holes 913 are illustrated in FIG. 33, more than two holes can be present. Moreover, the semiconductor light emitting device chips 920 to be placed in respective holes 913 may emit lights of different colors.

Figure 34:
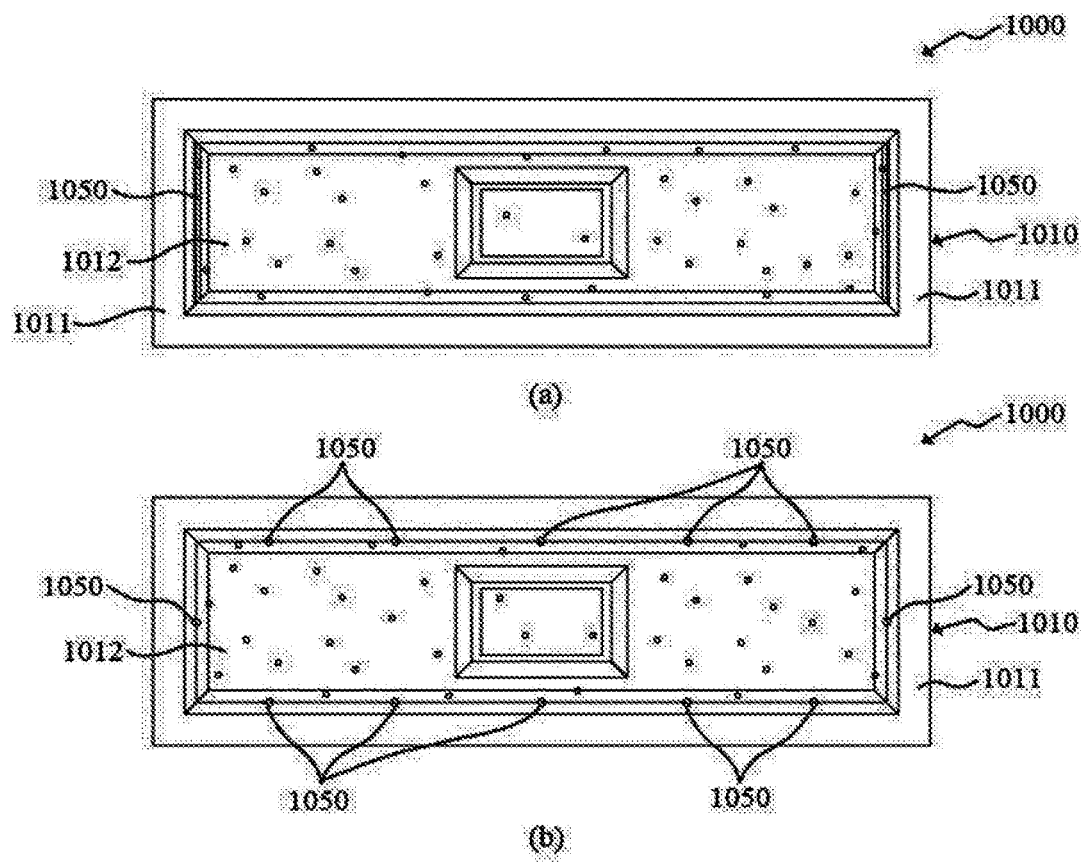
FIG. 34 shows a further exemplary embodiment of a semiconductor light emitting device according to the present disclosure.

FIG. 34 shows a further exemplary embodiment of a semiconductor light emitting device 1000 according to the present disclosure.

The semiconductor light emitting device 1000 in FIG. 34a has a plurality of grooves 1050 in a side wall 1011 of a body 1010, and the plurality of grooves 1050 is designed to face each other. The body 1010 includes a bottom part 1012 having a longer direction and a shorter direction, and the plurality of grooves is formed, facing each other in the shorter direction of the bottom part 1012 of the body 1010. Although not shown, the plurality of grooves 1050 may also be formed, facing each other in the longer direction of the bottom part 1012 of the body 1010. Referring next to FIG. 34b, the semiconductor light emitting device 1000 has a plurality of grooves 1050 in the size wall 1011 of the body 1010, and the plurality of grooves 1050 is arranged at regular intervals between them. The plurality of grooves 1050 is formed along the side wall 1011 to be in parallel with the bottom part 1012. Although not shown, at least one of the grooves 1050 may be formed at irregular intervals between them. With the exception of the configurational features described above in relation to FIG. 34, the semiconductor light emitting device 1000 is substantially the same as the semiconductor light emitting device 800 of FIG. 31.

Figure 35:
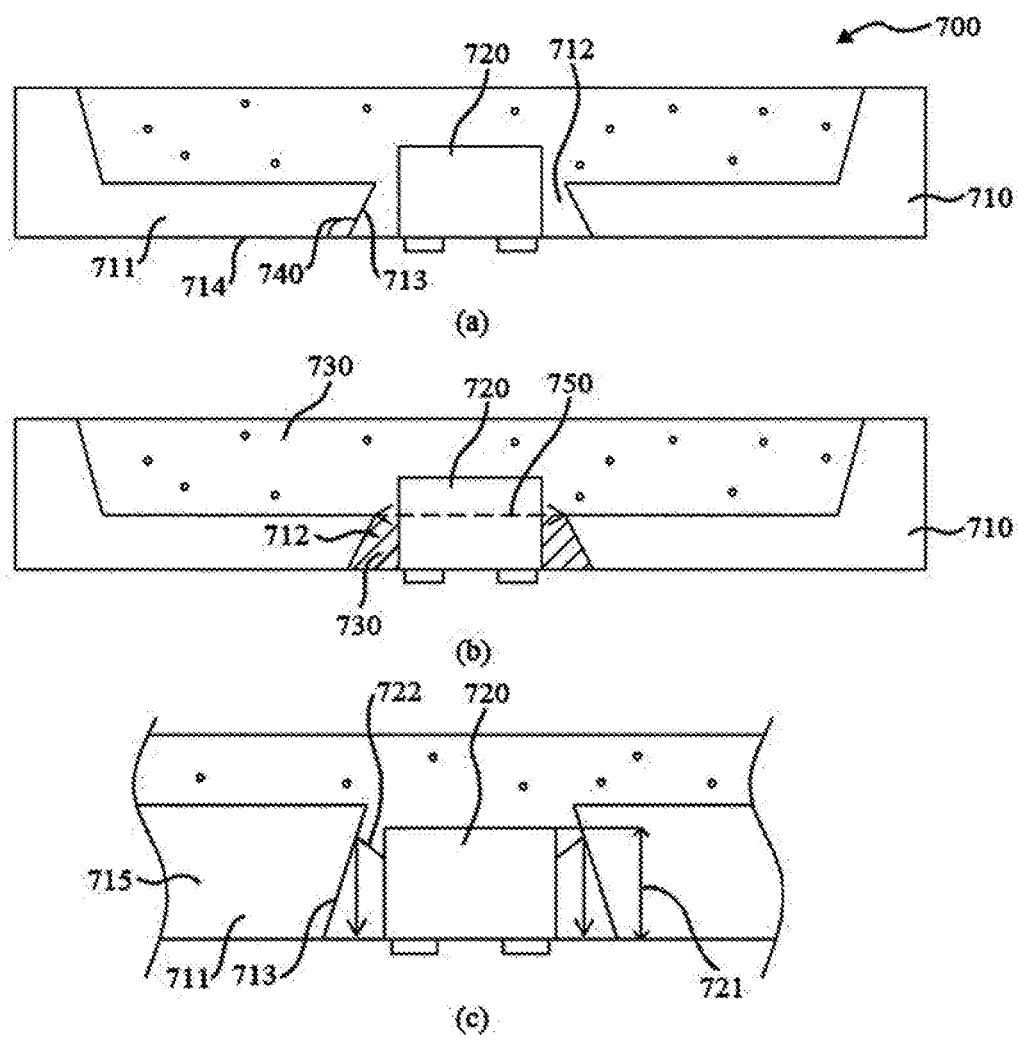
FIG. 35 shows a further exemplary embodiment of a semiconductor light emitting device according to the present disclosure.

FIG. 35 shows a further exemplary embodiment of a semiconductor light emitting device 700 according to the present disclosure.

In the semiconductor light emitting device 700, an inner face 713 of a bottom part 711 of a body 710 forms an obtuse angle 740 with a lower face 714 of the bottom part 711. In such case, as shown in FIG. 35b, an upper opening (indicated by dotted lines) of the hole 712 has a width 750 that is smaller than a width of an encapsulating member portion 730 (indicated by a shaded region) out of the entire encapsulating member 730 filled in the hole 712, such that the encapsulating member 730 may not be separated from the body 710 and at the same time, a semiconductor light emitting device chip 720 covered with and bonded to the encapsulating member 730 may not be separated from the body 710. However, if a height 715 of the bottom part 711 is greater than a height 721 of the semiconductor light emitting device chip 720 as shown in FIG. 35c, light 722 coming out of the semiconductor light emitting device chip 720 is reflected from the inner face 713 of the bottom part 711, and this would possibly decrease the extraction efficiency of light escaping upwards. Therefore, it is desirable that the height 715 of the bottom part 711 is less than the height 721 of the semiconductor light emitting device chip 720. With the exception of the configurational features described above in relation to FIG. 35, the semiconductor light emitting device 700 is substantially the same as the semiconductor light emitting device 200 of FIG. 4.

Figure 36:
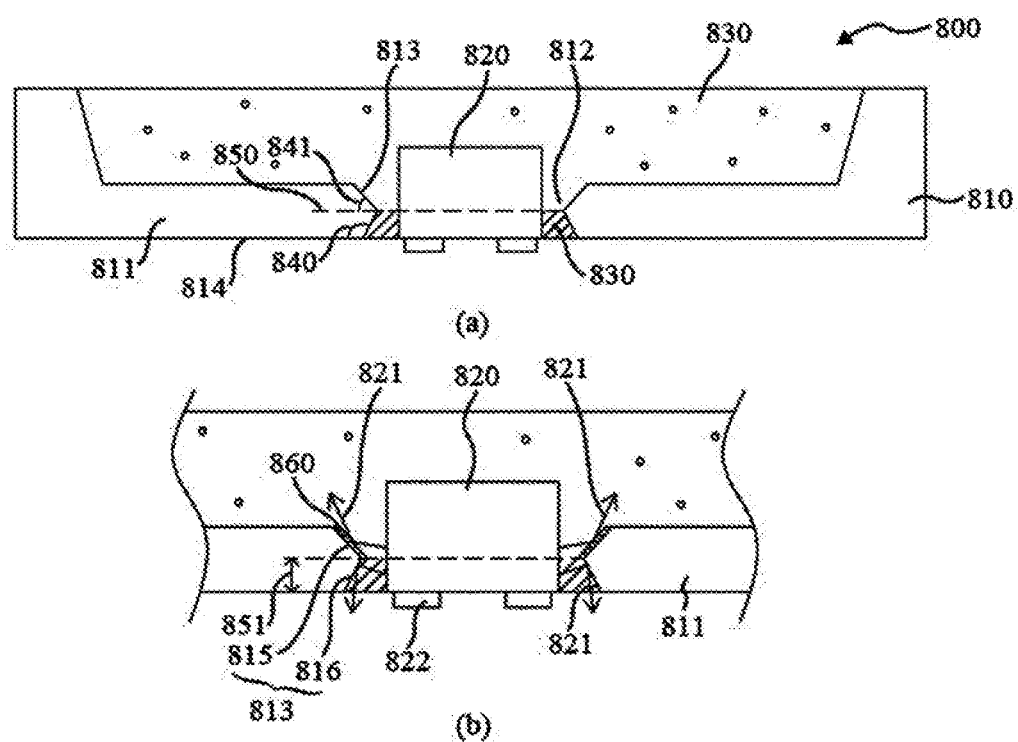
FIG. 36 shows a further exemplary embodiment of a semiconductor light emitting device according to the present disclosure.

FIG. 36 shows a further exemplary embodiment of a semiconductor light emitting device 800 according to the present disclosure.

In the semiconductor light emitting device 800, a hole 812—defining inner face 813 of a bottom part 811 of a body 810 forms a first angle of inclination 840 with a lower face 814 of the bottom part 811, and a second angle of inclination 841 with an imaginary plane 850 in parallel to the lower face 814 of the bottom part 811, where the first angle inclination 840 is an obtuse angle, and the second angle of inclination 841 is an acute angle. Optionally, the second angle of inclination 841 can be 90°. Previously, FIG. 35c described a problem that can occur when the inner face 713 of the bottom part 711 forms only an obtuse angle (the first angle of inclination). In order to resolve the problem, in FIG. 35, the bottom part 711 was designed to have a height less than the height of the semiconductor light emitting device chip 720. However, since lowering the height of the bottom part is associated with reducing the thickness of the bottom part, this can be led to a reduced hardness of the bottom part. Referring back to FIG. 36, however, the bottom part 811 not only has a uniform thickness, but it also forms the first angle of inclination 840 between the inner face 813 of the bottom part 811 and the lower face 814 of the bottom part and the second angle of inclination 841 between the inner face 813 of the bottom part 811 with the imaginary plane 850 in parallel to the lower face 814 of the bottom part 811, to prevent separation of the semiconductor light emitting device chip 820 from the body 810, where the first angle inclination 840 is an obtuse angle, and the second angle of inclination 841 is an acute angle. Referring to FIG. 36b, which is an enlarged view of a portion of the FIG. 36a, a region 816 where the inner face 813 of the bottom part 811 forms the first angle of inclination 840 ensures that the semiconductor light emitting device chip 820 would not be separated from the body 810, and a region 815 where the inner face 813 of the bottom part 811 forms the second angle of inclination 841 allows upward extraction of the light 821 coming out of the semiconductor light emitting device chip 820. That is, a smaller region 816 of the inner face 813 of the bottom part 811, with the first angle of inclination 840 impeding the upward escape of the light 821 coming out of the semiconductor light emitting device 820 is more advantageous for increasing the extraction efficiency of light escaping upwards. As such, a height 851 at the turning point where the first angle of inclination 840 changes to the second angle of inclination 841 is preferably less than the height of the semiconductor light emitting device chip 820, and in fact, the lower the height, the better. However, the height 851 at the turning point where the first angle of inclination 840 changes to the second angle of inclination 841 should preferably be at least 10 μm to prevent separation of the semiconductor light emitting device chip 820 from the body 810. In addition, considering that the inner face 813 of the bottom part 811 is divided into the region with the first angle of inclination 816 and the region with the second angle of inclination 815, if the latter includes a metal reflective layer 860, an electrical short can be prevented by virtue of a sufficient gap between the semiconductor light emitting device chip 820 and an electrode 822. With the exception of the configurational features described above in relation to FIG. 36, the semiconductor light emitting device 800 is substantially the same as the semiconductor light emitting device 700 of FIG. 35.

Figure 37:
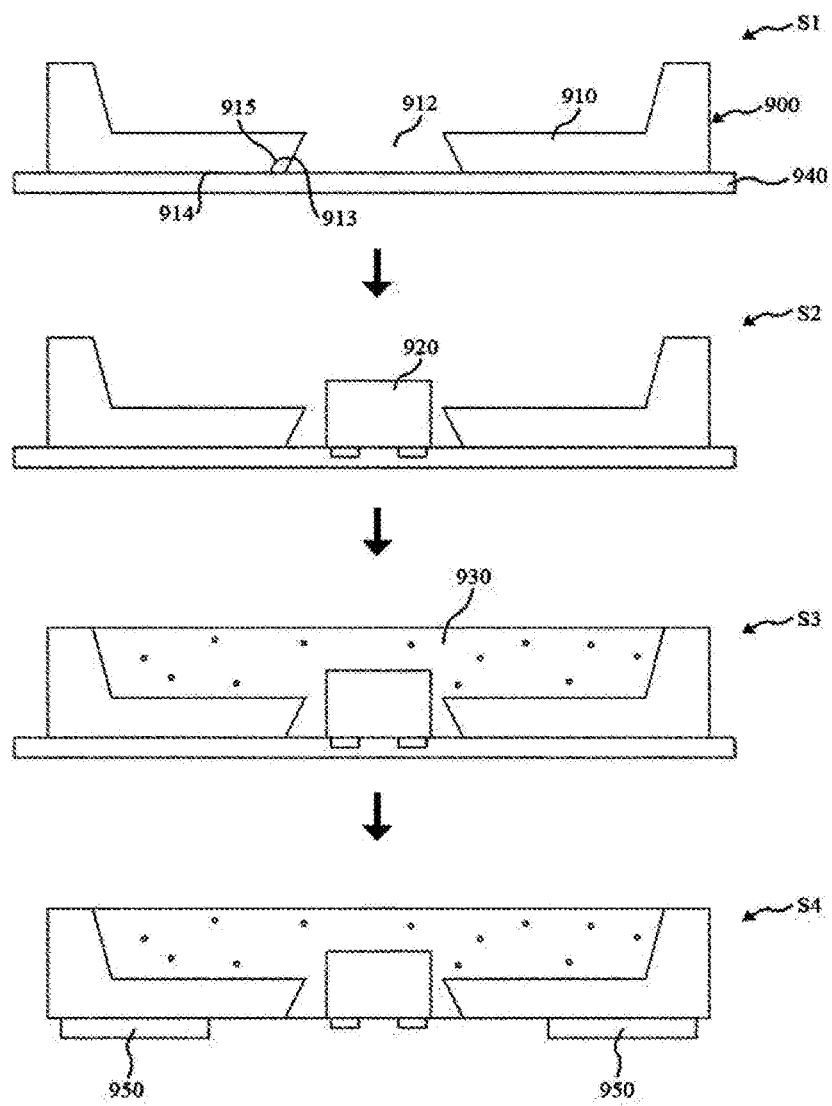
FIG. 37 shows an exemplary embodiment of a method of manufacturing the semiconductor light emitting device of FIG. 35.

FIG. 37 shows an exemplary embodiment of a method of manufacturing the semiconductor light emitting device of FIG. 35.

First, a body 900 having a hole 912 in a bottom part 910 is prepared (S1). The body 900 can be obtained by injection molding. In particular, the body 900 is prepared in such a way that a first angle of inclination 915 (obtuse angle) is formed between a hole 912—defining inner face 913 of the bottom part 910 and a lower face 914 of the bottom part 910. Although not shown, the body is also prepared in such a way that a second angle of inclination (acute angle) is formed between the hole 912—defining inner face 913 of the bottom part 910 and an imaginary plane in parallel with the lower face 914 of the bottom part 910. A semiconductor light emitting device chip 920 is then placed (S2). Next, semiconductor light emitting device chip 920 is then covered with an encapsulating member 930 to fix the chip 920 to the body 900 (S3). Before the semiconductor light emitting device chip 920 is fixed with the encapsulating member 930, it may be immobilized by a temporary fixing plate 940. Any normal adhesive tape may be used for the temporary fixing plate 940. For example, blue tapes may be used. This temporary fixing plate 940 (if present) is then removed, and an adhesive part 950 is created (S4). Instead of the adhesive part 950, a reinforcement member (not shown) may optionally be formed. As the reinforcement member is arranged between the upper face and the lower face of the bottom part of the body, it can be inserted during the preparation of the body. The order of the steps of manufacturing the semiconductor light emitting device according to the present disclosure is within the scope of the present disclosure, given that it can be easily modified by those skilled in the art.

Figure 38:
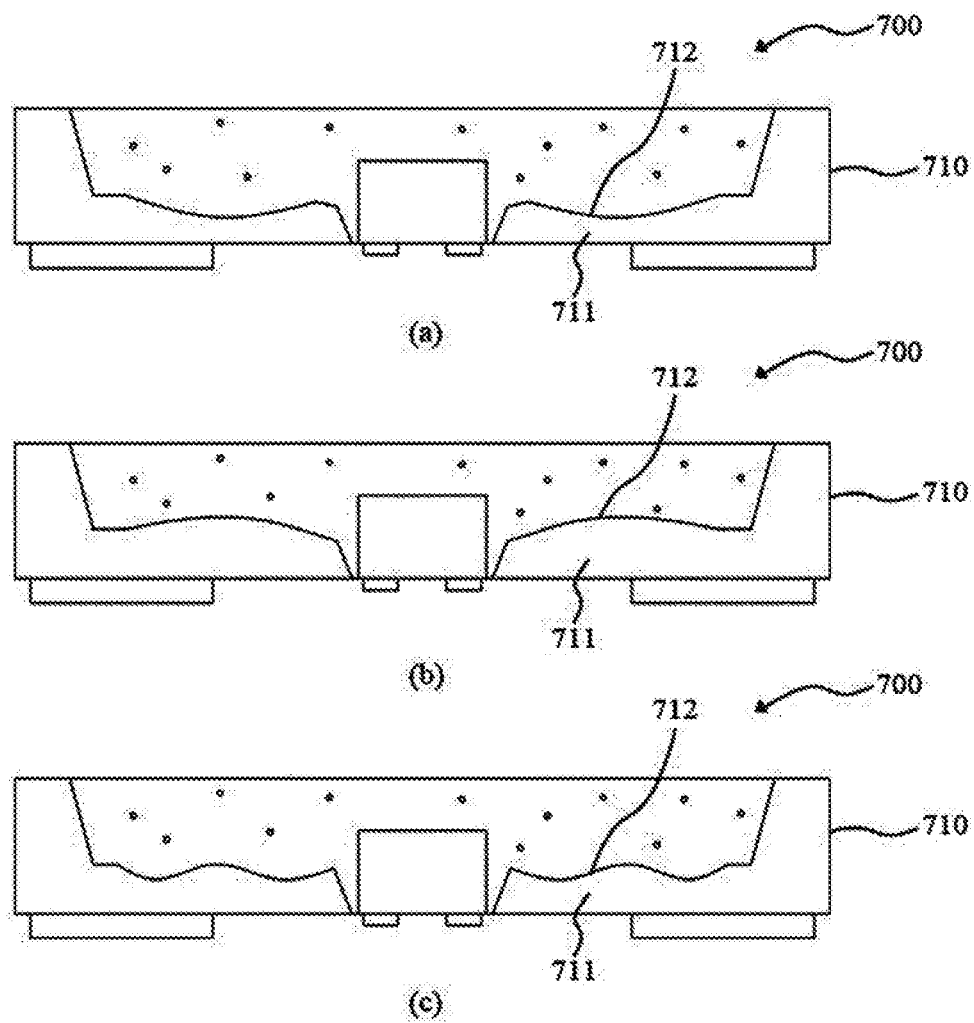
FIG. 38 shows a further exemplary embodiment of a semiconductor light emitting device according to the present disclosure.

FIG. 38 shows a further exemplary embodiment of a semiconductor light emitting device according to the present disclosure.

The semiconductor light emitting device 700 includes a bottom part 711 of which upper face 712 has at least one of concave or convex portions. That is, the upper face 9712 of the bottom part 711 of the body 710 is characterized by having concave portions as shown in FIG. 38a, convex portions as shown in FIG. 38b, or a combination of alternating concave and convex portions as shown in FIG. 39c. When the upper face of the bottom part has at least one of concave or convex portions, the efficiency of light extraction of the semiconductor light emitting device 700 can be increased. The reasons behind such an increase in the efficiency of light extraction will be described in reference to FIG. 40 below. The other configurational features not mentioned here in relation to FIG. 38 are the same as those of the semiconductor light emitting device 300 of FIG. 5.

Figure 39:
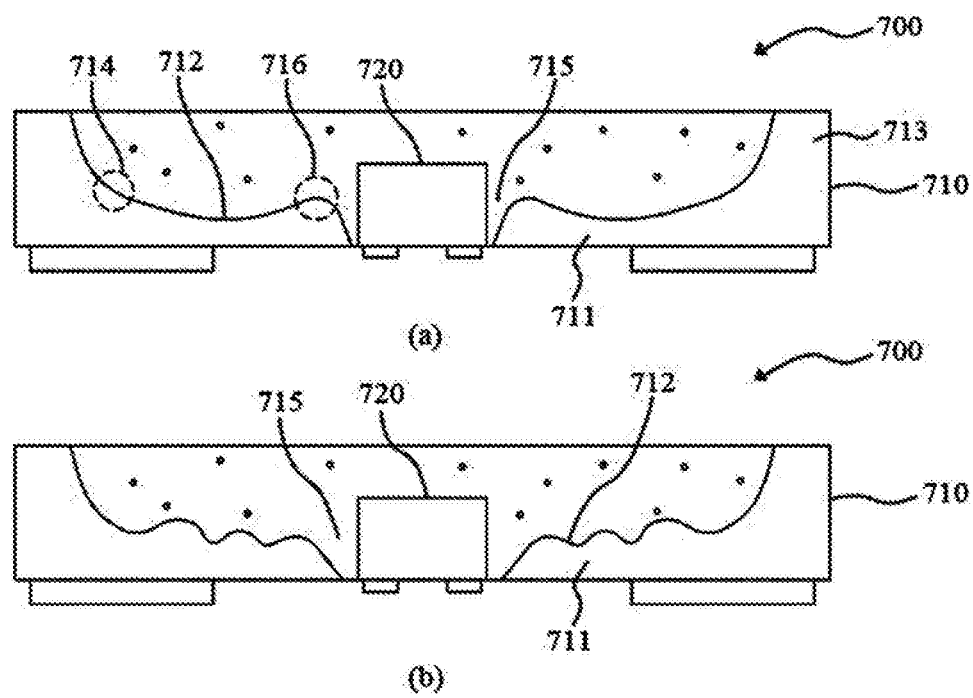
FIG. 39 shows different exemplary representations of the upper face of the bottom part of a semiconductor light emitting device according to the present disclosure.

FIG. 39 shows different exemplary representations of the upper face of the bottom part of a semiconductor light emitting device 700 according to the present disclosure.

Referring to FIG. 39a, a region 714 where the concave portion of the upper face 712 of the bottom part 711 of the body 710 adjoins the side wall 713 of the body 710 is not flat, but curved. In addition, a region 716 where the concave portion of the upper face 712 of the bottom part 711 of the body 710 adjoins the hole 715 of the body 710 is not flat, but curved. Because these joining regions 714, 716 are not, but curved, the efficiency of light extraction can be increased. Referring next to FIG. 39b, the upper face 712 of the bottom part 711 of the body 710 can have a plurality of concave portions, whose sizes get smaller towards the semiconductor light emitting device chip 720. Generally, the efficiency of light extraction increases with larger concave portions. Therefore, the semiconductor light emitting device 700 can have uniform emission of light in overall by arranging smaller concave portions closer to the semiconductor light emitting device chip 720 and larger concave portions farther from the semiconductor light emitting device chip 720. Although not shown in FIG. 39a and FIG. 39b, convex portions may optionally be used in place of the concave portions, yet the same effect can be achieved.

Figure 40:
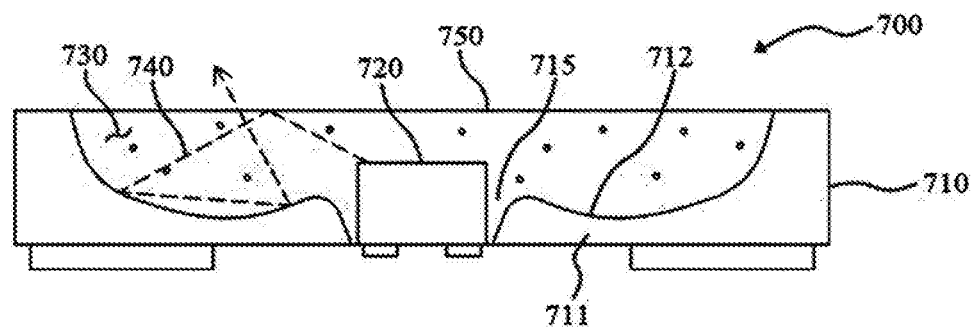
FIG. 40 shows an exemplary representation for describing principles of increased light extraction when the upper face of the bottom part of a semiconductor light emitting device according to the present disclosure has at least one of concave or convex portions.

FIG. 40 shows an exemplary representation for describing principles of increased light extraction when the upper face of the bottom part of the semiconductor light emitting device 700 according to the present disclosure has at least one of concave or convex portions.

Light 740 emitted from the semiconductor light emitting device chip 720 of the semiconductor light emitting device 700 is reflected at a boundary plane 750 between the encapsulating member 730 and the outside, due to a difference in reflectance. This reflected light 740 is then reflected from the concave portion of the upper face 712 of the bottom part 711 of the body 710 as indicated by dotted lines, and escapes from the semiconductor light emitting device 700. In other words, if the upper face 712 of the bottom part 711 were flat, the light could have been entrapped within the semiconductor light emitting device 700; however, with at least one of concave or convex portions on the upper face 712 of the bottom part 711, the light can safely escape from the semiconductor light emitting device 700, and the efficiency of light extraction can be increased accordingly. Preferably, the upper face 712 of the bottom part 711 should have concave portions in order to obtain an even higher efficiency of light extraction.

Figure 41:
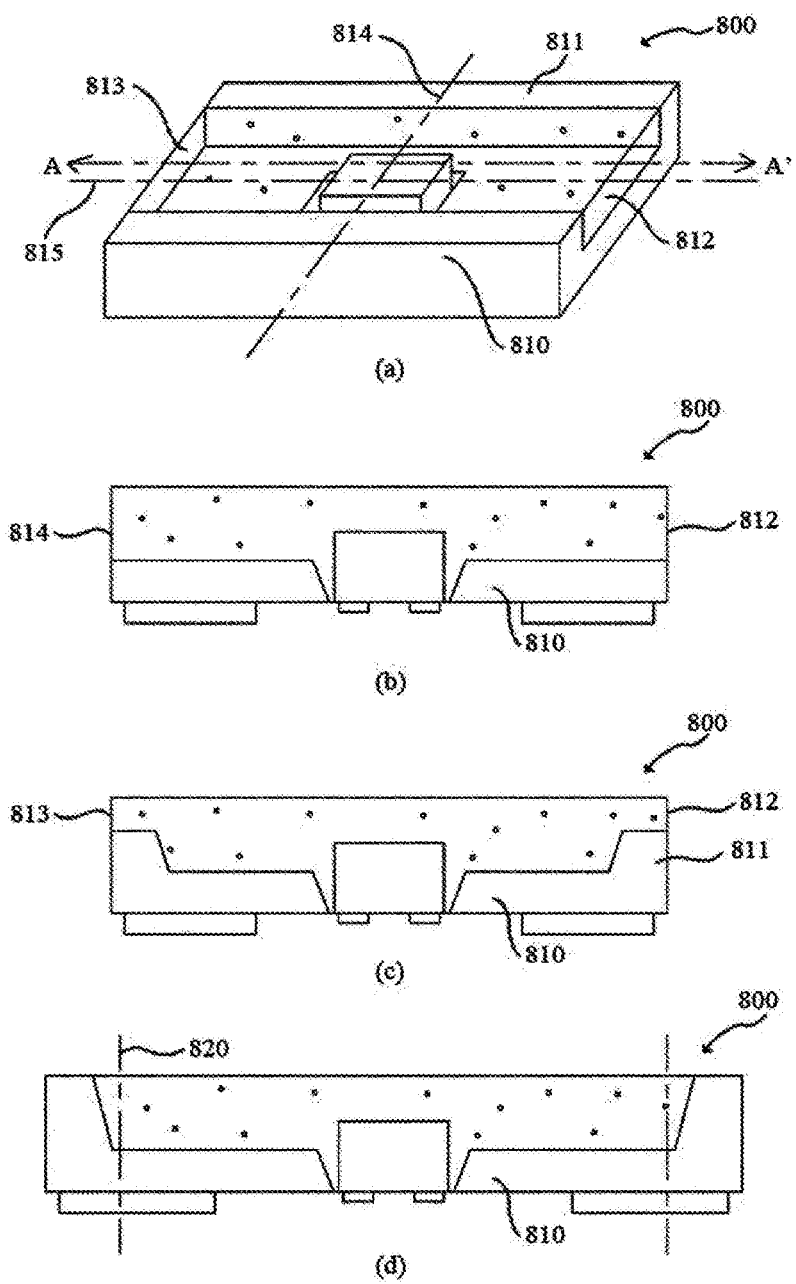
FIG. 41 shows a further exemplary embodiment of a semiconductor light emitting device according to the present disclosure.

FIG. 41 shows a further exemplary embodiment of a semiconductor light emitting device 800 according to the present disclosure. FIG. 41a is a perspective view, FIG. 41b is a cross-sectional view taken along line AA', FIG. 41c is a cross-sectional view showing another exemplary embodiment corresponding to FIG. 41b, and FIG. 41d is a cross-sectional view describing a manufacturing method of the device.

The semiconductor light emitting device 800 includes a body 810 that has a side wall 811 with two open sections 812, 813. These two open sections 812, 813 face each other. In particular, if the body 810 has a shorter direction 814 and a longer direction 815, the two open sections 812, 813 should preferably be arranged to face each other in the longer direction 815 of the body 810. As light can be emitted through the upper side as well as through the open sections 812, 813 of the semiconductor light emitting device 800, 3-side emission is achieved. Moreover, referring to FIG. 41c, the side wall 811 of the open sections 812, 813 are not completely removed, and the remaining side wall leftovers are used to control angle or intensity of the light for side emission of the semiconductor light emitting device 800. The semiconductor light emitting device 800 is then obtained by cutting along the cutting line 820 shown in FIG. 41d after step S4 (see FIG. 45). The other configurational features not mentioned here in relation to FIG. 41 are the same as those of the semiconductor light emitting device 300 of FIG. 5. Although two open sections are illustrated in FIG. 41, only one open section or more than two open sections can also be provided, if needed.

Figure 42:
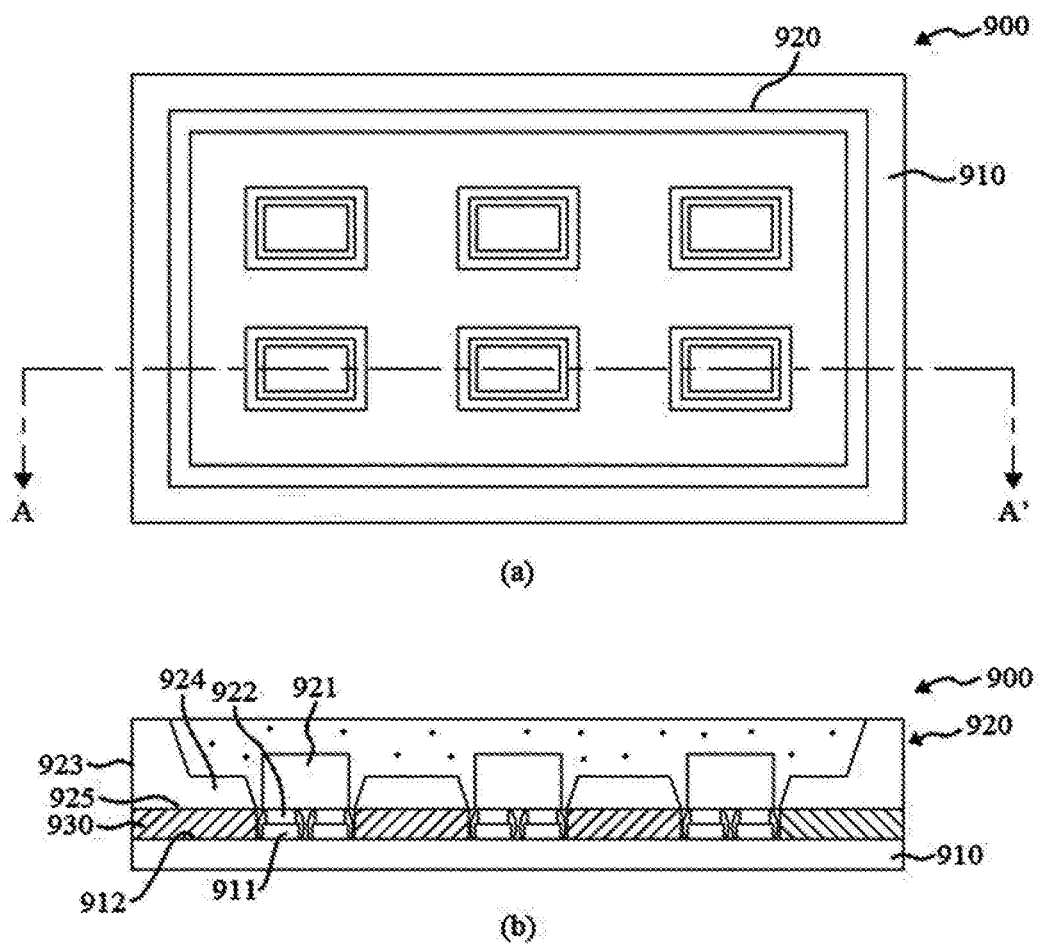
FIG. 42 shows an exemplary embodiment of a semiconductor light emitting device structure according to the present disclosure.

FIG. 42 shows an exemplary embodiment of a semiconductor light emitting device structure 900 according to the present disclosure. FIG. 42a is a top view, and FIG. 42b is a cross-sectional view taken along line AA'.

The semiconductor light emitting device structure 900 includes a substrate 910 and a semiconductor light emitting device 920. The substrate 910 includes, on its side, a substrate electrode 911 such as a sub-mount or a PCB, for example. The semiconductor light emitting device 920 corresponds to one of the semiconductor light emitting devices described in FIG. 4 to FIG. 41. Preferably, it is the semiconductor light emitting device having a plurality of holes as in FIG. 8. In general, semiconductor light emitting device structures having a semiconductor light emitting device chip directly mounted on the substrate are called COB (Chip On Board) type semiconductor light emitting device structures. They are disclosed in a number of documents including Korean Patent No. 10-1448164, Korean Patent Laid-Open Publication No. 10-2014-0085908, and so on. The semiconductor light emitting device structure 900 according to the present disclosure is also a COB type semiconductor light emitting device structure where an electrode 922 of a semiconductor light emitting device chip 921 is directly mounted on the substrate electrode 911. The electrode 922 of the semiconductor light emitting device chip 921 may be mounted on the substrate electrode 911 by any method including eutectic bonding, soldering or the like. Among others, soldering is used for the embodiment shown in FIG. 42. Moreover, an adhesive layer 930 may be provided between a lower face 925 of a bottom part 924 of the semiconductor light emitting device 920 and an upper face 912 of the substrate 910 such that the semiconductor light emitting device 920 and the substrate 910 can be bonded together. For convenience of description, the adhesive layer 930 shown in FIG. 42 looks rather thick, but it is as thin as 10 μm. If the bottom part 924 takes only a small portion of the area of the semiconductor light emitting device chip 921, the adhesive layer 930 may not be used for bonding the semiconductor light emitting device 920 and the substrate 910 because they can be bonded together simply through bonding between the electrode 922 of the semiconductor light emitting device chip 921 and the substrate electrode 911. In the semiconductor light emitting device 920 of FIG. 42, the semiconductor light emitting device chip 921 is a flip-chip type chip, and only six of them are illustrated. The type and number of semiconductor light emitting device chips may vary, if needed. Further, the shape of the semiconductor light emitting device chips is rectangular as seen on the top view in FIG. 42*a*, but it is not limited thereto and can optionally be circular.

Figure 43:
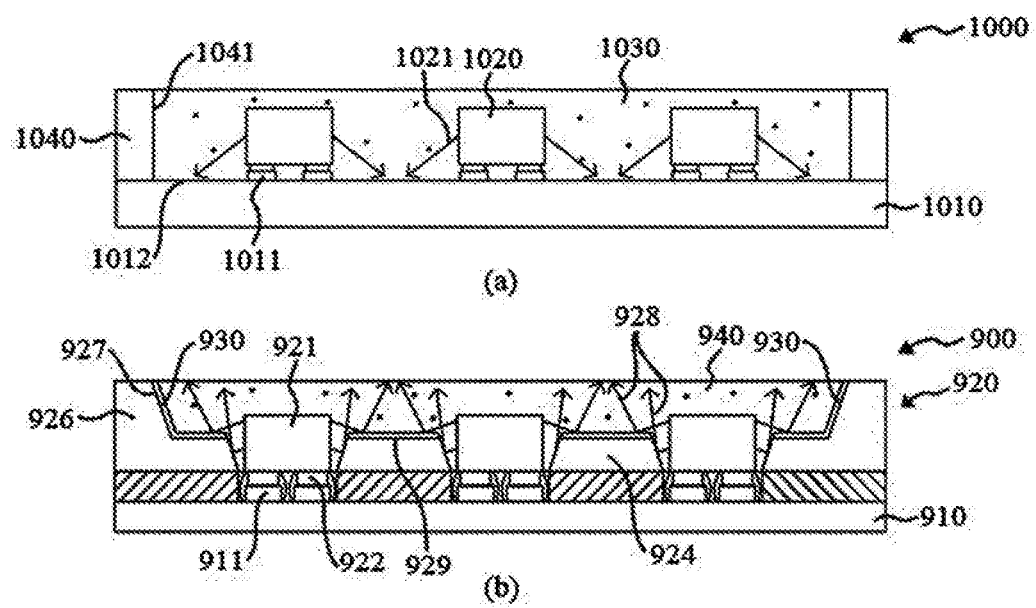
FIG. 43 shows an exemplary representation of advantages of the semiconductor light emitting device structure in FIG. 42.

FIG. 43 shows an exemplary representation of advantages of the semiconductor light emitting device structure in FIG. 42.

In particular, FIG. 43*a* shows a conventional COB type semiconductor light emitting device structure 1000, in which semiconductor light emitting device chips 1020 are mounted on substrate electrodes 1011 of a substrate 1010, and the semiconductor light emitting device chips 1020 are covered with an encapsulating member 1030. A wall 1040 is can be formed before or after the semiconductor light emitting device chips 1020 are mounted on the substrate 1010. In case of this conventional COB type semiconductor light emitting device structure 1000, however, the semiconductor light emitting device chips 1020 are mounted separately on the substrate 1010. As such, it takes relatively a large amount of time to mount the chips, and a portion of the light coming out of the semiconductor light emitting device chip is absorbed by an upper face 1012 of the substrate 1010, resulting in a light loss. In comparison, FIG. 43*b* shows a COB type semiconductor light emitting device structure 900 according to the present disclosure, in which a semiconductor light emitting device 920 including an encapsulating member 940 and semiconductor light emitting device chips 921 is mounted on a substrate 910, instead of mounting the semiconductor light emitting device chips 921 separately on the substrate 910 and then covering them with the encapsulating member 940 as discussed above. Although the COB type semiconductor light emitting device structure 900 having semiconductor light emitting device chips directly mounted on the substrate could be produced as an electrode 922 of the semiconductor light emitting device chip 921 placed in a corresponding hole is directly bonded with the substrate electrode 911 of the substrate 910, if the semiconductor light emitting device 900 itself contains a side wall 926 and the encapsulating member 940, then there is no need to have a separate process for forming the side wall or encapsulating member. As a result, the process time required for manufacturing a conventional COB type semiconductor light emitting device structure by mounting semiconductor light emitting device chips separately can be substantially reduced, and further, it is now possible to resolve the light loss problem in the conventional COB type semiconductor light emitting device structure because the light coming out of the semiconductor light emitting device chips 921 was partly forwarded to the substrate and reflected from the bottom part 924 before escaping upwards. In particular, if the semiconductor light emitting device 920 has the configurational features described in FIG. 7, i.e. if at least one of the inner face 929 of the side wall 926 or the upper face 929 of the bottom part 924 has a reflective layer 930, with the reflective layer 930 being formed of a metal, light reflectance can be increased. Meanwhile, if such metal reflective layers need to be formed on the upper face 1012 of the substrate 1010 and the inner face 1041 of the wall 1040 in the conventional COB type semiconductor light emitting device structure 1000, there is a risk of the occurrence of short. Besides, a metal reflective layer cannot be formed on the upper face 1012 of the substrate 1010 due to its electrical configurations. Moreover, since those conventional COB type semiconductor light emitting device structures are designed based on different, customized current—voltage properties in order to meet specific needs of customers, it was very important to hold sufficient inventories for respective COB type semiconductor light emitting structures and deliver them on time to the customers. The COB type semiconductor light emitting device structure according to the present disclosure, however, is designed in such a way that a substrate simply needs to be bonded to a corresponding semiconductor light emitting device to produce an end product. This cuts the overall manufacturing process time, allowing the manufacturer to be able to make and retain diverse types of substrates having different current—voltage properties in order to meet the needs of customers. For instance, in the prior art, COB type semiconductor light emitting device structures having different properties (e.g. A and B) used to be kept in stock separately according to properties of the structures. However, in the present disclosure, semiconductor light emitting devices are kept in stock, as these devices can be used with a substrate suitable for A properties, a substrate suitable for B properties, or a substrate suitable for both A and B properties. That is, in the prior art, if a COB type semiconductor light emitting device structure having B properties is no longer needed, inventories of the structure had to be disposed or discarded. Meanwhile, in the present disclosure, only a substrate having B properties is disposed or discarded so that the manufacturer will have less burden with inventories of high-priced semiconductor light emitting device chips.

Figure 44:
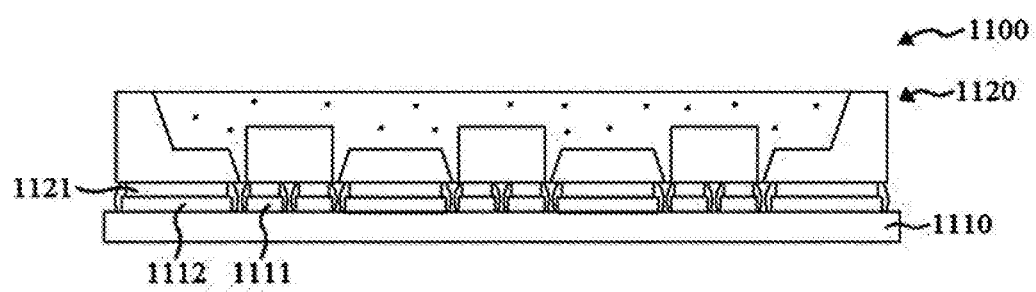
FIG. 44 shows a further exemplary embodiment of a semiconductor light emitting device structure according to the present disclosure.

FIG. 44 shows a further exemplary embodiment of a semiconductor light emitting device structure 1100 according to the present disclosure.

The semiconductor light emitting device structure 1100 includes a substrate 1110 having a substrate bonding part 1112, and a semiconductor light emitting device 1120. The semiconductor light emitting device 1120 corresponds to one of the semiconductor light emitting devices described in FIG. 4 to FIG. 41. Preferably, it is the semiconductor light emitting device 300 including a bonding part 330 at the lower face 312 of the bottom part 311 as shown in FIG. 5. With a bonding part 1121 of the semiconductor light device 1120 being bonded with the substrate bonding part 1112, the bonding strength between the semiconductor light emitting device 1120 and the substrate 1110 will be greater than the bonding strength resulted by simply using the adhesive layer 930 as in FIG. 41. A bonding method between the bonding part 1121 of the semiconductor light emitting device 1120 and the substrate bonding part 1112 will be described below with reference to FIG. 45. The substrate bonding part 1112 is preferably made of a metal, such as in the case of the bonding part of the semiconductor light emitting device described in FIG. 5. For example, the substrate bonding part 1112 may be made of one of Ag, Cu or Au. Alternatively, the substrate bonding part 1112 may be made of a combination of at least two metals, e.g. a combination of Ni and Co, a combination of Cr and Co, or a combination of Ti and Co. The substrate bonding part 1112 may be obtained in various combinations of metals and such modification should be easily realized by those skilled in the art. With the exception of the configurational features described above in relation to FIG. 44, the semiconductor light emitting device 1100 is substantially the same as the semiconductor light emitting device 900 of FIG. 42.

Figure 45:
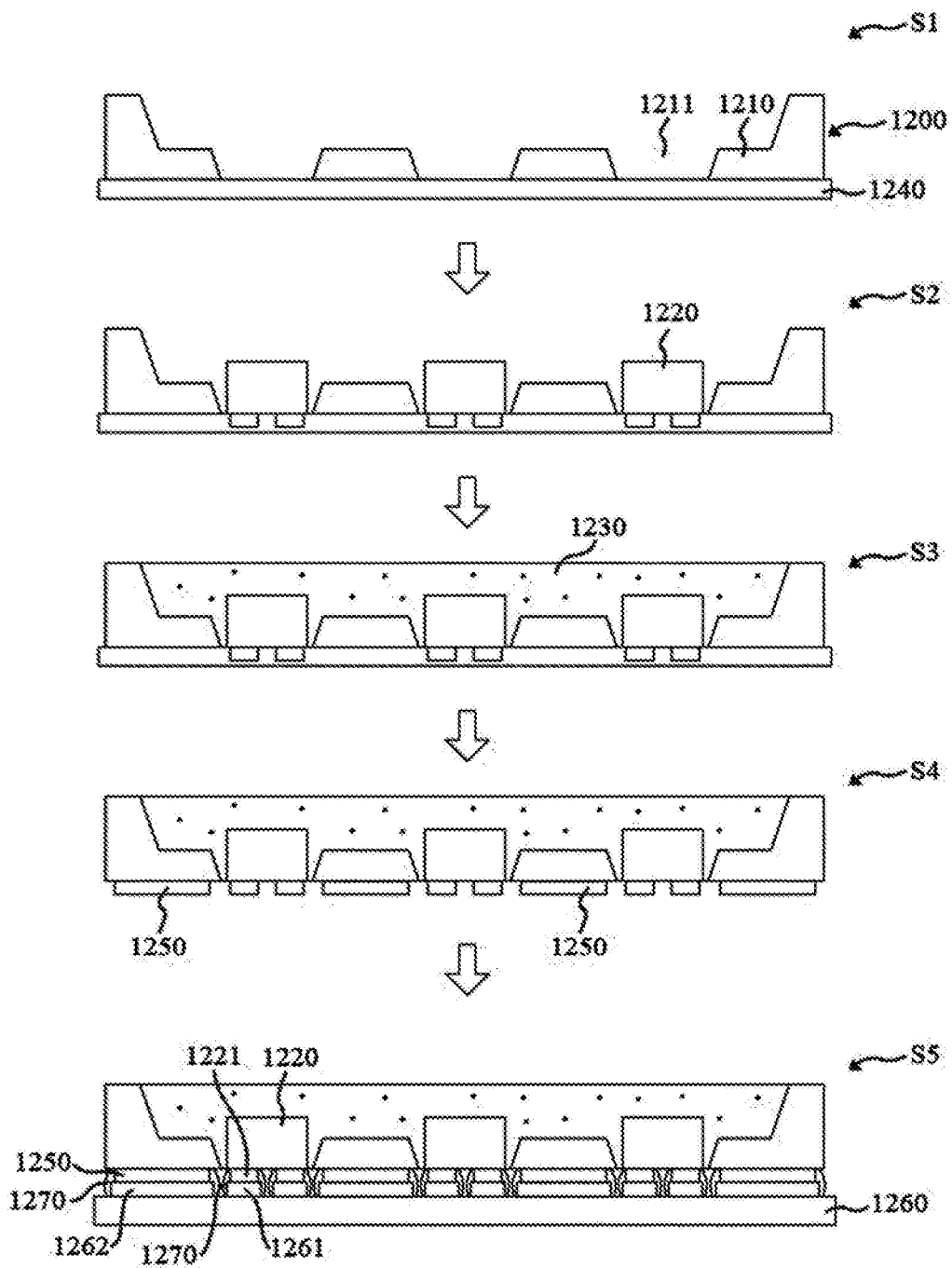
FIG. 45 shows an exemplary embodiment of a method of manufacturing a semiconductor light emitting device structure according to the present disclosure.

FIG. 45 shows an exemplary embodiment of a method of manufacturing a semiconductor light emitting device structure according to the present disclosure.

First, a body 1200 having a hole 1211 at the bottom part 1210 is prepared (S1). The body 1200 can be obtained by injection molding. A semiconductor light emitting device chip 1220 is then placed in the hole 1211 (S2). Next, the semiconductor light emitting device chip 1220 is covered with an encapsulating member 1230 to fix the chip 1220 to the body 1200 (S3). Before the semiconductor light emitting device chip 1220 is fixed with the encapsulating member 1230, it may be immobilized by a temporary fixing plate 1240. Any normal adhesive tape may be used for the temporary fixing plate 1240. For example, blue tapes may be used. This temporary fixing plate 1240 (if present) is then removed, and an adhesive part 1250 is created (S4). Instead of the adhesive part 1250, a reinforcement member (not shown) may optionally be formed. As the reinforcement member is arranged between the upper face and the lower face of the bottom part of the body, it can be inserted during the preparation of the body. Subsequently, an exposed electrode 1221 of the semiconductor light emitting device chip 1220 is bonded to a substrate electrode 1261 of the substrate 1260. Bonding between the electrode 1221 of the semiconductor light emitting device chip 1220 and the substrate electrode 1261 as well as bonding between the bonding part 1250 of the semiconductor light emitting device and the substrate bonding part 1262 may be achieved by soldering using a solder material 1270. The order of the steps of manufacturing the semiconductor light emitting device according to the present disclosure is within the scope of the present disclosure, given that it can be easily modified by those skilled in the art.

Figure 46:
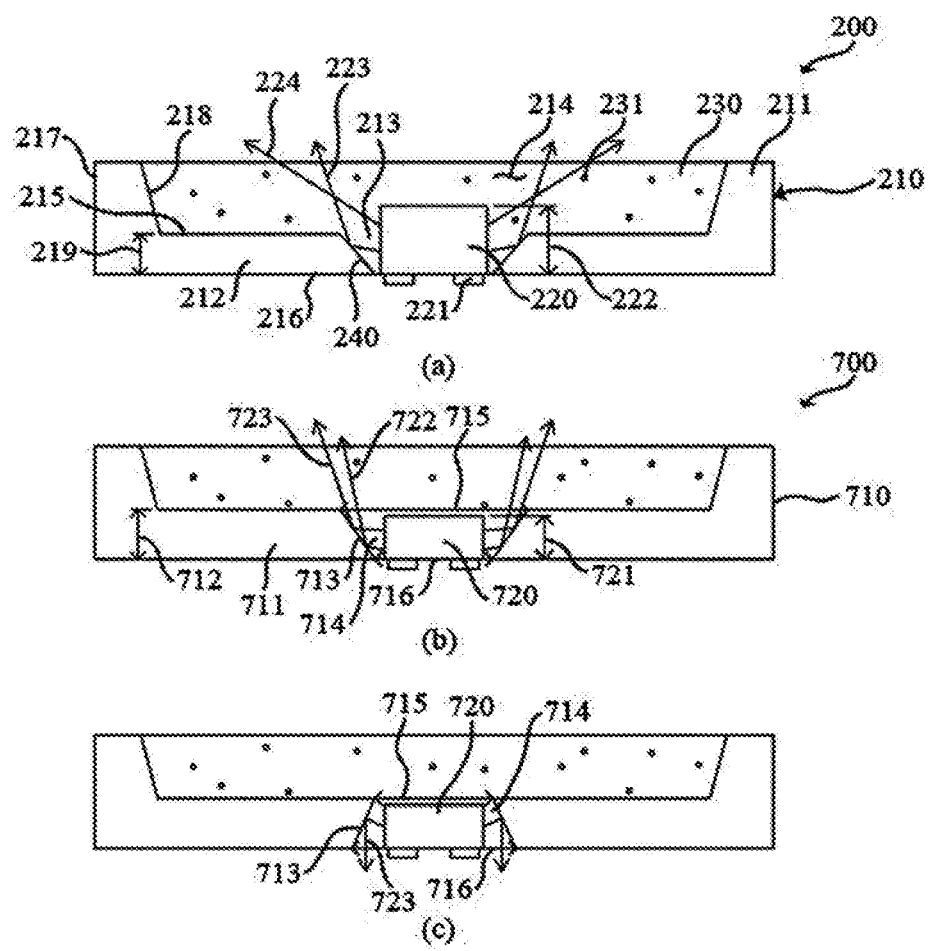
FIG. 46 shows a further exemplary embodiment of a semiconductor light emitting device according to the present disclosure.

FIG. 46 shows a further exemplary embodiment of a semiconductor light emitting device 700 according to the present disclosure.

The semiconductor light emitting device 700 is characterized in that height 712 of a bottom part 711 of a body 710 is greater than height 721 of a semiconductor light emitting device chip 720. In particular, FIG. 46a shows the semiconductor light emitting device 200 of FIG. 4, together with the paths of the lights 223, 224 coming out of the lateral faces of the semiconductor light emitting device chip 220, if the height 219 of the bottom part 212 is less than the height 222 of the semiconductor light emitting device chip 220. FIG. 46b shows the paths of the lights 722, 723 coming out of the lateral faces of the semiconductor light emitting device chip 720, if the height 712 of the bottom part 711 is greater than the height 721 of the semiconductor light emitting device chip 720. Referring back to FIG. 46a, among the lights coming out of the lateral faces of the semiconductor light emitting device chip 220, the light 223 coming out of a region at a lower level than the height 219 of the bottom part 212 is reflected from the hole 213—defining inner face 240 of the bottom part 212 and then escapes upwards; the light 224 coming out of a region higher than the height 219 of the bottom part 212 escapes straight upwards without being reflected from the hole 213—defining inner face 240 of the bottom part 212. The latter, i.e., the light 224 that escapes straight upwards without being reflected from the inner face 240 of the bottom part 212 makes it hard to control the path of the light coming out of the lateral faces of the semiconductor light emitting device chip 220. On the other hand, referring now to FIG. 46b, most of the lights 722, 723 coming out of the lateral faces of the semiconductor light emitting device chip 720 is reflected from the inner face 713 of the bottom part 711 and escapes upwards, and therefore, the paths of the lights coming out of the lateral faces of the semiconductor light emitting device chip 720 can be controlled relatively easier than those of FIG. 46a. Even though it is desirable to have the bottom part at a lower level than the height of the semiconductor light emitting device as shown in FIG. 46a for the benefit of the efficiency of light extraction in general, the opposite is preferred as shown in FIG. 46b in order to control the path of the light escaping upwards. However, it is not preferred to make the hole 714—defining inner face 713 of the bottom part 711 being slanted in a way shown in FIG. 46c that a width 715 of the upper opening of the hole 714 is greater than a width 716 of the lower opening of the hole 714, because most of the light 723 coming out of the lateral face of the semiconductor light emitting device chip 720 will not be able to escape upwards. Thus, if the height 712 of the bottom part 711 is greater than the height 721 of the semiconductor light emitting device chip 720, the hole 714—defining inner face 713 of the bottom part 711 should preferably be slanted in such a way that the width 715 of the upper opening of the hole 714 is greater than the width 716 of the lower opening. Advantages from different angles of inclination of the inner face 713 of the bottom part 711 will be described below with reference to FIG. 47. With the exception of the configurational features described above in relation to FIG. 46, the semiconductor light emitting device 700 is substantially the same as the semiconductor light emitting device 200 of FIG. 4.

Figure 47:
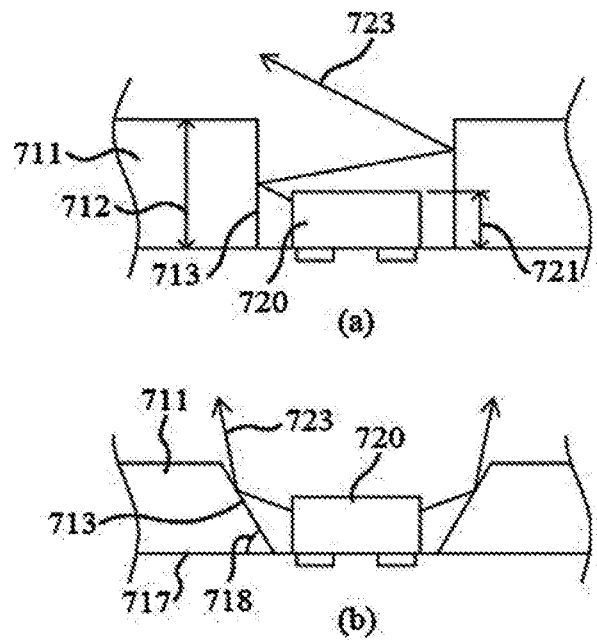
FIG. 47 shows different exemplary embodiments of the semiconductor light emitting device of FIG. 46.

FIG. 47 shows different exemplary embodiments of the semiconductor light emitting device of FIG. 46.

Making the height 712 of the bottom part 711 twice less than the height 721 of the semiconductor light emitting device chip 720 to control the path of the light 723 coming out of the lateral face of the semiconductor light emitting device chip 720 is preferred for the benefit of the efficiency of light extraction. If the height 712 is greater than twice the height 721, the light 723 coming out of the lateral face of the semiconductor light emitting device chip 720 as shown in FIG. 47a for example is reflected several times from the inner face 713 of the bottom part 711, and thus, a part of the light can be lost. Referring to FIG. 47b, an angle of inclination 718 formed between the inner face 713 of the bottom part 711 and the lower face 717 of the bottom part 711 is preferably 45° or larger. If the angle is smaller than 45°, the inner face 713 of the bottom part 711 might not be very effective for controlling the path of the light 723 coming out of the lateral face of the semiconductor light emitting device chip 720. In addition, the angle of inclination 718 between the inner face 713 of the bottom part 711 and the lower face 717 of the bottom part 711 is preferably 90° or smaller. If the angle is larger than 90°, those problems described above in FIG. 46c may occur.

Figure 48:
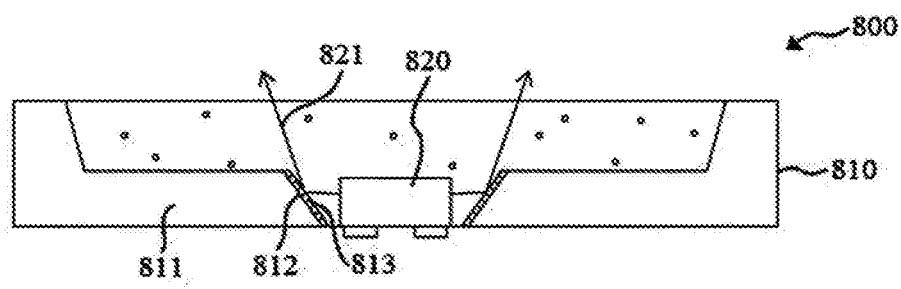
FIG. 48 shows a further exemplary embodiment of a semiconductor light emitting device according to the present disclosure.

FIG. 48 shows a further exemplary embodiment of a semiconductor light emitting device 800 according to the present disclosure.

The semiconductor light emitting device 800 can include a metal reflective layer 813 having a high reflectance in an inner face 812 of a bottom part 811 of a body 810 to effectively reflect the light coming out of the lateral face of a semiconductor light emitting device chip 820. With the exception of the configurational feature described above in relation to FIG. 48, the semiconductor light emitting device 800 is substantially the same as the semiconductor light emitting device 700 of FIG. 46.

Figure 49:
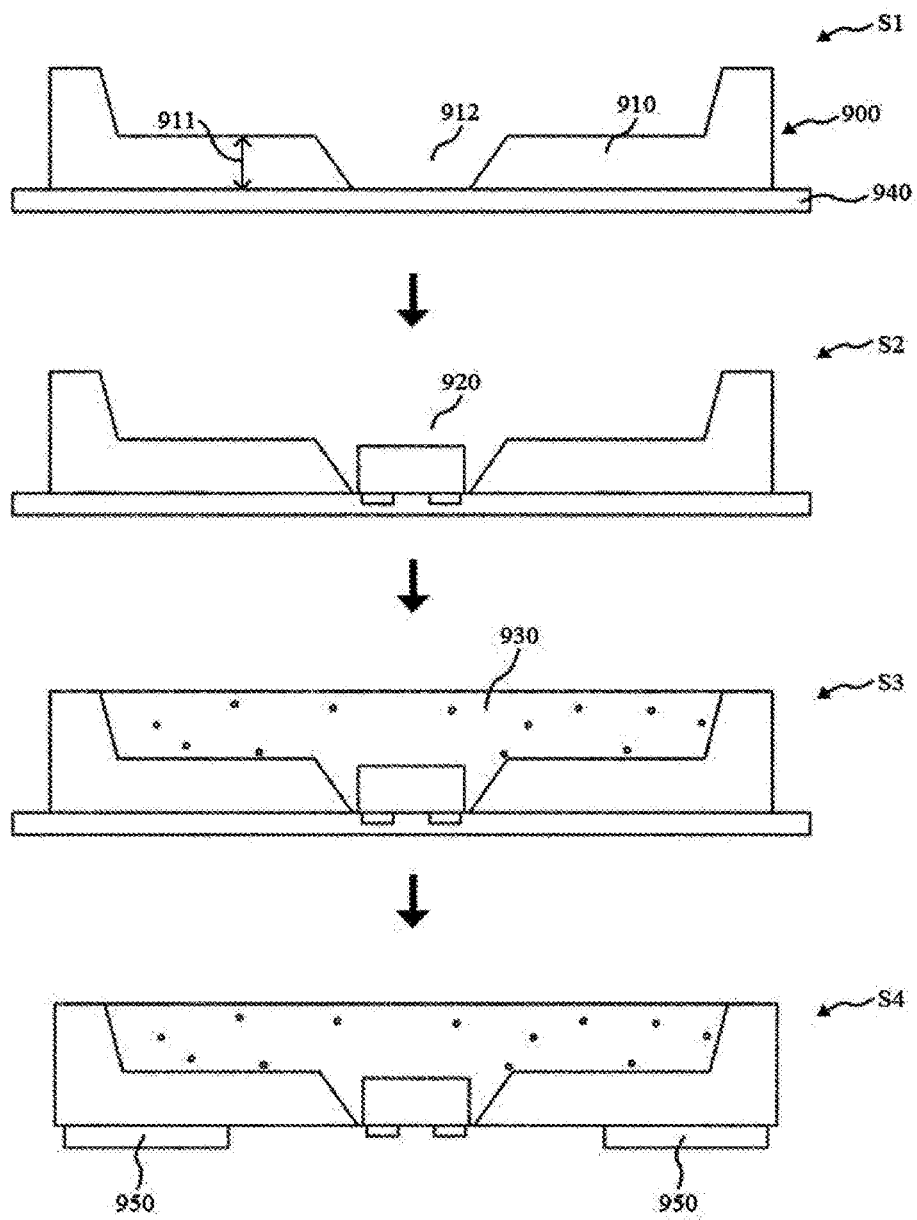
FIG. 49 shows an exemplary embodiment of a method of manufacturing the semiconductor light emitting device of FIG. 46.

FIG. 49 shows an exemplary embodiment of a method of manufacturing the semiconductor light emitting device of FIG. 46.

First, a body 900 having a hole 912 in a bottom part 910 is prepared (S1). The body 900 can be obtained by injection molding. The bottom part 910 is designed to have a height 911 greater than the height of a semiconductor light emitting device chip 920. The semiconductor light emitting device chip 920 is then placed in the hole 912 (S2). Next, the semiconductor light emitting device chip 920 is covered with an encapsulating member 930 to fix the chip 920 to the body 900 (S3). Before the semiconductor light emitting device chip 920 is fixed with the encapsulating member 930, it may be immobilized by a temporary fixing plate 940. Any normal adhesive tape may be used for the temporary fixing plate 940. For example, blue tapes may be used. This temporary fixing plate 940 (if present) is then removed, and a bonding part 950 is created (S4). Instead of the bonding part 950, a reinforcement member (not shown) may optionally be formed. As the reinforcement member is arranged between the upper face and the lower face of the bottom part of the body, it can be inserted during the preparation of the body. The order of the steps of manufacturing the semiconductor light emitting device according to the present disclosure is within the scope of the present disclosure, given that it can be easily modified by those skilled in the art.

The following describes diverse exemplary embodiments of the present disclosure.

(1) A semiconductor light emitting device characterized by comprising: a body with a bottom part having at least one hole formed therein; a semiconductor light emitting device chip to be placed in each of the at least one hole, with the semiconductor light emitting device chip being comprised of a plurality of semiconductor layers including an active layer for generating light by electron-hole recombination, and an electrode electrically connected to the plurality of semiconductor layers; and an encapsulating member for covering the semiconductor light emitting device chip, wherein a hole—defining inner face of the bottom part has a plurality of angles of inclination.

(2) The semiconductor light emitting device of (1), characterized in that the plurality of angles of inclination includes a first angle of inclination and a second angle of inclination, wherein the first angle of inclination is an angle between an inner face of the bottom part and a lower face of the bottom part, and the second angle of inclination is an angle between the inner face of the bottom part and an imaginary plane in parallel to the lower face of the bottom part.

(3) The semiconductor light emitting device of (1), characterized in that the first angle of inclination is greater than the second angle of inclination.

(4) The semiconductor light emitting device of (1), characterized in that the first angle of inclination is between 60° and 90°.

(5) The semiconductor light emitting device of (1), characterized in that the second angle of inclination is 60° or less.

(6) The semiconductor light emitting device of (1), characterized in that a turning point where the first angle of inclination changes to the second angle of inclination has a height of 50 µm or less.

(7) The semiconductor light emitting device of (1), characterized in that the electrode of the semiconductor light emitting device chip is exposed towards the lower face of the bottom part.

(8) The semiconductor light emitting device of (1), characterized in that the hole—defining inner face of the bottom part includes a flat plane between the first angle of inclination and the second angle of inclination.

(9) The semiconductor light emitting device of (1), characterized in that the body includes a side wall, and a cavity defined by the side wall and the bottom part.

(10) A semiconductor light emitting device characterized by comprising: a body with a bottom part having at least one hole formed therein; a semiconductor light emitting device chip to be placed in each of the at least one hole, with the semiconductor light emitting device chip being comprised of a plurality of semiconductor layers including an active layer for generating light by electron-hole recombination, and a first and a second electrodes electrically connected to the plurality of semiconductor layers; an encapsulating member for covering the semiconductor light emitting device chip; a first insertion electrode inserted into the body, with the first insertion electrode having a plurality of exposed surfaces exposed to outside the body; and a first connection part arranged at the lower face of the bottom part of the body, with the first connection part electrically connecting the first electrode of the semiconductor light emitting device chip to one of the plurality of exposed surfaces of the first insertion electrode.

(11) The semiconductor light emitting device of (10), characterized in that the first electrode of the semiconductor light emitting device chip is exposed towards the lower face of the bottom part and electrically connected with the first connection part.

(12) The semiconductor light emitting device of (10), characterized in that the plurality of exposed surfaces of the first insertion electrode includes a first exposed surface exposed towards the lower face of the bottom part, and a second exposed surface exposed towards the lateral face of the body.

(13) The semiconductor light emitting device of (10), characterized in that the first connection part electrically connects the first exposed surface of the first insertion electrode and the first electrode of the semiconductor light emitting device chip.

(14) The semiconductor light emitting device of (10), characterized in that the second exposed surface of the first insertion electrode is electrically connected to outside.

(15) The semiconductor light emitting device of (10), characterized by comprising: a second insertion electrode inserted into the body, with the second insertion electrode including a plurality of exposed surfaces exposed to outside the body, wherein the plurality of exposed surfaces of the first insertion electrode includes a first exposed surface exposed towards the lower face of the bottom part, and a second exposed surface exposed towards the lateral face of the body.

(16) The semiconductor light emitting device of (10), characterized in that the second exposed surface of the first insertion electrode and the second exposed surface of the second insertion electrode are exposed towards the same latera face of the body.

(17) The semiconductor light emitting device of (10), characterized by comprising: a second connection part arranged at the lower face of the bottom part of the body, with the second connection part electrically connecting the second electrode of the semiconductor light emitting device to the first exposed surface of the second insertion electrode, wherein the second electrode of the semiconductor light emitting device chip is exposed towards the lower face of the bottom part.

(18) The semiconductor light emitting device of (10), characterized by further comprising: an insulating layer positioned between the first connection part and the second connection part.

(19) The semiconductor light emitting device of (10), characterized by comprising: a second insertion electrode inserted into the body, with the second insertion electrode including a first exposed surface exposed towards the lower face of the bottom part, and a second exposed surface exposed towards the lateral face of the body; and a second connection part arranged at the lower face of the bottom part of the body, with the second connection part electrically connecting the second electrode exposed towards the bottom part of the semiconductor light emitting device chip and the first exposed surface of the second insertion electrode, wherein the first connection part electrically connects the first exposed surface of the first insertion electrode and the first electrode of the semiconductor light emitting device chip, and the second exposed surface of the first insertion electrode and the second exposed surface of the second insertion electrode are exposed towards the same lateral face of the body.

(20) A semiconductor light emitting device, characterized by comprising: a body with a bottom part having at least one hole formed therein; a semiconductor light emitting device chip to be placed in each of the at least one hole, with the semiconductor light emitting device chip being comprised of a plurality of semiconductor layers including an active layer for generating light by electron-hole recombination, and a first and a second electrodes electrically connected to the plurality of semiconductor layers; an encapsulating member for covering the semiconductor light emitting device chip; and a first conductive part arranged at a lower face of the bottom part of the body, with the first conductive part being electrically connected to the first electrode of the semiconductor light emitting device chip and being at a distance of 10 μm or less from at least one edge of the lower face of the bottom part of the body.

(21) The semiconductor light emitting device of (20), characterized in that the first electrode of the semiconductor light emitting device chip is exposed towards the lower face of the bottom part.

(22) The semiconductor light emitting device of (20), characterized in that the first conductive part abuts against at least one of the edges of the lower face of the bottom part of the body.

(23) The semiconductor light emitting device of (20), characterized by comprising: a first insertion part inserted into the body, with the first insertion part including an exposed surface exposed to outside the body.

(24) The semiconductor light emitting device of (20), characterized in that the exposed face of the first insertion part is formed on a lateral face that shares an edge of the lower face of the bottom part of the body at a distance 10 μm or less from the first conductive part.

(25) The semiconductor light emitting device of (20), characterized by comprising: a second insertion part inserted into the body, with the second insertion part including an exposed surface exposed to outside the body, wherein the exposed surface of the second insertion part is formed on a lateral face of the body where the exposed face of the first insertion part is formed, and the exposed face of the first insertion part and the exposed face of the second insertion part keep a distance therebetween.

(26) The semiconductor light emitting device of (20), characterized by comprising: a second conductive part arranged at the lower face of the bottom part of the body, with the second conductive part being electrically connected to the second electrode of the semiconductor light emitting device chip and being at a distance of 10 μm or less from at least one edge of the lower face of the bottom part of the body.

(27) The semiconductor light emitting device of (20), characterized in that the edge of the lower face of the bottom part of the body at a distance of 10 μm or less from the second conductive part corresponds to the edge of the lower face of the bottom part of the body at a distance of 10 μm or less from the first conductive part.

(28) The semiconductor light emitting device of (20), characterized by comprising: an insulating layer positioned between the first connection part and the second connection part.

(29) The semiconductor light emitting device of (20), characterized in that a distance between the first conductive part and the second conductive part is not uniform.

(30) The semiconductor light emitting device of (20), characterized in that the distance between the first conductive part and the second conductive part is largest at the edge of the lower face of the bottom part of the body at a distance of 10 μm or less from the first conductive part.

(31) A semiconductor light emitting device, characterized by comprising: a bottom part having a hole; a semiconductor light emitting device chip to be placed in the hole, with the semiconductor light emitting device chip being comprised of a plurality of semiconductor layers including an active layer for generating light by electron-hole recombination, and an electrode electrically connected to the plurality of semiconductor layers; and an encapsulating member for covering the bottom part and the semiconductor light emitting device chip, wherein the electrode of the semiconductor light emitting device chip is exposed towards the lower face of the bottom part.

(32) The semiconductor light emitting device of (31), characterized in that the bottom part has a height less than the height of the semiconductor light emitting device chip.

(33) The semiconductor light emitting device of (31), characterized in that the semiconductor light emitting device chip emits light to five sides.

(34) The semiconductor light emitting device of (31), characterized in that the bottom part has an upper face including alternating concave and convex portions.

(35) The semiconductor light emitting device of (31), characterized in that the bottom part includes a reflective layer all over the upper face thereof.

(36) The semiconductor light emitting device of (31), characterized in that the reflective layer is a metal reflective layer.

(37) The semiconductor light emitting device of (31), characterized in that a hole—defining lateral face of the bottom part is slanted such that the hole is larger on the upper portion and smaller at the lower portion.

(38) The semiconductor light emitting device of (31), characterized in that an insulating encapsulating member is filled between the hole—defining lateral face of the bottom part and the semiconductor light emitting device chip.

(39) A method for manufacturing a semiconductor light emitting device, comprising the steps of: (S1) preparing a body including a bottom part with a hole formed therein; (S2) placing the semiconductor light emitting device chip into the hole of the bottom part in such a way that an electrode of the semiconductor light emitting device chip is exposed towards a lower face of the bottom part; (S3) covering the bottom part and the semiconductor light emitting device chip with an encapsulating member; and (S4) cutting the body to obtain a semiconductor light emitting device comprised of the bottom part, the semiconductor light emitting device chip and the encapsulating member.

(40) The method for manufacturing a semiconductor light emitting device of (39), characterized in that in step S1, the body is prepared such that the bottom part of the boy has a height less than the height of the semiconductor light emitting device chip.

(41) The method for manufacturing a semiconductor light emitting device of (39), characterized in that in step S1, a plurality of holes is formed in the bottom part, and in step S2, the semiconductor light emitting device chip is placed in each of the plurality of holes in the bottom part.

(42) A semiconductor light emitting device, characterized by comprising: a body including a bottom part, a side wall, and a cavity defined by the bottom part and the side wall, wherein at least one groove is formed in the side wall, and at least one hole is formed in the bottom part; a semiconductor light emitting device chip to be placed in each of the at least one hole, with the semiconductor light emitting device chip being comprised of a plurality of semiconductor layers including an active layer for generating light by electron-hole recombination, and an electrode electrically connected to the plurality of semiconductor layers; and an encapsulating member arranged at least in the cavity, with the encapsulating member being filled up to the groove of the side wall to cover the semiconductor light emitting device chip, wherein the electrode of the semiconductor light emitting device chip is exposed towards the lower face of the bottom part of the body.

(43) The semiconductor light emitting device of (42), characterized in that a plurality grooves is formed in the side wall, facing each other.

(44) The semiconductor light emitting device of (42), characterized in that the bottom part of the body has a longer direction and a shorter direction, and the plurality of grooves is formed, facing each other in the longer direction of the bottom part of the body.

(45) The semiconductor light emitting device of (42), characterized in that the bottom part of the body has a longer direction and a shorter direction, and the plurality of grooves is formed, facing each other in the shorter direction of the bottom part of the body.

(46) The semiconductor light emitting device of (42), characterized in that at least one of the grooves in the side wall is arranged above the semiconductor light emitting device chip.

(47) The semiconductor light emitting device of (42), characterized in that a height from the bottom part to the groove is less than a height from the bottom part to an upper face of the side wall.

(48) The semiconductor light emitting device of (42), characterized in that the height from the bottom part to the groove equals to half of the height from the bottom part to the upper face of the side wall.

(49) The semiconductor light emitting device of (42), characterized in that the at least one groove forms an internal space, and only a part of the internal space is filled with the encapsulating member.

(50) The semiconductor light emitting device of (42), characterized in that the at least one groove is formed along the side wall and in parallel to the bottom part.

(51) The semiconductor light emitting device of (42), characterized in that the plurality of grooves is formed in the side wall at regular intervals.

(52) A semiconductor light emitting device, characterized by comprising: a body with a bottom part having at least one hole formed therein; a semiconductor light emitting device chip to be placed in each of the at least one hole, with the semiconductor light emitting device chip being comprised of a plurality of semiconductor layers including an active layer for generating light by electron-hole recombination, and an electrode electrically connected to the plurality of semiconductor layers; and an encapsulating member for covering the semiconductor light emitting device chip, wherein a hole— defining inner face of the bottom part forms a first angle of inclination with a lower face of the bottom part, with the first angle of inclination being an obtuse angle.

(53) The semiconductor light emitting device of (53), characterized in that the hole—defining inner face of the bottom part has only the first angle of inclination between lower and upper faces of the bottom part.

(54) The semiconductor light emitting device of (53), characterized in that the hole—defining inner face of the bottom part forms a second angle of inclination with an imaginary plane in parallel to the lower face of the bottom part, with the second angle of inclination being an acute angle.

(55) The semiconductor light emitting device of (53), characterized in that a turning point where the first angle of inclination changes to the second angle of inclination has a height less than a height of the semiconductor light emitting device chip.

(56) The semiconductor light emitting device of (53), characterized in that a metal reflective layer is included in a region having the second angle of inclination out of the hole—defining inner face of the bottom part.

(57) A semiconductor light emitting device structure, characterized by comprising: a substrate including a substrate electrode; and a semiconductor light emitting device mounted on the substrate, with the semiconductor light emitting device including: a body with a bottom part having at least one hole formed therein; a semiconductor light emitting device chip to be placed in each of the at least one hole, with the semiconductor light emitting device chip being comprised of a plurality of semiconductor layers including an active layer for generating light by electron-hole recombination, and an electrode electrically connected to the plurality of semiconductor layers; and an encapsulating member for covering the semiconductor light emitting device chip, wherein the electrode of the semiconductor light emitting device chip is directly mounted on the substrate electrode.

(58) The semiconductor light emitting device structure of (57), characterized in that the substrate further includes a substrate bonding part around the substrate electrode, and the semiconductor light emitting device further includes a bonding part on a lower face of the bottom part, wherein the bonding part of the semiconductor light emitting device is bonded with the bonding part of the substrate bonding part of the substrate.

(59) The semiconductor light emitting device structure of (57), characterized in that a side wall of the semiconductor light emitting device has at least one open section.

(60) The semiconductor light emitting device structure of (57), characterized in that the side wall of the semiconductor light emitting device has two open sections arranged to face each other.

(61) A semiconductor light emitting device, characterized by comprising: a body with a bottom part having at least one hole formed therein; a semiconductor light emitting device chip to be placed in each of the at least one hole, with the semiconductor light emitting device chip being comprised of a plurality of semiconductor layers including an active layer for generating light by electron-hole recombination, and an electrode electrically connected to the plurality of semiconductor layers; and an encapsulating member for covering the semiconductor light emitting device chip, wherein the bottom part has a height greater than a height of the semiconductor light emitting device chip.

(62) The semiconductor light emitting device of (61), characterized in that a hole—defining inner face of the bottom part is slanted in such a way that a width of an upper opening of the hole is greater than a width of a lower opening of the hole.

(63) The semiconductor light emitting device of (61), characterized in that the inner face of the bottom parts and the lower face of the bottom part form an angle of inclination between 45° and 90°.

(64) The semiconductor light emitting device of (61), characterized in that the hole—defining inner face of the bottom part is vertically disposed such that the width of the upper opening of the hole equals to the width of the lower opening of the hole.

(65) The semiconductor light emitting device of (61), characterized in that the width of the upper opening of the hole is greater than the width of the semiconductor light emitting device chip.

(66) The semiconductor light emitting device of (61), characterized in that the height of the bottom part is twice less than the height of the semiconductor light emitting device chip.

(67) The semiconductor light emitting device of (61), characterized in that the hole—defining inner face of the bottom part includes a metal reflective layer.

The semiconductor light emitting device according to the present disclosure features the electrode of the semiconductor light emitting device chip boding directly bonded to an external substrate.

Moreover, in the semiconductor light emitting device using a flip chip according to the present disclosure, no bonding between lead frames and the flip chip is required for avoiding any loss in the light intensity from the flip chip caused by bonding between the lead frames and the flip chip used.

The semiconductor light emitting device according to the present disclosure features an increased extraction efficiency of light coming out of the semiconductor light emitting device chip.

In addition, the present disclosure facilitates the manufacture of a semiconductor light emitting device for side emission.

The CSP type semiconductor light emitting device that can be obtained by the present disclosure features an increased light extraction efficiency by reducing a light loss that occurs during mounting of the CSP type semiconductor light emitting device onto an external substrate by soldering.

The semiconductor light emitting device according to the present disclosure features the encapsulating member filled up to the grooves formed in the side wall.

The semiconductor light emitting device according to the present disclosure features the emission angle of light controllable by the length of the side wall.

The semiconductor light emitting device according to the present disclosure features an effective control of the angle of light leaving the semiconductor light emitting device, given a height limit on the side wall of the semiconductor light emitting device.

The semiconductor light emitting device according to the present disclosure is designed to prevent separation of the semiconductor light emitting device chip from the body.

The COB type semiconductor light emitting device structure according to the present disclosure features a reduced light loss in the substrate after the light has come out of the semiconductor light emitting device chip.

According to the present disclosure, the path of the light coming out of the semiconductor light emitting device chip can be controlled.

What is claimed is:

1. A semiconductor light emitting device comprising:
   a body with a side wall and a bottom part having at least one hole formed therein, the bottom part having an upper face and a lower face, and a height defined between the lower face and the upper face;
   a semiconductor light emitting device chip placed in each of the at least one hole(s), with the semiconductor light emitting device chip comprising a plurality of semiconductor layers including an active layer for generating light by electron-hole recombination, and an electrode electrically connected to the plurality of semiconductor layers, the semiconductor light emitting device chip having a height, the height of the semiconductor light emitting device chip being higher than the height of the bottom part; and
   an encapsulating member positioned in a cavity defined by the side wall and the bottom part for covering the semiconductor light emitting device chip, the encapsulating member positioned on the upper face of the bottom part,
   wherein the side wall defining the cavity is a smooth surface, wherein the hole defining an inner face of the bottom part has a plurality of angles of inclination, the inner face of the bottom part extending from the upper face of the bottom part to the lower face of the bottom part,
   wherein the plurality of angles of inclination includes a first angle of inclination and a second angle of inclination, with the first angle of inclination being an angle between the inner face of the bottom part and the lower face of the bottom part, and the second angle of inclination being an angle between the inner face of the bottom part and an imaginary plane in parallel with the lower face of the bottom part,
   wherein the first angle of inclination is greater than the second angle of inclination,
   wherein the first angle of inclination is between 60° and 90°,
   wherein the second angle of inclination is 60° or less, and
   wherein the hole is larger than the semiconductor light emitting device chip.

2. The semiconductor light emitting device according to claim 1, wherein a turning point where the first angle of inclination changes to the second angle of inclination is located at a lower height than the height of the semiconductor light emitting device chip.

3. The semiconductor light emitting device according to claim 1, wherein the side wall includes at least one open section created by removing a portion of the side wall.

4. The semiconductor light emitting device according to claim 3, wherein the bottom part excluding the hole has a length greater than a height of the side wall and a length of the semiconductor light emitting device chip.

5. The semiconductor light emitting device according to claim 1, wherein the semiconductor light emitting device emits lights to 5 sides after a complete removal of the side wall.

* * * * *